(12) United States Patent  
Wu et al.

(10) Patent No.: US 12,374,290 B2
(45) Date of Patent: Jul. 29, 2025

(54) DISPLAY PANEL AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Liu Wu, Beijing (CN); Zhidong Yuan, Beijing (CN); Yongqian Li, Beijing (CN); Li Sun, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/580,006

(22) PCT Filed: Nov. 1, 2022

(86) PCT No.: PCT/CN2022/129001
§ 371 (c)(1),
(2) Date: Jan. 17, 2024

(87) PCT Pub. No.: WO2024/092510
PCT Pub. Date: May 10, 2024

(65) Prior Publication Data
US 2025/0022416 A1    Jan. 16, 2025

(51) Int. Cl.
*G09G 3/3233*    (2016.01)
*G02F 1/1362*    (2006.01)

(52) U.S. Cl.
CPC ..... *G09G 3/3233* (2013.01); *G02F 1/136204* (2013.01); *G09G 2300/0426* (2013.01);
(Continued)

(58) Field of Classification Search
CPC .... H10K 59/00–95; H02H 9/046; H05F 3/00; G02F 1/136204; G09G 2330/04; G09G 2330/06; G09G 3/3233; G09G 3/3241
See application file for complete search history.

(56) References Cited

U.S. PATENT DOCUMENTS

| | | | |
|---|---|---|---|
| 11,570,877 B2 | 1/2023 | Xu et al. | |
| 2005/0225688 A1* | 10/2005 | Park | G02F 1/136204 349/40 |
| 2022/0384556 A1 | 12/2022 | Zhang et al. | |

FOREIGN PATENT DOCUMENTS

| | | |
|---|---|---|
| CN | 107219660 A | 9/2017 |
| CN | 107331297 A | 11/2017 |

(Continued)

OTHER PUBLICATIONS

CN-108492761-A (Year: 2018).*

*Primary Examiner* — Sanjiv D. Patel
(74) *Attorney, Agent, or Firm* — Dilworth & Barrese, LLP.; Michael J. Musella, Esq.

(57) ABSTRACT

A display panel and a display device are provided, the first signal line extends from the display region to the electrostatic discharge region in a first direction, and provides a first display signal to the sub-pixels; the electrostatic discharge units are arranged in the first direction, each electrostatic discharge unit includes a sub electrostatic discharge unit, each sub electrostatic discharge unit includes an electrostatic discharge circuit and a first conductor, the electrostatic discharge circuit is connected to the first signal line and the first conductor, and charges on the first signal line move towards the first conductor; the electrostatic discharge units include two adjacent electrostatic discharge units in a second direction perpendicular to the first direction, orthographic projections of the two adjacent electrostatic discharge units on a plane parallel to the first direction are not overlapped, (Continued)

and on a plane parallel to the second direction are overlapped.

17 Claims, 23 Drawing Sheets

(52) U.S. Cl.
CPC ..... *G09G 2310/08* (2013.01); *G09G 2330/04* (2013.01); *G09G 2330/06* (2013.01)

(56) References Cited

FOREIGN PATENT DOCUMENTS

| | | | | |
|---|---|---|---|---|
| CN | 108492761 A | * | 9/2018 | ............... G09G 3/20 |
| CN | 111243429 A | | 6/2020 | |
| CN | 111681554 A | | 9/2020 | |
| CN | 115064533 A | | 9/2022 | |
| CN | 116206559 A | | 6/2023 | |
| WO | 2021102971 A1 | | 6/2021 | |

\* cited by examiner

DISPLAY PANEL AND DISPLAY DEVICE

TECHNICAL FIELD

At least one embodiment of the present disclosure relates to a display panel and a display device.

BACKGROUND

With the development of society, people's requirements for life are becoming higher and higher. Traditional display screens are gradually unable to meet the requirements for customized displays, and irregular displays have the characteristic of being customizable and have certain advantages. However, the irregular display screen breaks the design pattern of traditional display screen shapes, which means that more innovative designs are needed to adapt to the irregular display.

In a display panel, an electrostatic discharge unit is crucial for the display circuit. When static electricity occurs, the electrostatic discharge unit can be set to discharge the static electricity in the display circuit, in order to effectively protect the display circuit. Traditional display screens, such as rectangular display screens, have sufficient bottom space to arrange the electrostatic discharge unit. However, in some screens with smaller border sizes, such as irregular screens, the border shape of the irregular screen has very little space for setting the electrostatic discharge unit, which poses a challenge to changing the traditional layout of the electrostatic discharge unit.

SUMMARY

At least one embodiment of the present disclosure provides a display panel, the display panel comprises: a display region, a non-display region, a first signal line and a plurality of electrostatic discharge units. The display region comprises sub-pixels; the non-display region surrounds at least part of the display region, and comprises an electrostatic discharge region; the first signal line extends from the display region to the electrostatic discharge region in a first direction as a whole, and is configured to provide a first display signal to the sub-pixels; and the plurality of electrostatic discharge units are arranged in the first direction, each of the plurality of electrostatic discharge units comprises at least one sub electrostatic discharge unit, each of the at least one sub electrostatic discharge unit comprises an electrostatic discharge circuit and a first conductor, the electrostatic discharge circuit is electrically connected to the first signal line and the first conductor, and is configured to allow charges on the first signal line to move towards the first conductor; the plurality of electrostatic discharge units comprise two adjacent electrostatic discharge units in a second direction, the second direction is perpendicular to the first direction, orthographic projections of the two adjacent electrostatic discharge units on a plane parallel to the first direction are not overlapped with each other and orthographic projections of the two adjacent electrostatic discharge units on a plane parallel to the second direction are at least partially overlapped with each other, or, the orthographic projections of the two adjacent electrostatic discharge units on the plane parallel to the first direction are not overlapped with each other and a distance between the two adjacent electrostatic discharge units in the second direction is less than 1 μm.

For example, in the display panel provided by at least one embodiment of the present disclosure, in the plurality of sub electrostatic discharge units of the plurality of electrostatic discharge units, orthographic projections of at least two sub electrostatic discharge units on the plane parallel to the first direction are not overlapped with each other, and the orthographic projections of the at least two sub electrostatic discharge units on the plane parallel to the second direction are at least partially overlapped with each other.

For example, in the display panel provided by at least one embodiment of the present disclosure, a size of the electrostatic discharge circuit in the second direction is smaller than a size of the electrostatic discharge circuit in the first direction.

For example, in the display panel provided by at least one embodiment of the present disclosure, the display panel comprises a plurality of first signal lines, and the plurality of sub static discharge units of the plurality of electrostatic discharge units are electrically connected to one first signal line of the plurality of first signal lines, respectively; at least one of the plurality of first signal lines comprises a recess in the electrostatic discharge region, the recess constitutes a groove depressed towards one side in the second direction, and at least part of a sub electrostatic discharge unit adjacent to the groove is located in the groove.

For example, in the display panel provided by at least one embodiment of the present disclosure, at least one electrostatic discharge unit of the plurality of electrostatic discharge units comprises two adjacent sub electrostatic discharge units in the second direction, and two adjacent first signal lines both comprise a recess in the electrostatic discharge region, recesses of the two adjacent first signal lines form grooves depressed towards a same side in the second direction, and the two adjacent sub electrostatic discharge units are respectively at least partially located in the grooves formed by the recesses of the two adjacent first signal lines.

For example, in the display panel provided by at least one embodiment of the present disclosure, the first signal line connected to the at least one sub electrostatic discharge unit comprises: a first recess and a second recess. The first recess constitutes a first groove depressed towards a first side in the second direction; the second recess constitutes a second groove depressed towards a second side opposite to the first side in the second direction, and arranged in the second direction with the first recess; the two adjacent electrostatic discharge units are respectively a first electrostatic discharge unit and a second electrostatic discharge unit, an orthographic projection of the first electrostatic discharge unit parallel to the first direction is in an orthographic projection of the first groove parallel to the first direction, and an orthographic projection of the second electrostatic discharge unit parallel to the first direction is within an orthographic projection of the second groove parallel to the first direction.

For example, in the display panel provided by at least one embodiment of the present disclosure, the plurality of electrostatic discharge units constitute a plurality of electrostatic discharge unit groups spaced apart from each other in the second direction, each of the plurality of electrostatic discharge unit groups comprises M sub electrostatic discharge unit groups, each of the M sub electrostatic discharge unit groups comprises N electrostatic discharge units, and each of N the electrostatic discharge units comprises Q sub electrostatic discharge units, M and Q are positive integers greater than or equal to 1, and N is a positive integer greater than or equal to 2; at least part electrostatic discharge unit groups of the plurality of electrostatic discharge unit groups are in a periodic arrangement in the second direction, and one electrostatic discharge unit group is a repeating unit in the periodic arrangement.

For example, in the display panel provided by at least one embodiment of the present disclosure, a count of sub electrostatic discharge units comprised in one electrostatic discharge unit group is M*N*Q; in the case where M is equal to 1, N is equal to 2, and Q is equal to 3, a width of one electrostatic discharge unit group in the second direction is less than or equal to 129.5 μm; or, in the case where M is equal to 2, N is equal to 3, and Q is equal to 3, a width of one electrostatic discharge unit group in the second direction is less than or equal to 294 μm.

For example, in the display panel provided by at least one embodiment of the present disclosure, a resolution of the display panel is X*Y, where X represents a count of rows of a pixel array in the display region, Y represents a count of columns of the pixel array in the display region, X is greater than or equal to 960, and Y is greater than or equal to 1440.

For example, in the display panel provided by at least one embodiment of the present disclosure, the M sub electrostatic discharge unit groups comprise a first sub electrostatic discharge unit group and a second sub electrostatic discharge unit group, the first sub electrostatic discharge unit group and the second sub electrostatic discharge unit group are symmetrical or asymmetrical relative to a symmetry axis extending in the first direction.

For example, in the display panel provided by at least one embodiment of the present disclosure, the first display signal is a data signal, and the first signal line transmits the data signal; each of the sub-pixels comprises a pixel circuit, and the pixel circuit comprises: a light-emitting device, a driving transistor and a data writing transistor; the data writing transistor is configured to transmit the data signal to the driving transistor under control of a first scanning signal; the driving transistor is configured to control a magnitude of a driving current flowing through the light-emitting device according to the data signal, and the light-emitting device is configured to receive the driving current and be driven by the driving current to emit light.

For example, in the display panel provided by at least one embodiment of the present disclosure, the non-display region comprises a lead region, a driving circuit is provided in the lead region, and the driving circuit is configured to provide the first display signal to the first signal line; the electrostatic discharge region is between the lead region and the display region, and the plurality of sub electrostatic discharge units connected to the first signal lines that provide the first display signal to all sub-pixels are located in the non-display region on a same side of the display region in the first direction.

For example, in the display panel provided by at least one embodiment of the present disclosure, the non-display region further comprises a border region, the border region is between the lead region and the display region, a first power lead line is provided in the border region, and the first power lead line is configured to provide a first power voltage to the sub-pixels; the lead region comprises a data selection region on a side of the border region away from the display region, a data selection unit is provided in the data selection region, and the electrostatic discharge region is between the first power lead line and the data selection region.

For example, in the display panel provided by at least one embodiment of the present disclosure, a first end of the data selection unit close to the electrostatic discharge region is electrically connected to R first signal lines, and a second end of the data selection unit away from the electrostatic discharge region is electrically connected to S data lead lines, S and R are both positive integers, and S is less than R; the S data lead lines are electrically connected to the driving circuit, and the first display signal is provided to the S data lead lines through the driving circuit.

For example, in the display panel provided by at least one embodiment of the present disclosure, a width of a region where the driving circuit is located in the second direction is smaller than a width of the electrostatic discharge region in the second direction.

For example, in the display panel provided by at least one embodiment of the present disclosure, the electrostatic discharge circuit comprises: a first sub-circuit, the first sub-circuit has a driving end, a first end, and a second end, the driving end and the first end of the first sub-circuit are electrically connected to the first signal line, and the second end of the first sub-circuit is electrically connected to the first conductor.

For example, in the display panel provided by at least one embodiment of the present disclosure, the sub electrostatic discharge unit further comprises a second conductor, the electrostatic discharge circuit is electrically connected to the first signal line and the second conductor, and is configured to allow charges on the first signal line to move towards the second conductor; the electrostatic discharge circuit further comprises: a second sub-circuit having a driving end, a first end, and a second end; the first end of the second sub-circuit is electrically connected to the first signal line, and both the driving end and the second end of the second sub-circuit are connected to the second conductor; the first sub-circuit and the second sub-circuit are arranged in the first direction.

For example, in the display panel provided by at least one embodiment of the present disclosure, the first sub-circuit comprises a first transistor, and the second sub-circuit comprises a second transistor; a gate electrode and a first electrode of the first transistor are electrically connected to the first signal line, and a second electrode of the first transistor is electrically connected to the first conductor; a first electrode of the second transistor is electrically connected to the first signal line, and a gate electrode and a second electrode of the second transistor are both connected to the second conductor; the first transistor and the second transistor are arranged in the first direction, the first electrode and the second electrode of the first transistor are arranged in the first direction, and the first electrode and the second electrode of the second transistor are arranged in the first direction; the first transistor comprises a first active layer, and the second transistor comprises a second active layer; the first active layer and the second active layer both extend in the first direction, and a width of the first active layer in the second direction is less than a length of the first active layer in the first direction, and a width of the second active layer in the second direction is less than a length of the second active layer in the first direction.

For example, in the display panel provided by at least one embodiment of the present disclosure, the first conductor and the second conductor are spaced apart in the first direction, and the first conductor extends in the second direction; the sub electrostatic discharge unit comprises a first gate portion; the second conductor comprises a main body portion extending in the second direction and a second gate portion connected to the main body portion and extending in the second direction, the first gate portion and the second gate portion are arranged in intervals in the first direction, and the first gate portion and the second gate portion are between the first conductor and the main body portion of the second conductor; a portion of the first gate portion that overlaps with the first active layer constitutes the gate electrode of the first transistor, a portion of the second gate electrode that overlaps with the second active layer constitutes the gate electrode of the second transistor, and the first gate portion is electrically connected to the first signal line.

For example, in the display panel provided by at least one embodiment of the present disclosure, the first gate portion comprises a first strip portion extending in the first direction and a gate connection structure electrically connected to the first strip portion, the gate connection structure protrudes from the first strip portion towards the first signal line in the second direction, and the gate connection structure is electrically connected to the first signal line through a first via; the first gate portion further comprises a first protrusion portion electrically connected to the first strip portion, the first protrusion portion protrudes from the first strip portion in the second direction away from the first signal line, and a portion of the first protrusion portion that overlaps with the first active layer constitutes the gate electrode of the first transistor; the second gate portion comprises a second strip portion extending in the first direction and a second protrusion portion electrically connected to the second strip portion, the second protrusion portion protrudes from the second strip portion in the second direction, and a portion of the second protrusion portion that overlaps with the second active layer constitutes the gate electrode of the second transistor.

For example, in the display panel provided by at least one embodiment of the present disclosure, the second protrusion portion protrudes from the second strip portion in a direction away from the first signal line in the second direction, the first strip portion is substantially aligned with the second strip portion in the first direction, and the first protrusion portion is substantially aligned with the second protrusion portion in the first direction.

For example, in the display panel provided by at least one embodiment of the present disclosure, the first active layer and the second active layer form an electrostatic discharge semiconductor layer that is continuous and integral and the electrostatic discharge semiconductor layer is in a strip shape extending in the first direction as a whole; the sub electrostatic discharge unit further comprises a data connection structure, the data connection structure is electrically connected to the first signal line and protrudes from the first signal line towards the electrostatic discharge semiconductor layer in the second direction, a first end of the data connection structure close to the first signal line in the second direction is electrically connected to the gate connection structure, and a second end of the data connection structure away from the first signal line in the second direction is electrically connected to the electrostatic discharge semiconductor layer through a second via, and the second via is between the first protrusion portion and the second protrusion portion in the first direction.

For example, in the display panel provided by at least one embodiment of the present disclosure, the sub electrostatic discharge unit further comprises a first connection structure and a second connection structure; a first end of the first connection structure in the first direction is connected to the first conductor through a third via, and a second end of the first connection structure in the first direction is connected to the first active layer through a fourth via; a first end of the second connection structure in the first direction is connected to the main body portion of the second conductor through a fifth via, and a second end of the second connection structure in the first direction is connected to the second active layer through a sixth via.

For example, in the display panel provided by at least one embodiment of the present disclosure, the electrostatic discharge semiconductor layer is in a straight strip shape and is on a side of the first strip portion and the second strip portion away from the first signal line. For example, the display panel provided by at least one embodiment of the present disclosure further comprises: a reset voltage line and a reset voltage lead line. The reset voltage line is configured to provide a reset voltage signal to the sub-pixels, and comprising a lead portion in the non-display region; the lead portion of the reset voltage line is between two adjacent electrostatic discharge units and extends in the first direction, and J adjacent lead portions are electrically connected through a reset connection line extending in the second direction; a first end of the reset voltage lead line is electrically connected to the reset connection line, a second end of the reset voltage lead line is electrically connected to the driving circuit, and the driving circuit is configured to provide the reset voltage signal.

For example, in the display panel provided by at least one embodiment of the present disclosure, a width of a region where the driving circuit is located in the second direction is smaller than a width of the electrostatic discharge region in the second direction.

At least one embodiment of the present disclosure further provides a display panel, the display panel comprises a display region, a non-display region, a first signal line and a plurality of electrostatic discharge units, the display region comprises a plurality of sub-pixels; the non-display region surrounds at least part of the display region, and comprises an electrostatic discharge region; the first signal line extends from the display region to the electrostatic discharge region in a first direction as a whole, and is configured to provide a first display signal to the sub-pixels; and the plurality of electrostatic discharge units are arranged in the first direction; each of the plurality of electrostatic discharge units comprises at least one sub electrostatic discharge unit, each of the at least one sub electrostatic discharge unit comprises an electrostatic discharge circuit and a first conductor, the electrostatic discharge circuit is electrically connected to the first signal line and the first conductor, and is configured to allow charges on the first signal line to move towards the first conductor; in the plurality of electrostatic discharge units, orthographic projections of every two adjacent electrostatic discharge units on a plane parallel to the first direction are not overlapped with each other.

At least one embodiment of the present disclosure further provides a display panel, the display panel comprises a display region, a non-display region, a first signal line and a plurality of electrostatic discharge units, the display region comprises a plurality of sub-pixels; the non-display region surrounds at least part of the display region, and comprising an electrostatic discharge region; the first signal line extends from the display region to the electrostatic discharge region in a first direction as a whole, and is configured to provide a first display signal to the sub-pixels; and the plurality of electrostatic discharge units are arranged in the first direction; each of the plurality of electrostatic discharge units comprises at least one sub electrostatic discharge unit, each of the at least one sub electrostatic discharge unit comprises an electrostatic discharge circuit and a first conductor, the electrostatic discharge circuit is electrically connected to the first signal line and the first conductor, and is configured to allow charges on the first signal line to move towards the first conductor; the non-display region comprises a lead region, a driving circuit is provided in the lead region, and the driving circuit is configured to provide the first display signal to the first signal line; the electrostatic discharge region is between the lead region and the display region, and the plurality of sub electrostatic discharge units connected to the first signal lines that provide the first display signal to all sub-pixels are located on a same side of the display region in the first direction.

At least one embodiment of the present disclosure further provides a display panel, the display panel comprises a display region, a non-display region, a first signal line and a plurality of electrostatic discharge units, the display region comprises a plurality of sub-pixels; the non-display region surrounds at least part of the display region, and comprises an electrostatic discharge region; the first signal line extends from the display region to the electrostatic discharge region in a first direction as a whole, and is configured to provide a first display signal to the sub-pixels; and the plurality of electrostatic discharge units are arranged in the first direction; each of the plurality of electrostatic discharge units comprises at least one sub electrostatic discharge unit, each of the at least one sub electrostatic discharge unit comprises an electrostatic discharge circuit and a first conductor, the electrostatic discharge circuit is electrically connected to the first signal line and the first conductor, and is configured to allow charges on the first signal line to move towards the first conductor; a size of the electrostatic discharge circuit in the second direction is smaller than a size of the electrostatic discharge circuit in the first direction, and the second direction is perpendicular to the first direction.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
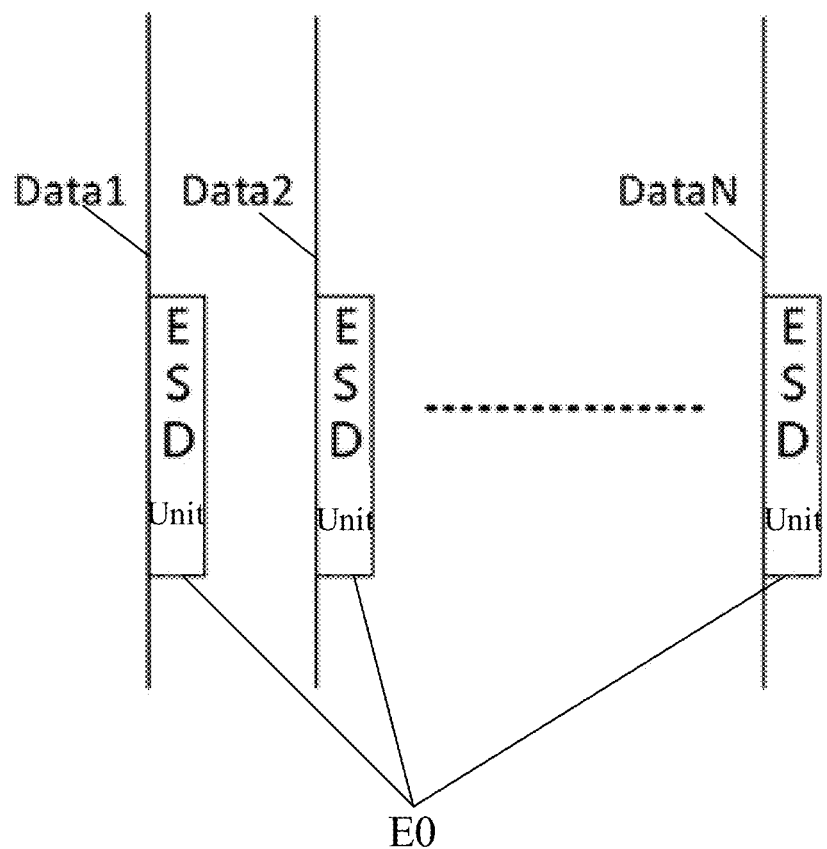
FIG. 1 is a schematic diagram of an arrangement mode of an electrostatic discharge unit in a display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The terms "basic alignment" and "basically the same" used in the disclosure contain certain errors, taking into account errors about the measurement and the measurement of a specific amount (such as limitations of the measurement system), represent the acceptable deviation range for a specific value determined by ordinary technical personnel in the art. For example, "basic" may mean within one or more standard deviations, or, unless otherwise specified, within a deviation range of 10% or 5% of the stated value.

The term "directly connected" in the disclosure refers to two structures connected to each other for example, A and B are directly connected, etc.) being in contact with each other, and there is no other structure between the two connected structures as a medium for their connection. For example, the two structures directly connected to each other may be a continuous and integral structure, in which the materials of the two structures directly connected to each other are the same, and the two structures may be formed through the same one patterning process to simplify the manufacture process of the display substrate; alternatively, the materials of the two structures directly connected to each other may also be different. For example, the two structures directly connected to each other are conductive signal lines, and the two structures may respectively adopt materials that match their functions to meet the requirements for different properties such as different conductivity.

The term "in a/the same layer" in the present disclosure refers to the relationship between a plurality of layers formed after performing the same one step (such as the same one patterning process) on the film formed from the same material. The "in a/the same layer" here does not always mean that the plurality of layers have the same thickness or have the same height in the cross-sectional view.

The transistors used in all examples of the present disclosure may be thin film transistors or field-effect transistor or other devices with the same characteristics. According to the role in the circuit, the transistors used in the examples of the present disclosure are mainly switching transistors. Because of the symmetrical source electrode and drain electrode of the switching transistor used here, the source electrode and the drain electrode can be interchanged. In the examples of the present disclosure, in order to distinguish the two electrodes of a transistor except for the gate electrode, the source electrode is referred to as the first electrode and the drain electrode is referred to as the second electrode. In addition, the switch transistor used in the examples of the present disclosure includes at least one of a P-type switch transistor and an N-type switch transistor, in which the P-type switch transistor is turned on at a low gate level, turned off at a high gate level, and the N-type switch transistor is turned on at a high gate level and turned off at a low gate level.

In the display panel, it is easy to accumulate charges on the signal line. The accumulated charges may have various adverse effects during the display process, and even cause unpredictable problems that affect the display quality. Therefore, electrostatic discharge is crucial for the display circuit. When electrostatic discharge occurs, the charges on the signal line can be released by an electrostatic discharge unit to effectively protect the display circuit.

FIG. 1 is a schematic diagram of an arrangement mode of an electrostatic discharge unit in a display panel. In the display panel shown in FIG. 1, the display panel includes a plurality of signal lines Data1, Data2 . . . DataN, and is provided with a plurality of electrostatic discharge units that are respectively electrically connected to the plurality of signal lines Data1, Data2 . . . DataN, that is, the ESD units represented by the rectangular frames in FIG. 1, to perform the electrostatic discharge on the plurality of signal lines Data1, Data2 . . . DataN. However, the plurality of electrostatic discharge units are arranged in the horizontal direction, for example, it is necessary to provide an electrostatic discharge unit for each signal line, and in order to achieve high resolution, in the case where the density of the signal line is high, space left for setting more electrostatic discharge units is limited. For example, the shape of the edge of some special-shaped screens is irregular, and the bottom border region of the special-shaped screen is very small, often without enough width like the border region of an ordinary rectangular display screen to be provided with a plurality of electrostatic discharge units, making it impossible to provide a large number of electrostatic discharge units.

At least one embodiment of the present disclosure provides a display panel, the display panel includes: a display region, a non-display region, a first signal line, and a plurality of electrostatic discharge units. The display region includes sub-pixels; the non-display region surrounds at least part of the display region, and includes an electrostatic discharge region; the first signal line extends from the display region to the electrostatic discharge region in a first direction as a whole, and is configured to provide a first display signal to the sub-pixels; the plurality of electrostatic discharge units are arranged in the first direction, each of the plurality of electrostatic discharge units includes at least one sub electrostatic discharge unit, each of the at least one sub electrostatic discharge unit includes an electrostatic discharge circuit and a first conductor, the electrostatic discharge circuit is electrically connected to the first signal line and the first conductor, and is configured to allow charges on the first signal line to move towards the first conductor; the plurality of electrostatic discharge units include two adjacent electrostatic discharge units in a second direction, the second direction is perpendicular to the first direction, orthographic projections of the two adjacent electrostatic discharge units on a plane parallel to the first direction are not overlapped with each other, and orthographic projections of the two adjacent electrostatic discharge units on a plane parallel to the second direction are at least partially overlapped with each other, or, the orthographic projections of the two adjacent electrostatic discharge units on the plane parallel to the first direction are not overlapped with each other, and a distance between the two adjacent electrostatic discharge units in the second direction is less than 1 μm.

At least one embodiment of the present disclosure provides a display panel, the display panel includes: a display region, a non-display region, a first signal line, and a plurality of electrostatic discharge units. The display region includes sub-pixels; the non-display region surrounds at least part of the display region, and includes an electrostatic discharge region; the first signal line extends from the display region to the electrostatic discharge region in a first direction as a whole, and is configured to provide a first display signal to the sub-pixels; the plurality of electrostatic discharge units are arranged in the first direction, each of the plurality of electrostatic discharge units includes at least one sub electrostatic discharge unit, each of the at least one sub electrostatic discharge unit includes an electrostatic discharge circuit and a first conductor, the electrostatic discharge circuit is electrically connected to the first signal line and the first conductor, and is configured to allow charges on the first signal line to move towards the first conductor; in the plurality of electrostatic discharge units, orthographic projections of every two adjacent electrostatic discharge units on a plane parallel to the first direction are not overlapped with each other.

At least one embodiment of the present disclosure provides a display panel, the display panel includes: a display region, a non-display region, a first signal line, and a plurality of electrostatic discharge units. The display region includes sub-pixels; the non-display region surrounds at least part of the display region, and includes an electrostatic discharge region; the first signal line extends from the display region to the electrostatic discharge region in a first direction as a whole, and is configured to provide a first display signal to the sub-pixels; the plurality of electrostatic discharge units are arranged in the first direction, each of the plurality of electrostatic discharge units includes at least one sub electrostatic discharge unit, each of the at least one sub electrostatic discharge unit includes an electrostatic discharge circuit and a first conductor, the electrostatic discharge circuit is electrically connected to the first signal line and the first conductor, and is configured to allow charges on the first signal line to move towards the first conductor; the non-display region includes a lead region, a driving circuit is provided in the lead region, and the driving circuit is configured to provide the first display signal to the first signal line; the electrostatic discharge region is between the lead region and the display region, and the plurality of sub electrostatic discharge units connected to the first signal lines that provide the first display signal to all sub-pixels are located on a same side of the display region in the first direction.

At least one embodiment of the present disclosure provides a display panel, the display panel includes: a display region, a non-display region, a first signal line, and a plurality of electrostatic discharge units. The display region includes sub-pixels; the non-display region surrounds at least part of the display region, and includes an electrostatic discharge region; the first signal line extends from the display region to the electrostatic discharge region in a first direction as a whole, and is configured to provide a first display signal to the sub-pixels; the plurality of electrostatic discharge units are arranged in the first direction, each of the plurality of electrostatic discharge units includes at least one sub electrostatic discharge unit, each of the at least one sub electrostatic discharge unit includes an electrostatic discharge circuit and a first conductor, the electrostatic discharge circuit is electrically connected to the first signal line and the first conductor, and is configured to allow charges on the first signal line to move towards the first conductor; a size of the electrostatic discharge circuit in the second direction is smaller than a size of the electrostatic discharge circuit in the first direction, and the second direction is perpendicular to the first direction.

Figure 2:
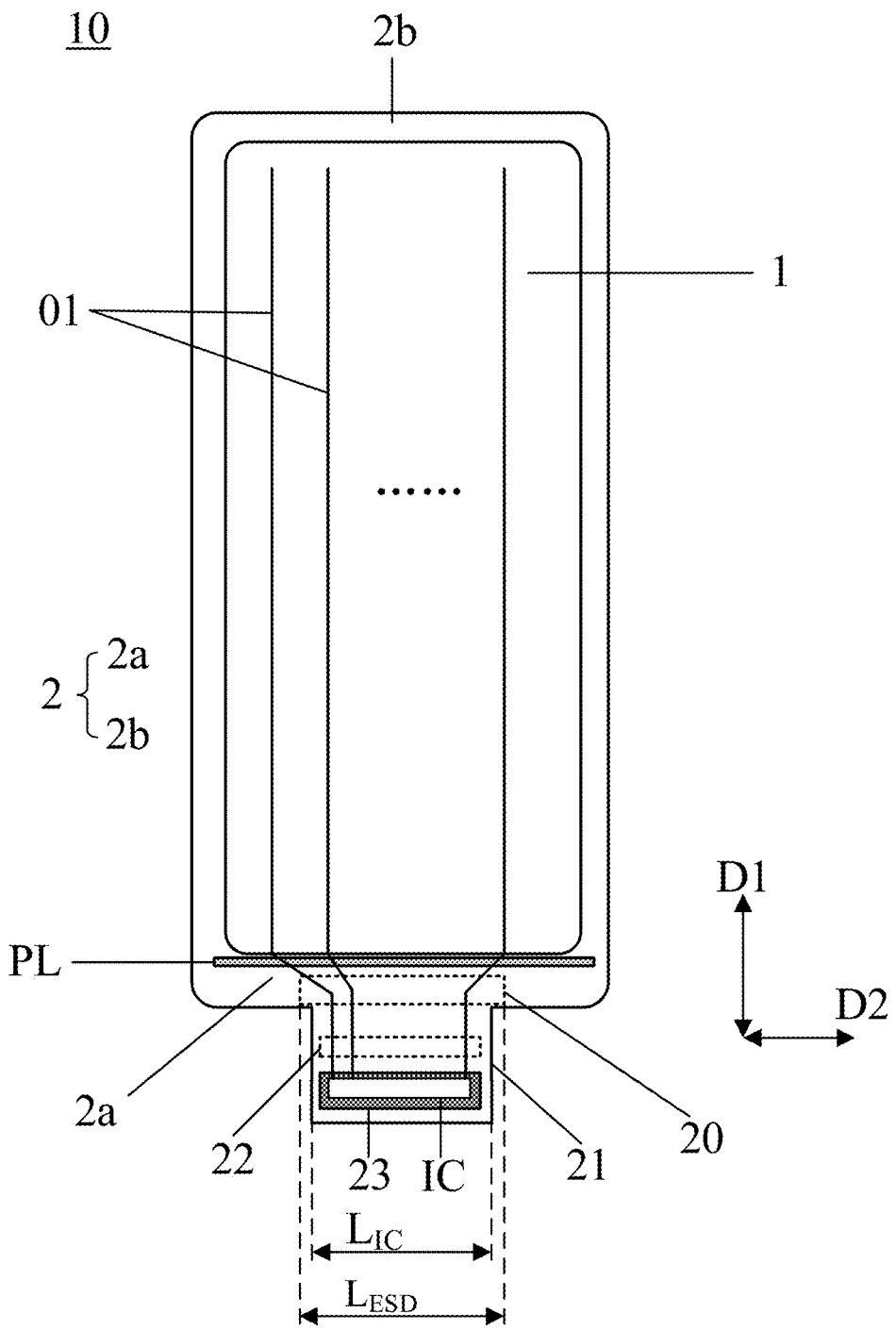
FIG. 2 is a schematic diagram of a planar structure of a display panel provided by an embodiment of the present disclosure.
Figure 3:
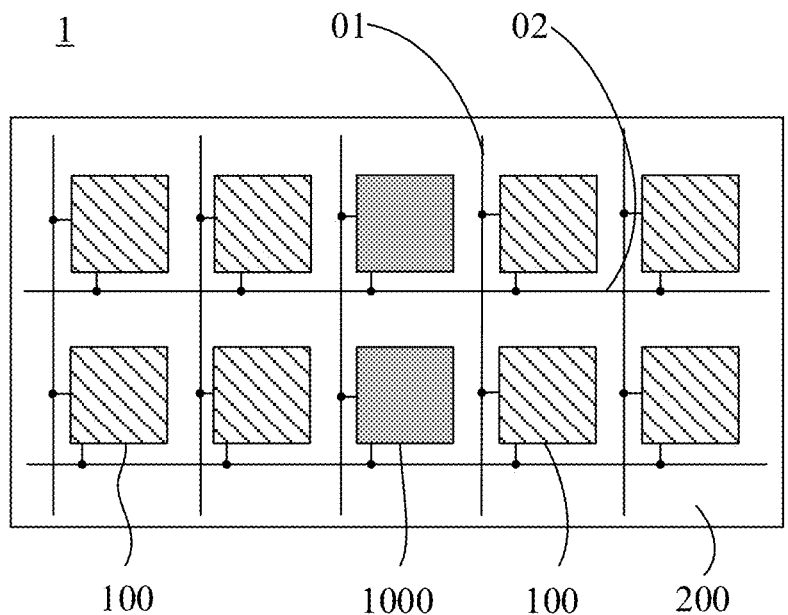
FIG. 3 is a schematic diagram of sub-pixels of part of the display region of FIG. 2.
Figure 4A:
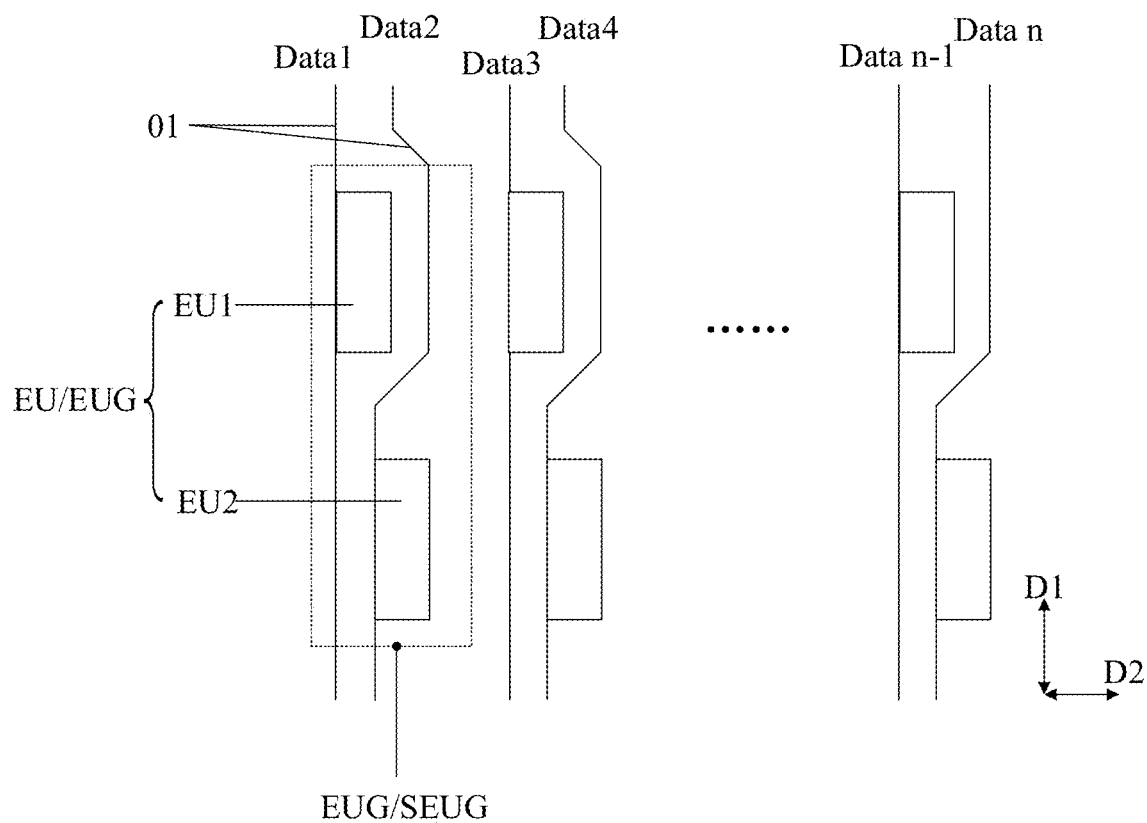
FIG. 4A is a schematic diagram of an arrangement of an electrostatic discharge unit in a display panel provided by an embodiment of the present disclosure.
Figure 4B:
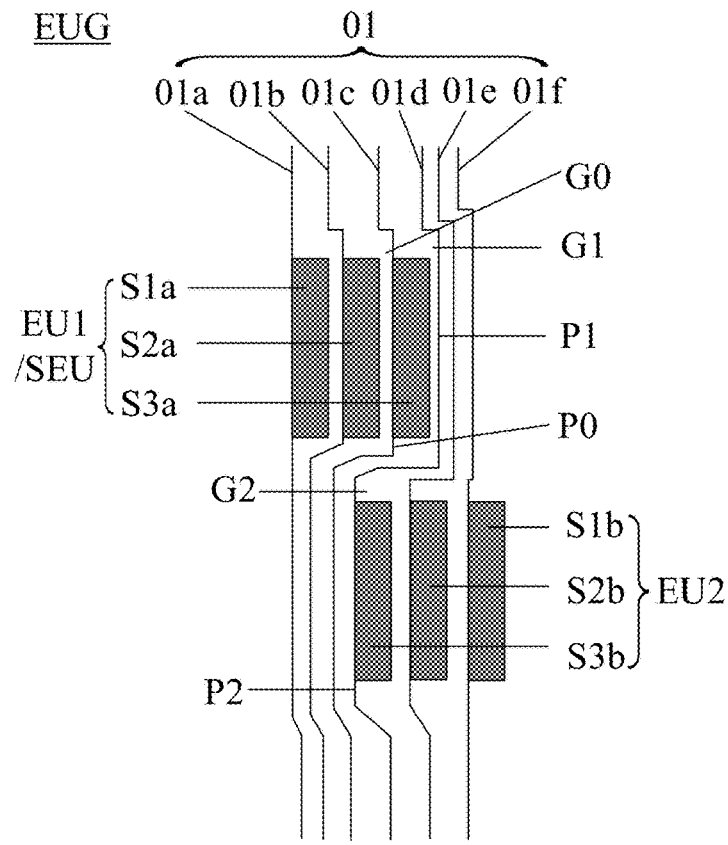
FIG. 4B is an enlarged schematic diagram of a part including an electrostatic discharge group in FIG. 4A.

Exemplarily, FIG. 2 is a schematic diagram of a planar structure of a display panel provided by an embodiment of the present disclosure, and FIG. 3 is a schematic diagram of sub-pixels of part of in the display region of FIG. 2. As shown in FIG. 2-FIG. 3, the display panel 10 provided by at least one embodiment of the present disclosure includes: a display region 1, a non-display region 2, a first signal line 01, and a plurality of electrostatic discharge units EU. The display region 1 includes a plurality of sub-pixels 100, for example, as shown in FIG. 3, the plurality of sub-pixels are arranged in an array; of course, FIG. 3 is only an exemplary illustration of the part sub-pixels in display region 1, and the specific arrangement of the plurality of sub-pixels is not limited to the situation shown in FIG. 3. The non-display region 2 surrounds at least part of the display region 1 and includes an electrostatic discharge region 20; the first signal line 01 extends from the display region 1 to the electrostatic discharge region 20 in the first direction D1 as a whole, and is configured to provide a first display signal to the sub-pixels 100. FIG. 4A is a schematic diagram of an arrangement of an electrostatic discharge unit in a display panel provided by an embodiment of the present disclosure, FIG. 4B is an enlarged schematic diagram of a part including an electrostatic discharge group in FIG. 4A. As shown in FIG. 4A-FIG. 4B, the plurality of electrostatic discharge units EU are arranged in the first direction D1, and each electrostatic discharge unit EU includes at least one sub electrostatic discharge unit SEU, each of the at least one sub electrostatic discharge unit SEU includes an electrostatic discharge circuit EC and a first conductor C1. The electrostatic discharge circuit EC is electrically connected to the first signal line 01 and the first conductor C1, and is configured to allow charges on the first signal line 01 to move towards the first conductor C1, thereby reducing the charges on the first signal line 01. For example, each electrostatic discharge unit EU includes a plurality of sub electrostatic discharge units, each sub electrostatic discharge unit is electrically connected to one first signal line 01 for electrostatic discharge.

In the present application, the feature "the first signal line extending in the first direction as a whole" refers to: the routing trend of the first signal line is along the first direction, which includes the following situations: for example, the first signal line may be a straight line extending in the first direction; alternatively, at least a portion of the first signal line has a certain degree of bending or inclination relative to the first direction, but the direction from the beginning of the first signal line to the end of the first signal line is along the first direction.

It should be noted that the first signal line groups Data1, Data2, Data3, Data4 . . . Data n-1 and Data n in FIG. 4A respectively represent one or more first signal lines electrically connected to one electrostatic discharge unit EU, and may respectively include a plurality of first signal lines 01 electrically connected to the plurality of sub electrostatic discharge units SEU of the one electrostatic discharge unit EU.

For example, referring to FIG. 4A, the plurality of electrostatic discharge units EU of display panel 10 form a plurality of electrostatic discharge unit groups EUG spaced apart from each other in the second direction D2. Each electrostatic discharge unit group EUG includes M sub electrostatic discharge unit groups SEUG, each sub electrostatic discharge unit group SEUG includes N electrostatic discharge units EU, each electrostatic discharge unit EU includes Q sub electrostatic discharge units SEU, M and Q are positive integers greater than or equal to 1, and N is a positive integer greater than or equal to 2.

As shown in FIG. 4A, the plurality of electrostatic discharge units EU include two adjacent electrostatic discharge units in the second direction D2. The two adjacent electrostatic discharge units are, for example, a first electrostatic discharge unit EU1 and a second electrostatic discharge unit EU2, the second direction D2 is perpendicular to the first direction D1. The orthographic projections of the two adjacent electrostatic discharge units on the plane parallel to the first direction D1 are not overlapped with each other, and the orthographic projections of the two adjacent electrostatic discharge units on the plane parallel to the second direction D2 are at least partially overlapped with each other. Therefore, the first electrostatic discharge unit EU1 and the second electrostatic discharge unit EU2 are not only staggered in the first direction D1, but also staggered in the second direction D2, which can greatly reduce the space occupied by the plurality of electrostatic discharge units EU in the second direction D2, so as to achieve the setting of the plurality of electrostatic discharge units even in the case where the size of the electrostatic discharge region 20 is small in the second direction D2. For example, the pixel array of the display region includes a plurality of sub-pixel columns extending in the first direction D1 and arranged in the second direction D2, and a plurality of sub-pixel rows extending in the second direction D2 and arranged in the first direction D1. The display panel 10 includes a plurality of first signal lines 01, one first signal line 01 provides the first display signal to the corresponding one sub-pixel column. In the case where the resolution of the display panel is high, the layout density of sub-pixel columns is very high, so the layout density of the first signal lines 01 is also very high. In order to achieve an ideal electrostatic discharge effect and ensure that the static electricity on each first signal line 01 can be released in time, it is necessary to set sub electrostatic discharge units SEU for each first signal line 01, in this case, there are a large number of sub electrostatic discharge units SEU, and the electrostatic discharge region needs to have sufficient size in the second direction D2 to accommodate so many sub electrostatic discharge units SEU. However, in the case where there is limited space for providing more sub electrostatic discharge units in the display panel 10, for example, in the case where the display panel 10 is an irregular display panel, the edge shape of the irregular display panel is irregular, the size of the border region located at the bottom of the irregular display panel is very small, that is, the electrostatic discharge region 20 in FIG. 2 is very small in the second direction D2, the above technical solution provided by the present disclosure can still achieve good electrostatic discharge effect by providing sub electrostatic discharge units SEU on each first signal line 01 while achieving high resolution.

Here, taking the case that two adjacent electrostatic discharge units are respectively the first electrostatic discharge unit EU1 and the second electrostatic discharge unit EU2 as an example, "the orthographic projections of two adjacent electrostatic discharge units on the plane parallel to the second direction D2 are at least partially overlapped with each other" can be understood as: the orthographic projections of at least part of the first electrostatic discharge unit EU1 and at least part of the second electrostatic discharge unit EU2 on the plane parallel to the second direction D2 are overlapped with each other, that is, as long as the orthographic projections of two adjacent electrostatic discharge units on the plane parallel to the second direction D2 have an overlapping portion, which includes the case that the orthographic projection of part or the entire the first electrostatic discharge unit EU1 on the plane parallel to the second direction D2 has an overlapping portion with the orthographic projection of the second electrostatic discharge unit EU2 on the plane parallel to the second direction D2, or includes the case that the orthographic projection of part or the entire of the second electrostatic discharge unit EU2 on the plane parallel to the second direction D2 has an overlapping portion with the orthographic projection of the first electrostatic discharge unit EU1 on the plane parallel to the second direction D2.

FIG. 4B is an enlarged schematic diagram of a part including an electrostatic discharge group in FIG. 4A; as shown in FIG. 4B, the relationship between one electrostatic discharge group and the first signal line is explained by taking one electrostatic discharge group EUG as an example. For example, as shown in FIG. 4B, one electrostatic discharge group EUG serves as one sub electrostatic discharge group SEUG, that is, one electrostatic discharge group EUG only includes one sub electrostatic discharge group SEUG. For example, each sub electrostatic discharge unit group SEUG includes two electrostatic discharge units EU, and each electrostatic discharge unit EU includes three sub electrostatic discharge units SEUs, namely, M=1, N=2, Q=3; of course, this is just an example to introduce the structure of one electrostatic discharge group EUG, without limiting the values of M, N, and Q. For example, the plurality of sub electrostatic discharge units SEU of the plurality of electrostatic discharge units EU are electrically connected to one of the first signal lines 01 to discharge static electricity on the first signal line 01. For example, as shown in FIG. 4B, the first electrostatic discharge unit EU1 includes three sub electrostatic discharge units, namely a first sub electrostatic discharge unit S1$a$, a second sub electrostatic discharge unit S2$a$, and a third sub electrostatic discharge unit S3$a$. These three sub electrostatic discharge units S1$a$/S2$a$/S3$a$ are respectively electrically connected to three first signal lines 01$a$/01$b$/01$c$ arranged continuously in the second direction D2, to release static electricity on the three first signal lines 01$a$/01$b$/01$c$, respectively, that is, the first signal line group Data1 in FIG. 4A includes three first signal lines 01$a$/01$b$/01$c$. The second electrostatic discharge unit EU2 includes three sub electrostatic discharge units, namely a first electrostatic discharge unit S1b, a second sub electrostatic discharge unit S2b, and a third sub electrostatic discharge unit S3b. These three sub electrostatic discharge units S1b/S2b/S3b are respectively electrically connected to three first signal lines 01d/01e/01f consecutively arranged in the second direction D2, to discharge the static electricity on the three first signal lines 01d/01e/01f, that is, the first signal line group Data1 in FIG. 4A includes three first signal lines 01d/01e/01f.

For example, in combination with FIG. 4A and FIG. 4B, the orthographic projections of the second electrostatic discharge unit EU2 and the first electrostatic discharge unit EU1 on the plane parallel to the second direction D2 are at least partially overlapped with each other. For example, the orthographic projections of the plurality of sub electrostatic discharge units in the second electrostatic discharge unit EU2 and the orthographic projections of the plurality of sub electrostatic discharge units in the first electrostatic discharge unit EU1 on the plane parallel to the second direction D2 are at least partially overlapped with each other, so as to effectively reduce the space occupied by the plurality of electrostatic discharge units EU in the second direction D2.

For example, as shown in FIG. 4B, in the plurality of sub electrostatic discharge units SEUs of the plurality of electrostatic discharge units EU, the orthographic projections of at least two sub electrostatic discharge units SEU, such as the third sub electrostatic discharge unit S3a of the first electrostatic discharge unit EU1 and the second sub electrostatic discharge unit S2b of the second electrostatic discharge unit EU2, on the plane parallel to the first direction D1 are not overlapped with each other, but the orthographic projections of the at least two sub electrostatic discharge units SEU on the plane parallel to the second direction D2 are at least partially overlapped with each other, so as to further reduce the space occupied by the plurality of electrostatic discharge units EU on the second direction D2.

For example, as shown in FIG. 4B, for each sub electrostatic discharge unit SEU, the size of the electrostatic discharge circuit EC in the second direction D2 is smaller than the size of the electrostatic discharge circuit EC in the first direction D1. In this way, the layout of each component of the electrostatic discharge circuit EC can be designed to fully utilize the space in the first direction D2 while providing sufficient space for setting the electrostatic discharge circuit, reducing the space occupied by the electrostatic discharge circuit EC in the second direction D2, thereby facilitating the setting of more sub electrostatic discharge units in the second direction D2, achieving electrostatic discharge for each first signal line, and meeting the electrostatic discharge requirements of the display panel with the electrostatic discharge region of a very small size in the second direction D2.

For example, as shown in FIG. 4B, at least one first signal line 01 includes a recess in the electrostatic discharge region 20. Taking the first signal line 01d as an example, for example, the first signal line 01d includes a recess P1 in the electrostatic discharge region 20, and the recess P1 constitutes a groove G1 depressed towards one side in the second direction D2, the sub electrostatic discharge unit S3a adjacent to the groove G1, which is the third sub electrostatic discharge unit S3a of the first electrostatic discharge unit EU1, is at least partially located in the groove G1 to achieve staggered arrangement and reduce the space occupied by the plurality of sub electrostatic discharge units in the second direction D2. In the embodiment shown in FIG. 4B, the first signal line 01c electrically connected to the third sub electrostatic discharge unit S3a located in the groove G1 is adjacent to the first signal line 01d having the groove G1; alternatively, in other embodiments, the sub electrostatic discharge unit located in the groove is electrically connected to the first signal line including the groove.

For example, as shown in FIG. 4B, at least one electrostatic discharge unit of the plurality of electrostatic discharge units EU includes two sub electrostatic discharge units SEU adjacent in the second direction D2, and the two adjacent signal lines, such as the first signal line 01c and the first signal line 01d, both include a recess P0/P1 located in the electrostatic discharge region 20, the recess P0 of the first signal line 01c and the recess P1 of the first signal line 01d form grooves depressed towards the same side in the second direction D2, and the adjacent two sub electrostatic discharge units S2a/S3a are respectively at least partially located in the groove G0 formed by the recess P0 of the first signal line 01c and the groove G1 formed by the recess P1 of the first signal line 01d, to further effectively reduce the total width of the plurality of electrostatic discharge units in the second direction D2, and meet the requirements for a narrow electrostatic discharge region.

For example, as shown in FIG. 4A and FIG. 4B, the first signal line 01d electrically connected to the first sub electrostatic discharge unit SEU of the first electrostatic discharge unit EU1 includes a first recess P1 and a second recess P2; the first recess P1 constitutes a first groove G1 depressed towards a first side in the second direction D2; the second recess P2 constitutes a second groove G2 depressed towards a second side opposite to the first side in the second direction D2, and the second groove G2 is arranged with the first second groove G1 in the second direction D2. The first electrostatic discharge unit EU1 and the second electrostatic discharge unit EU2 are two adjacent electrostatic discharge units. The orthographic projection of the first electrostatic discharge unit EU1 parallel to the first direction D1 is located in the orthographic projection of the first groove G1 parallel to the first direction D1, and the orthographic projection of the second electrostatic discharge unit EU2 parallel to the first direction D1 is located in the orthographic projection of the second groove G2 parallel to the first direction D1, to achieve staggered separation of two adjacent electrostatic discharge units in the second direction D2, thereby reducing the space occupied by the plurality of electrostatic discharge units in the second direction D2. Further, the third sub electrostatic discharge unit S3a of the first electrostatic discharge unit EU1 and the third sub electrostatic discharge unit S3b of the second electrostatic discharge unit EU2 are two adjacent sub electrostatic discharge units. The orthographic projection of the third sub electrostatic discharge unit S3a parallel to the first direction D1 is located in the orthographic projection of the first groove G1 parallel to the first direction D1, and the orthographic projection of the third sub electrostatic discharge unit S3b parallel to the first direction D1 is located in the orthographic projection of the second groove G2 parallel to the first direction D1, to reduce the space occupied by adjacent electrostatic discharge units in the second direction D2. In addition, the first signal line 01c adjacent to the first signal line 01d in the second direction D2 and the first signal line 01b also have a first recess and a second recess similar to that of the first signal line 01d. Orthographic projections of the first recesses and the second recesses of the plurality of first signal lines parallel to the first direction D1 are overlapped with each other, to match the staggered arrangement of the adjacent electrostatic discharge units in the second direction, reduce the overall width of the plurality of electrostatic discharge units and the plurality of first signal lines in the second direction D2.

For example, as shown in FIG. 4A, at least part of the plurality of electrostatic discharge unit groups are in a periodic arrangement in the second direction D2, and one electrostatic discharge unit group EUG is a repeating unit in the periodic arrangement to make the arrangement of the plurality of electrostatic discharge unit groups more regular, which is conducive to making and maintaining the uniformity of the routing of the plurality of first signal lines, thereby maintaining the uniformity of the first display signal transmitted by the plurality of first signal lines, and the uniformity of the electrostatic discharge effect on the plurality of first signal lines.

The number of sub electrostatic discharge units SEU included in one electrostatic discharge unit group is M*N*Q. For example, in the embodiments shown in FIG. 4A and FIG. 4B, M is equal to 1, N is equal to 2, and Q is equal to 3. In this case, for example, the width of one electrostatic discharge unit group EUG in the second direction D2 is less than or equal to 129.5 μm. The higher the resolution, the higher the requirement for reducing the total width of the plurality of electrostatic discharge units in the second direction D2. For example, the resolution of the display panel 10 is X*Y, in which X represents the number of rows of the pixel array in display region 1, Y represents the number of columns of the pixel array in display region 1, X is greater than or equal to 960, and Y is greater than or equal to 1440; for example, X=960, Y=1920; alternatively, X=1920, Y=3840; alternatively, X=1440, Y=1440. For the display panel with such high resolution, the above arrangement method provided by the embodiment of the present disclosure can also meet the requirement for the total width of the plurality of electrostatic discharge units in the second direction D2.

Referring to FIG. 2, for example, the non-display region 2 includes a lead region 21, which is the usual bonding region. The lead region 21 is provided with a COF (Chip On Flex, or Chip On Film) which includes a flexible circuit board (FPC) 23. For example, the flexible circuit board 23 includes a driver circuit IC configured to provide the first display signal to the data line DL. The electrostatic discharge region 20 is located between the lead region 21 and the display region 1. For example, in the display panel 10 provided by at least one embodiment of the present disclosure, the plurality of sub electrostatic discharge units SEU connected to the first signal lines 01 that provide the first display signals to all sub-pixels 100 are all located in the non-display region 2 on the same side of the display region 1 in the first direction D1. That is, the sub electrostatic discharge units SEU connected to the data lines DL that provide data signals to all sub-pixel columns are all located in the non-display region 2 on the same side of the display region 1, for example, are all arranged along one edge of the display region 1, rather than a part of the sub electrostatic discharge units SEU being arranged on the first side of the display region 1, and the other part of the sub electrostatic discharge units SEU being arranged on the second side opposite to the first side of the display region 1. For example, the non-display region 2 also includes a border region which includes a first border region 2a and a second border region 2b. The first border region 2a is located on the first side of the display region 1, and the sub electrostatic discharge units SEU connected to the data lines DL that provide data signals to all sub-pixel columns are all located in the first border region 2a, rather than in the second border region 2b. Therefore, the driving circuits only need to be set near the first border region 2a, which reduces the manufacture difficulty and simplifies the structure. Even in this case, the arrangement of sub electrostatic discharge units SEU provided by the embodiments of the present disclosure can still meet the requirement of setting a large number of sub electrostatic discharge units SEU utilizing the limited width in the second direction D2 of the region on the same side of the display region 1, even if the planar shape of the display panel is the above irregular shape of the display panel 10, a large number of sub electrostatic discharge units SEU can also be set by utilizing the limited width in the second direction D2 of a portion of the irregular edge, while taking into account the high PPI.

Referring to FIG. 2, for example, the first border region 2a is located between the lead region 21 and the display region 1, and the second border region 2b is located on the second side opposite the first side of the display region 1. A first power lead line PL is provided in the first border region 2a, and the first power lead line PL is configured to provide a first power voltage VDD to the sub-pixel 100; the lead region 21 includes a data selection region 22 located on a side of the border region away from the display region 1. The data selection region 22 is provided with a data selection unit, and the electrostatic discharge region 20 is located between the first power lead line PL and the data selection region 22.

Alternatively, the first power lead line PL is configured to provide a second power voltage VSS to the sub-pixel 100. For example, the first power lead line PL is arranged in the same layer as the gate electrode T01g of the first electrostatic discharge transistor T01 bellow, and is connected through a via or directly overlapped with the cathode of the sub-pixel covering the entire display region 1 in the non-display region 2; for example, the material of the first power lead line PL that provides the second power supply voltage VSS is a transparent conductive material, such as indium zinc oxide (ITO), indium zinc oxide (IZO), etc.

Figure 4C:
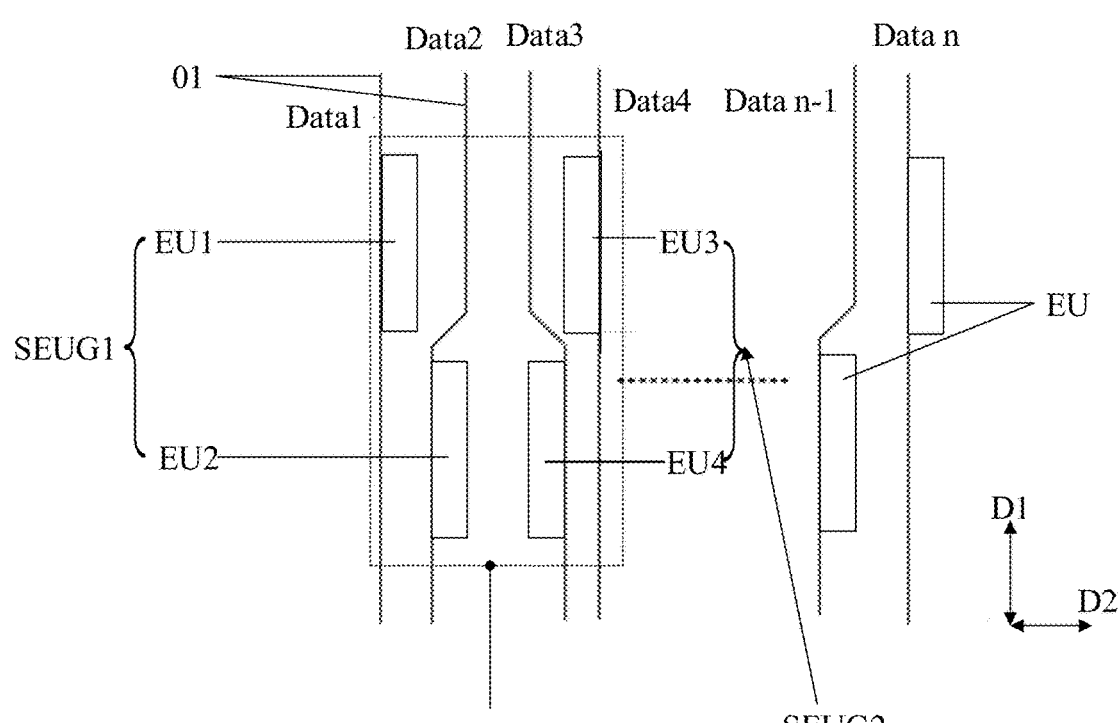
FIG. 4C is a schematic diagram of an arrangement of another electrostatic discharge unit in an electrostatic discharge region of the display panel provided by an embodiment of the present disclosure.

FIG. 4C is a schematic diagram of an arrangement of another electrostatic discharge unit in the electrostatic discharge region of the display panel provided by an embodiment of the present disclosure. The embodiment shown in FIG. 4C differs from FIG. 4A in the following aspects.

In the embodiment shown in FIG. 4C, in the case where M is equal to 2, N is equal to 2, and Q is equal to 3.

For example, as shown in FIG. 4C, the M sub electrostatic discharge unit group SEUG include a first sub electrostatic discharge unit group SEUG1 and a second sub electrostatic discharge unit group SEUG2. The first sub electrostatic discharge unit group SEUG1 and the second sub electrostatic discharge unit group SEUG2 are symmetrical relative to the axis of symmetry extending in the first direction D1, so that the arrangement of the plurality of electrostatic discharge unit groups is more regular, which is conducive to making and maintaining the uniformity of the routing of the plurality of first signal lines, thereby maintaining the uniformity of the first display signals transmitted by the plurality of first signal lines, and the uniformity of the electrostatic discharge effect on the plurality of first signal lines. Alternatively, in other embodiments, the first electrostatic discharge unit group and the second electrostatic discharge unit group may also be asymmetric.

The other features of the embodiment shown in FIG. 4C are the same as those in FIG. 4A and FIG. 4B, which can refer to the previous descriptions.

FIG. 4C is a schematic diagram of an arrangement of further another electrostatic discharge unit in the electrostatic discharge region of the display panel provided by an embodiment of the present disclosure. The embodiment shown in FIG. 4D differs from FIG. 4A in the following aspects. For example, for at least some electrostatic discharge units, such as two adjacent electrostatic discharge units, taking the second electrostatic discharge unit EU2 and the third electrostatic discharge unit EU3 adjacent to each other in the first electrostatic discharge unit group SEUG1 as an example, the orthographic projections of the two adjacent electrostatic discharge units on the plane parallel to the first direction D1 are not overlapped with each other and are spaced apart from each other in the second direction D2, that is, the orthographic projections of the two adjacent electrostatic discharge units on the plane parallel to the second direction D2 are not overlapped with each other, in this case, for example, the distance between the two adjacent electrostatic discharge units in the second direction D2 is less than 1 µm, and the distance between the adjacent edges of the two adjacent electrostatic discharge units in the second direction D2 is less than 1 µm.

Figure 4D:
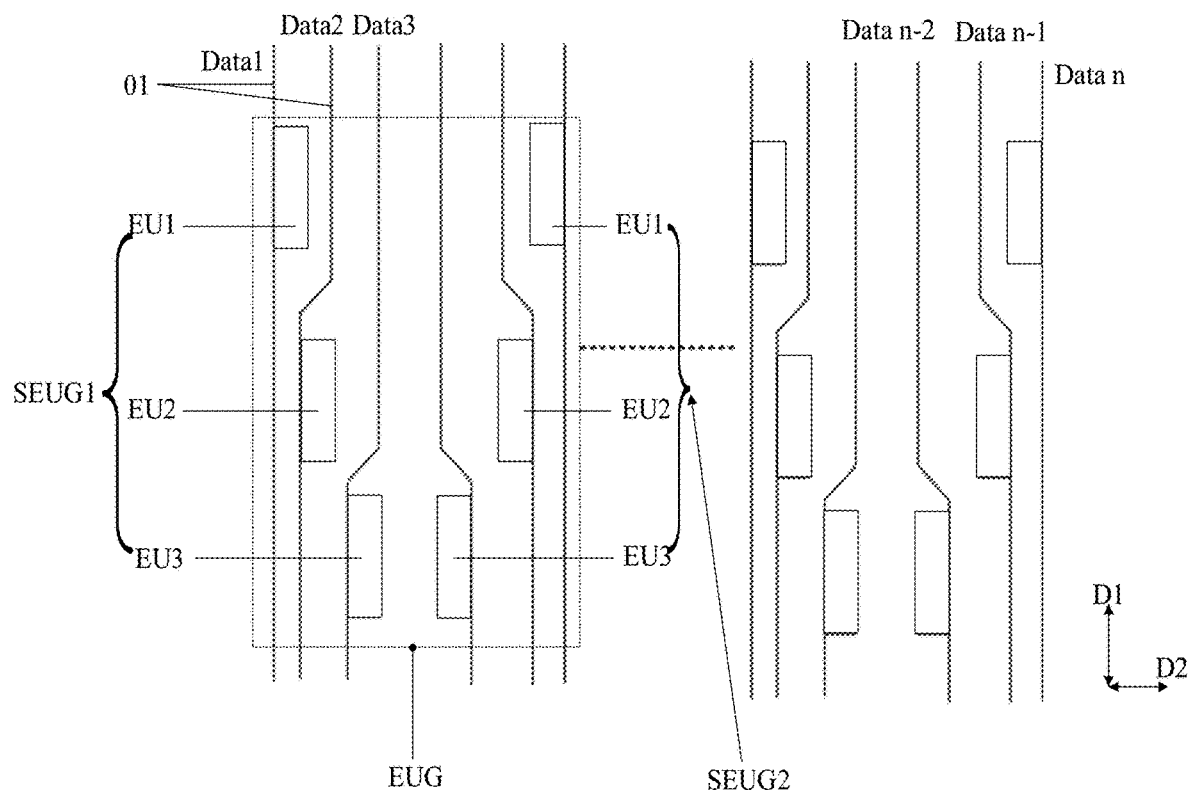
FIG. 4D is a schematic diagram of an arrangement of further another electrostatic discharge unit in an electrostatic discharge region of the display panel provided by an embodiment of the present disclosure.

In the embodiment shown in FIG. 4D, in the case where M is equal to 2, N is equal to 3, and Q is equal to 3, the width of one electrostatic discharge unit group in the second direction D2 is less than or equal to 294 µm. That is, the total width of 18 sub electrostatic discharge units included in one electrostatic discharge unit group in the second direction D2 is 294 µm, to meet the requirement of providing sufficient space for setting more electrostatic discharge units when the width of the electrostatic discharge region is narrower in the second direction D2.

Figure 4E:
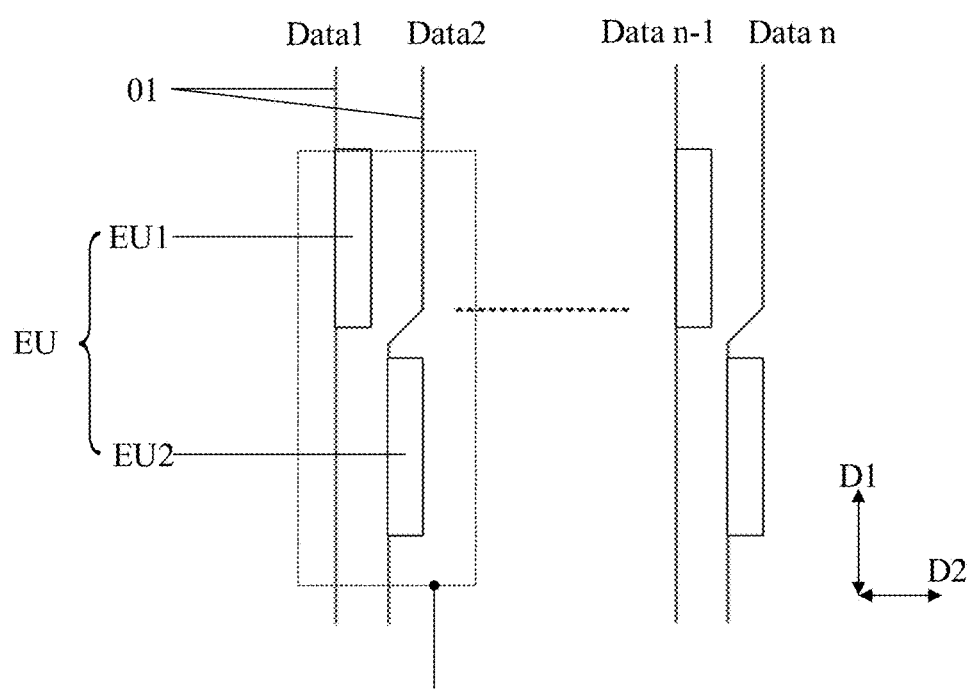
FIG. 4E is a schematic diagram of still another arrangement of another electrostatic discharge unit in an electrostatic discharge region of the display panel provided by an embodiment of the present disclosure.

FIG. 4E is a schematic diagram of an arrangement of further another electrostatic discharge unit in an electrostatic discharge region of the display panel provided by an embodiment of the present disclosure. The embodiment shown in FIG. 4E differs from FIG. 4A in that, in the embodiment shown in FIG. 4E, orthographic projections of two adjacent electrostatic discharge units, such as the first electrostatic discharge unit EU1 and the second electrostatic discharge unit EU2, on the plane parallel to the first direction D1 are not overlapped with each other and the orthographic projections of the two adjacent electrostatic discharge units on the plane parallel to the second direction D2 are not overlapped with each other, to reduce the space occupied by the plurality of electrostatic discharge units to a certain extent, for example, in each sub electrostatic discharge unit group SEUG, the orthographic projections of the two adjacent electrostatic discharge units on the plane parallel to the first direction D1 are not overlapped with each other, and the orthographic projections of the two adjacent electrostatic discharge units on the plane parallel to the second direction D2 are not overlapped with each other. For example, in the display panel 10 provided by at least one embodiment of the present disclosure, in the plurality of electrostatic discharge units EU, the orthographic projections of every two adjacent electrostatic discharge units EU on the plane parallel to the first direction D1 are not overlapped with each other. The other features of the embodiment shown in FIG. 4E are the same as those in FIG. 4A and FIG. 4B, which can refer to the previous descriptions.

Figure 5A:
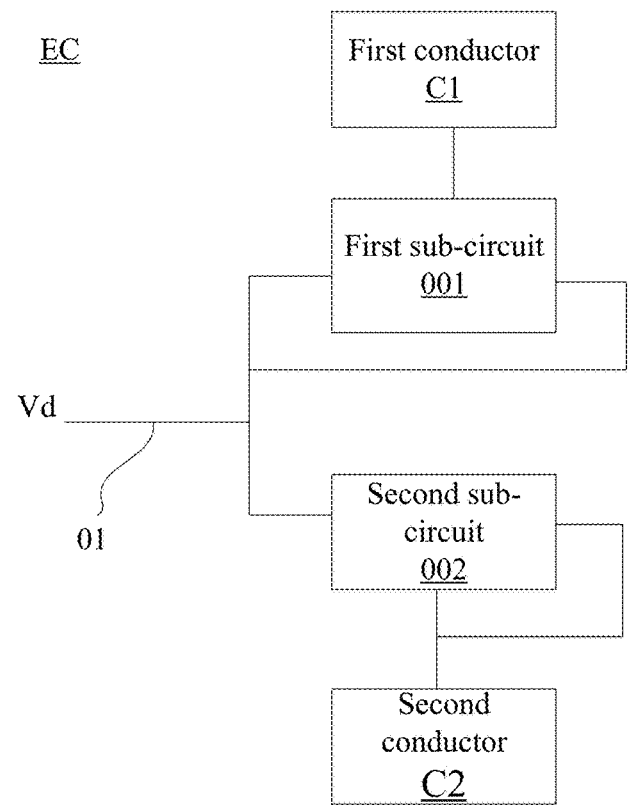
FIG. 5A is a schematic diagram of an electrostatic discharge circuit of a sub electrostatic discharge unit of a display panel provided by an embodiment of the present disclosure.

FIG. 5A is a schematic diagram of an electrostatic discharge circuit of a sub electrostatic discharge unit of t display panel provided by an embodiment of the present disclosure. As shown in FIG. 5A, for example, the electrostatic discharge circuit EC includes a first sub-circuit 001, the first sub-circuit 001 has a driving end, a first end, and a second end; the driving end and the first end of the first sub-circuit 001 are electrically connected to the first signal line 01, and the second end of the first sub-circuit 001 is electrically connected to the first conductor C1. In this way, the static electricity accumulated on the first signal line 01 can be transmitted to the first conductor C1 through the first sub-circuit 001, thereby reducing the charges on the first signal line 01 and preventing the accumulation of static electricity on the first signal line 01 from causing display defects.

As shown in FIG. 5A, for example, the sub electrostatic discharge unit SEU further includes a second conductor C2, and the electrostatic discharge circuit EC is electrically connected to the first signal line 01 and the second conductor C2, and is configured to allow the charges on the first signal line 01 to move towards the second conductor C2, thereby reducing the charges on the first signal line 01. The electrostatic discharge circuit EC further includes a second sub-circuit 002, the second sub-circuit 002 has a driving end, a first end, and a second end, the first end of the second sub-circuit 002 is electrically connected to the first signal line 01, and both the driving end and the second end of the second subcircuit 002 are connected to the second conductor C2. In this way, the static electricity accumulated on the first signal line 01 can also be transmitted to the second conductor C2 through the second sub-circuit 002, thereby reducing the charges on the first signal line 01 and preventing the accumulation of static electricity on the first signal line 01 from causing display defects.

For example, in some embodiments, the electrostatic discharge circuit may only include the first sub-circuit and not include the second sub-circuit mentioned above. For example, in the electrostatic discharge region 20 of the display panel 10, the first sub-circuit 001 and second sub-circuit 002 are arranged in the first direction D1 to reduce the total width of the first sub-circuit 001 and second sub-circuit 002 in the second direction D2 by designing the arrangement method of the first sub-circuit 001 and second sub-circuit 002, thereby reducing the total width of the static discharge unit in the second direction D2, so as to meet the requirement of arranging more sub electrostatic discharge units in the limited space in the second direction D2.

Figure 5B:
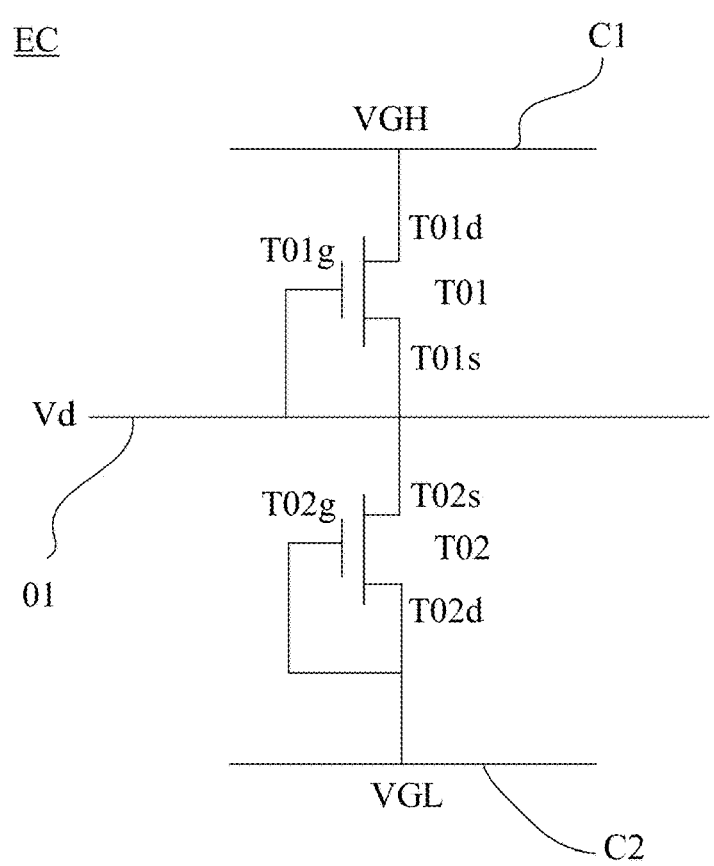
FIG. 5B is a schematic diagram of a specific electrostatic discharge circuit of a sub electrostatic discharge unit of a display panel provided by an embodiment of the present disclosure.

FIG. 5B is a schematic diagram of a specific electrostatic discharge circuit of a sub electrostatic discharge unit of a display panel provided by an embodiment of the present disclosure. As shown in FIG. 5B, in the electrostatic discharge circuit EC, the first sub-circuit 001 includes a first electrostatic discharge transistor T01, and the second sub-circuit 002 includes a second electrostatic discharge transistor T02; the gate electrode T01g and first electrode T01s of the first electrostatic discharge transistor T01 are electrically connected to the first signal line 01, and the second electrode T01d of the first electrostatic discharge transistor T01 is electrically connected to the first conductor C1; the first electrode T02s of the second electrostatic discharge transistor T02 is electrically connected to the first signal line 01, and the gate electrode T02g and the second electrode T02d of the second electrostatic discharge transistor T02 are both connected to the second conductor C2. The first conductor C1 is connected to a high voltage terminal VGH, and the second conductor C2 is connected to a low voltage terminal VGL. For example, the polarity of the voltage provided by the high voltage terminal VGH is opposite to the polarity of the voltage provided by the low voltage terminal VGL. For example, the polarity of the first voltage Vh provided by the high voltage terminal VGH is positive, and the polarity of the second voltage Vl provided by the low voltage terminal VGL is negative.

According to the characteristics of transistors, the transistors can be divided into N-type transistors and P-type transistors. In the case where the transistor is a P-type transistor, the turn-on voltage is a low-level voltage (such as 0V, −5V, −10V or other appropriate voltage), and the turn-off voltage is a high-level voltage (such as 5V, 10V or other appropriate voltage); in the case where the transistor is an N-type transistor, the turn-on voltage is a high-level voltage (such as 5V, 10V, or other suitable voltage), and the turn-off voltage is a low-level voltage (such as 0V, −5V, −10V, or other suitable voltage).

The working process of the electrostatic discharge circuit EC is as follows, taking the case that the first electrostatic discharge transistor T01 and the second electrostatic discharge transistor T02 are N-type transistors as an example. In the case where the first display signal transmitted on the first signal line 01 (such as the data signal Vd described below) is at a high level, the gate electrode T01g of the first electrostatic discharge transistor T01 responds to the high level and allow the first electrostatic discharge transistor T01 to be turned on. In this case, the second voltage Vl is at a low level, such as −8V, −6V, etc. The gate electrode T02g of the second electrostatic discharge transistor T02 responds to the low level and allow the second electrostatic discharge transistor T02 to be turned off, therefore, the charges on the first signal line 01 is transmitted to the first conductor C1 through the first electrostatic discharge transistor T01; in the case where the first display signal transmitted on the first signal line 01 (such as the data signal Vd described below) is at a low level, such as −30V, −20V, −10V, or other suitable voltage, the gate electrode T01g of the first electrostatic discharge transistor T01 responds to the low level and allow the first electrostatic discharge transistor T01 to be turned off, because of the fact that the second voltage Vl is a low level voltage and is higher than the low-level voltage of the first display signal transmitted on the first signal line 01, that is, higher than the low-level voltage on the gate electrode T01g of the first electrostatic discharge transistor T01, for example, the second voltage Vl is −8V, −6V, etc., so that the gate-source voltage Vgs of the second electrostatic discharge transistor T02 satisfies: Vgs=Vg−Vs=Vl−Vd>Vth, and Vd in this calculation formula represents the low-level voltage of the first display signal transmitted on the first signal line 01, Vth represents the threshold voltage of the second electrostatic discharge transistor T02, therefore, the second electrostatic discharge transistor T02 is turned on, and the charges on the first signal line 01 is transmitted to the second conductor C2 through the second electrostatic discharge transistor T02. Taking Vl=−8V and Vd=−20V as an example, Vgs=Vg−Vs=Vl−Vd=−8−(−20)=16V, Vgs is greater than the threshold voltage of a typical transistor. In this way, in the case where the first display signal transmitted on the first signal line 01 is at a high level or a low level, the static charges accumulated on the first signal line 01 can be released through the electrostatic discharge circuit EC shown in FIG. 5B.

For example, as shown in FIG. 3, the plurality of sub-pixels 100 are located in the display region 1. For example, in the display substrate 10 provided by some embodiments, some sub-pixels in the plurality of sub-pixels 100 are dummy sub-pixels 1000, and the dummy sub-pixels 1000 do not participate in the display work.

For example, the display substrate 10 is an organic light-emitting diode (OLED) display substrate, and the light-emitting device is an OLED. The display substrate 10 may further include a plurality of scanning lines and a plurality of data lines DL that configured to provide scanning signals (control signals) and data signals respectively to drive the plurality of sub-pixels. As needed, the display substrate 10 may further include power lines, detection lines, etc.

Figure 6A:
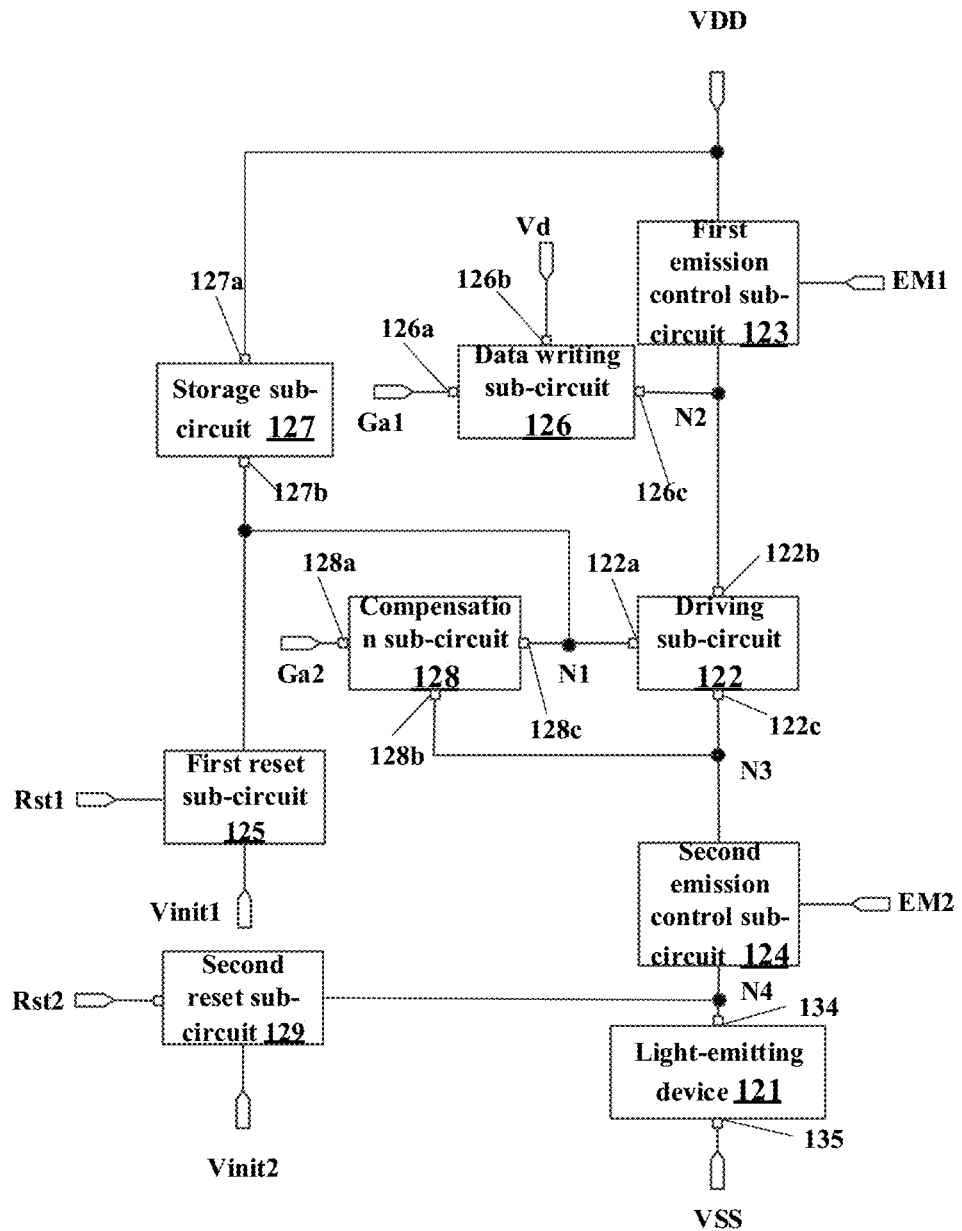
FIG. 6A is a schematic diagram of a pixel circuit of a sub-pixel provided by at least one embodiment of the present disclosure.

FIG. 6A is a schematic diagram of a pixel circuit of a sub-pixel provided by at least one embodiment of the present disclosure. As shown in FIG. 6A, a pixel circuit unit 100 includes a driving sub-circuit 122, a compensation sub-circuit 128, a data writing sub-circuit 126, a storage sub-circuit 127, a first emission control sub-circuit 123, a second emission control sub-circuit 124, a first reset sub-circuit 125, and a second reset sub-circuit 129.

For example, the driving sub-circuit 122 includes a control end 122a, a first end 122b, and a second end 122c, and is configured to be connected to a light-emitting device 121 and control the driving current flowing through the light-emitting device 121. The control end 122a of the driving sub-circuit 122 is connected to a first node N1, the first end 122b of the driving sub-circuit 122 is connected to a second node N2 and configured to receive a first power supply voltage VDD, and the second end 122c of the driving sub-circuit 122 is connected to a third node N3.

For example, the data writing sub-circuit 126 includes a control end 126a, a first end 126b, and a second end 126c. The control end 126a is configured to receive a first scanning signal Ga1, the first end 126b is configured to receive a data signal Vd, and the second end 126c is connected to the first end 122b of the driving sub-circuit 122 (that is, the second node N2). The data writing sub-circuit 126 is configured to write the data signal Vd to the first end 122b of the driving sub-circuit 122 in response to the first scanning signal Ga1. For example, the first end 126b of the data writing sub-circuit 126 is connected to a data line DL to receive the data signal Vd, and the control end 126a is connected to a gate line 11 which serves as a scanning line to receive the first scanning signal Ga1. For example, in a data writing and compensation stage, the data writing sub-circuit 126 can be turned on in response to the first scanning signal Ga1, thereby writing the data signal to the first end 122b of the driving sub-circuit 122 (the second node N2) and storing the data signal in the storage sub-circuit 127 to generate a driving current driving the light-emitting device 121 to emit light, for example, during a light-emitting stage.

For example, the compensation sub-circuit 128 includes a control end 128a, a first end 128b, and a second end 128c. The control end 128a of the compensation sub-circuit 128 is configured to receive a second scanning signal Ga2, and the first end 128b and second end 128c of the compensation sub-circuit 128 are electrically connected to the second end 122c and the control end 122a of the driving sub-circuit 122, respectively. The compensation sub-circuit 128 is configured to perform threshold compensation on the driving sub-circuit 122 in response to the second scanning signal Ga2.

For example, the first scanning signal Ga1 may be the same as the second scanning signal Ga2. For example, the first scanning signal Ga1 and the second scanning signal Ga2 may be connected to the same signal output terminal. For example, the first scanning signal Ga1 and the second scanning signal Ga2 may be transmitted through the same scanning line.

In other examples, the first scanning signal Ga1 may also be different from the second scanning signal Ga2. For example, the first scanning signal Ga1 and the second scanning signal Ga2 may be connected to different signal output terminals. For example, the first scanning signal Ga1 and the second scanning signal Ga2 may be transmitted through different scanning lines.

For example, the storage sub-circuit 127 includes a first end 127a and a second end 127b, the first end 127a of the storage sub-circuit is configured to receive the first power supply voltage VDD, and the second end 127b of the storage sub-circuit is electrically connected to the control end 122a of the driving sub-circuit.

For example, the storage sub-circuit 127 is electrically connected to the control terminal 122a of the driving sub-circuit 122 and a first voltage terminal vdd, and is configured to store the data signal written by the data writing sub-circuit 126. For example, in the data writing and compensation stages, the compensation sub-circuit 128 can be turned on in response to the second scanning signal Ga2, thereby storing the data signal written by the data writing sub-circuit 126 in the storage sub-circuit 127. For example, during the data writing and compensation stages, the compensation sub-circuit 128 can electrically connect the control end 122a and the second end 122c of the driving sub-circuit 122, so that the relevant information of the threshold voltage of the driving sub-circuit 122 can also be stored in the storage sub-circuit accordingly. For example, during the light-emitting stage, the stored data signal and threshold voltage can be used to control the driving sub-circuit 122, so that the output of the driving sub-circuit 122 can be compensated.

For example, the first emission control sub-circuit 123 is connected to the first end 122b of the driving sub-circuit 122 (the second node N2) and the first voltage end vdd, and is configured to apply the first power supply voltage VDD of the first voltage end vdd to the first end 122b of the driving sub-circuit 122 in response to a first emission control signal EM1. For example, as shown in FIG. 6A, the first emission control sub-circuit 123 is connected to the first emission control terminal EM1, the first voltage terminal vdd, and the second node N2.

For example, the second emission control sub-circuit 124 is connected to a second emission control terminal EM2, the first end 134 of the light-emitting device 121, and the second end 122c of the driving sub-circuit 122, and is configured to respond to the second emission control signal to allow the driving current to be applied to the light-emitting device 121.

For example, in the light-emitting stage, the second emission control sub-circuit 124 is turned on in response to the second emission control signal EM2 provided by the second emission control terminal EM2, so that the driving sub-circuit 122 can be electrically connected to the light-emitting device 121 through the second emission control sub-circuit 124, thereby driving the light-emitting device 121 to emit light under the control of the driving current; in the non-light-emitting stage, the second emission control sub-circuit 124 is turned off in respond to the second emission control signal EM2, thereby avoiding the current flowing through the light-emitting device 121 and causing the light-emitting device to emit light, so as to improve the contrast of the corresponding display device.

For example, during an initialization phase, the second emission control sub-circuit 124 can also be turned on in response to the second emission control signal EM2, thereby combining with a reset sub-circuit to perform a reset operation on the driving sub-circuit 122 and the light-emitting device 121.

For example, the second emission control signal EM2 and the first emission control signal EM1 may be the same, for example, the second emission control signal EM2 and the first emission control signal EM1 may be connected to the same signal output terminal, for example, the second emission control signal EM2 and the first emission control signal EM1 may be transmitted through the same emission control line.

In other examples, the second emission control signal EM2 and the first emission control signal EM1 may be different. For example, the second emission control signal EM2 and the first emission control signal EM1 may be connected to different signal output terminals. For example, the second emission control signal EM2 and the first emission control signal EM1 may be transmitted through different emission control lines.

For example, the first reset sub-circuit 125 is connected to a first reset voltage terminal Vinit1 and the control terminal 122a of the driving sub-circuit 122 (the first node N1), and is configured to apply a first reset voltage Vinit1 to the control terminal 122a of the driving sub-circuit 122 in response to a first reset control signal Rst1.

For example, the second reset sub-circuit 129 is connected to a second reset voltage terminal Vinit2 and the first end 134 of the light-emitting device 121 (a fourth node N4), and is configured to apply a second reset voltage Vinit2 to the first end 134 of the light-emitting device 121 in response to a second reset control signal Rst2.

For example, the first reset sub-circuit 125 and the second reset sub-circuit 129 can be turned on in response to the first reset control signal Rst1 and the second reset control signal Rst2, respectively, so that the second reset voltage Vinit2 can be applied to the first node N1 and the first reset voltage Vinit can be applied to the first end 134 of the light-emitting device 121, thereby resetting the driving sub-circuit 122, the compensation sub-circuit 128, and the light-emitting device 121, and eliminating the impact of previous light-emitting stage.

For example, the second reset control signal Rst2 of each row of sub-pixels may be the same signal as the first scan signal Ga1 of this row of sub-pixels, and the second reset control signal Rst2 and the first scan signal Ga1 may be transmitted through the same gate line (such as the reset control line 220b in FIG. 3A). For example, the first reset control signal Rst1 of each row of sub-pixels may be the same signal as the first scan signal Ga1 of the previous row of sub-pixels, and the first reset control signal Rst1 and the first scan signal Ga1 may be transmitted through the same gate line (such as the reset control line 220a in FIG. 3A).

For example, as shown in FIG. 6A, the light-emitting device 121 includes a first end 134 and a second end 135. The first end 134 of the light-emitting device 121 is configured to be connected to the second end 122c of the driving sub-circuit 122, and the second end 135 of the light-emitting device 121 is configured to be connected to a second voltage terminal VSS. For example, in one example, as shown in FIG. 6A, the first end 134 of the light-emitting device 121 may be connected to the fourth node N4 through the second emission control sub-circuit 124. The embodiments of the present disclosure include but are not limited to this situation.

It should be noted that, in the explanation of the embodiments of the present disclosure, the first node N1, the second node N2, the third node N3, and the fourth node N4 do not necessarily represent actual components, but rather represent the junction points of the relevant circuit connections in the circuit diagram.

It should be noted that, in the description of embodiments of the present disclosure, the symbol Vd can represent both the data signal terminal and the level of the data signal. Similarly, the symbols Ga1 and Ga2 can represent both the first scanning signal and the second scanning signal end, as well as the first scanning signal terminal and the second scanning signal terminal. The symbol Rst1 can represent both the first reset control terminal and the first reset control signal, the symbol Rst2 can represent both the second reset control terminal and the second reset control signal. The symbols Vinit1 and Vinit2 can represent both the first reset voltage terminal and the second reset voltage terminal, as well as the first reset voltage and the second reset voltage. The symbol VDD can represent both the first power voltage and the first power line. The symbol VSS can represent both the common power voltage and the common power line. The following embodiments are the same and will not be repeated.

Figure 6B:
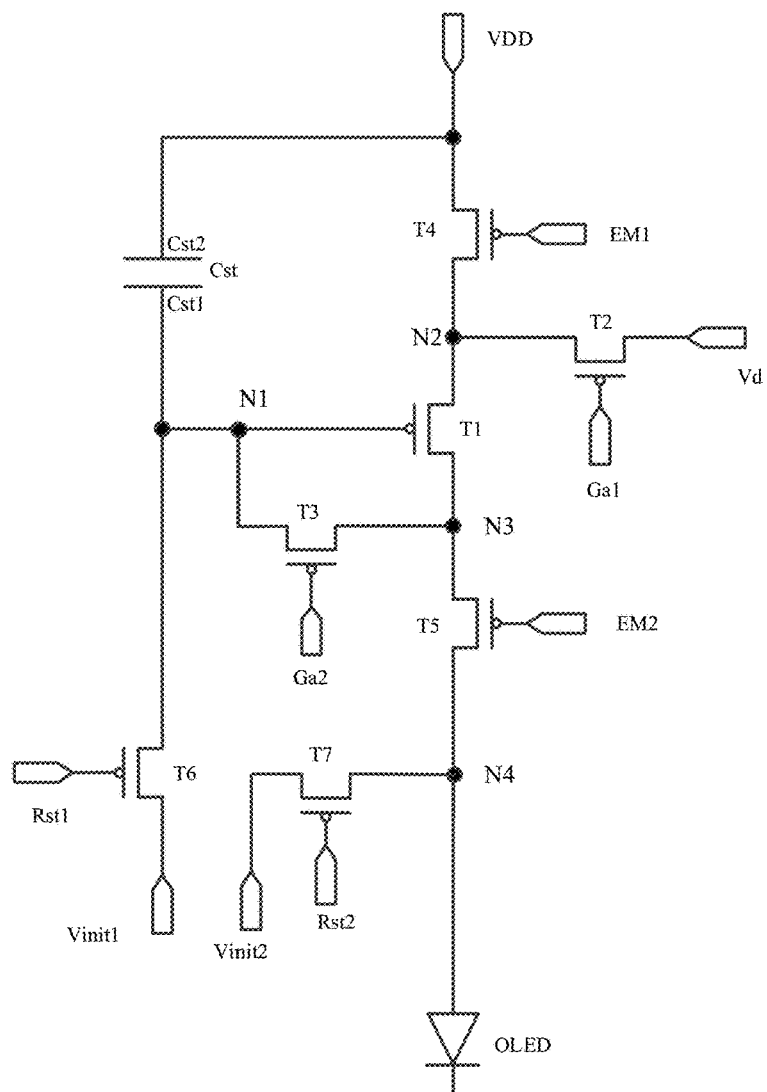
FIG. 6B is a circuit diagram of a specific implementation example of the pixel circuit shown in FIG. 6A.

FIG. 6B is a circuit diagram of a specific implementation example of the pixel circuit shown in FIG. 6A. As shown in FIG. 6B, the pixel circuit includes first to seventh transistors T1, T2, T3, T4, T5, T6, T7, and includes a storage capacitor Cst. For example, the first transistor T1 is used as a driving transistor, and the other second to seventh transistors are used as switching transistors.

For example, as shown in FIG. 6B, the driving sub-circuit 122 may be implemented as a first transistor T1. The gate electrode of the first transistor T1 serves as the control terminal 122a of the driving sub-circuit 122, and is connected to the first node N1; the first electrode of the first transistor T1 serves as the first end 122b of the driving sub-circuit 122, and is connected to the second node N2; the second electrode of the first transistor T1 serves as the second end 122c of the driving sub-circuit 122, and is connected to the third node N3.

For example, as shown in FIG. 6B, the data writing sub-circuit 126 may be implemented as a second transistor T2. The gate electrode of the second transistor T2 is connected to the first scanning signal terminal Ga1 to receive the first scanning signal, the first electrode of the second transistor T2 is connected to the data line DL (data signal terminal Vd) to receive the data signal, and the second electrode of the second transistor T2 is connected to the first end 122b of the driving sub-circuit 122 (the second node N2).

For example, as shown in FIG. 6B, the compensation sub-circuit 128 may be implemented as a third transistor T3. The gate electrode, the first electrode, and the second electrode of the third transistor T3 serve as the control end 128a, the first end 128b, and the second end 128c of the compensation sub-circuit, respectively. The gate electrode of the third transistor T3 is configured to be connected to the second scanning line (the second scanning signal terminal Ga2) to receive the second scanning signal. The first electrode T3s of the third transistor T3 is connected to the second electrode T1d of the first transistor T1 (the third node N3), and the second electrode T3d of the third transistor T3 is electrically connected to the gate electrode T1g of the first transistor T1 (the first node N1). For example, as shown in FIG. 6B, the storage sub-circuit 127 may be implemented as a storage capacitor Cst, the storage capacitor Cst includes a first electrode plate Cst1 and a second electrode plate Cst2. The first electrode plate Cst2 is electrically connected to the first voltage terminal vdd, and the second electrode plate Cst1 is electrically connected to the gate electrode T1g of the first transistor T1 (the first node N1).

For example, as shown in FIG. 6B, the first emission control sub-circuit 123 may be implemented as a fourth transistor T4. The gate electrode of the fourth transistor T4 is connected to the first emission control line (the first emission control terminal EM1) to receive the first emission control signal, the first electrode of the fourth transistor T4 is connected to the first voltage terminal vdd to receive the first power supply voltage, and the second electrode of the fourth transistor T4 is connected to the first end 122b of the driving sub-circuit 122 (the second node N2).

For example, the light-emitting device 121 is specifically implemented as a light-emitting diode (LED), which may be an organic light-emitting diode (OLED), a quantum dot light-emitting diode (QLED), or an inorganic light-emitting diode, which may be a micro light-emitting diode (Micro LED) or a micro OLED. For example, the light-emitting device 121 may be a top emitting structure, a bottom emitting structure, or a double-sided emitting structure. The light-emitting device 121 may emit red light, green light, blue light, or white light, etc. The embodiments of the present disclosure do not limit the specific structure of the light-emitting device.

For example, the first end of the light-emitting device 121 includes a first electrode (such as an anode), the first electrode is connected to the fourth node, and is configured to be connected to the second end 122c of the driving sub-circuit 122 through the second emission control sub-circuit 124, and the second end of the light-emitting device 121 includes a second electrode (such as a cathode), the second electrode is configured to be connected to the common power voltage terminal VSS to receive the common power voltage VSS, the current that flows into the light-emitting device 121 from the second end 122c of the driving sub-circuit 122 determines the brightness of the light-emitting device. For example, the common power supply voltage terminal VSS may be grounded, which means that VSS may be 0V. For example, the common power supply voltage VSS may be negative.

For example, the second emission control sub-circuit 124 may be implemented as a fifth transistor T5. The gate electrode of the fifth transistor T5 is connected to the second emission control line (the second emission control end EM2) to receive the second emission control signal, the first electrode of the fifth transistor T5 is connected to the second end 122c of the driving sub-circuit 122 (the third node N3), and the second electrode of the fifth transistor T5 is connected to the first end 134 of the light-emitting device 121 (the fourth node N4).

For example, the first reset sub-circuit 125 may be implemented as a sixth transistor T6, and the second reset sub-circuit may be implemented as a seventh transistor T7. The gate electrode of the sixth transistor T6 is configured to be connected to the first reset control terminal Rst1 to receive the first reset control signal Rst1, the first electrode of the sixth transistor T6 is connected to the first reset voltage terminal Vinit1 to receive the first reset voltage Vinit1, and the second electrode of the sixth transistor T6 is configured to be connected to the first node N1. The gate electrode of the seventh transistor T7 is configured to be connected to the second reset control terminal Rst2 to receive the second reset control signal Rst2, the first electrode of the seventh transistor T7 is connected to the second reset voltage terminal Vinit2 to receive the second reset voltage Vinit2, and the second electrode of the seventh transistor T7 is configured to be connected to the fourth node N4.

It should be noted that the transistors used in the embodiments of the present disclosure may all be thin film transistors, field-effect transistors, or other switching devices with the same characteristics. In the embodiments of the present disclosure, the case that all the thin film transistors are thin film transistors is taken as examples for explanation. The source electrode and the drain electrode of the transistor used here may be symmetrical in structure, so the source electrode and the drain electrode may be structurally indistinguishable. In the embodiments of the present disclosure, in order to distinguish the two electrodes of the transistor except for the gate electrode, one electrode is directly described as the first electrode and the other electrode is the second electrode.

For example, as shown in FIG. 6B, the first to seventh transistors T1-T7 are all P-type transistors, such as low-temperature polycrystalline silicon thin film transistors. However, the embodiments of the present disclosure do not limit the type of the transistors. In the case where the type of the transistor changes, the connection relationship in the circuit can be adjusted accordingly.

Figure 6C:
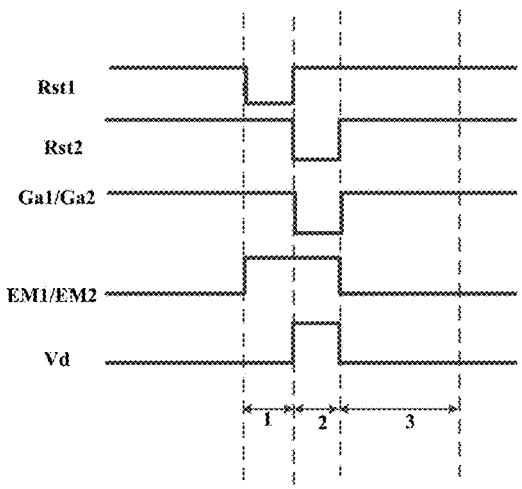
FIG. 6C is a signal timing diagram of a driving method of a pixel circuit provided by at least one embodiment of the present disclosure.

The working principle of the pixel circuit shown in FIG. 6B is explained below with reference to the signal timing diagram shown in FIG. 6C. As shown in FIG. 6C, the display process of each frame of image includes three stages, namely an initialization stage 1, a data writing and compensation stage 2, and a light-emitting stage 3.

As shown in FIG. 6C, in this embodiment, the first scanning signal Ga1 and the second scanning signal Ga2 adopt the same signal, and the first emission control signal EM1 and the second emission control signal EM2 adopt the same signal; and the waveform of the second reset control signal Rst2 and the waveform of the first scanning signal Ga1/the second scanning signal Ga2 are the same, that is, the second reset control signal Rst2 and the first scanning signal Ga1/the second scanning signal Ga2 can use the same signal; the waveform of the first reset signal Rst1 of the present row of sub-pixels is the same as the waveform of the first scan signal Ga1/the second scan signal Ga2 of the previous row of sub-pixels, that is, the first reset signal Rst1 of the present row of sub-pixels and the first scan signal Ga1/the second scan signal Ga2 of the previous row of sub-pixels adopt the same signal. However, this is not a limitation of the present disclosure. In other embodiments, different signals may be adopted as the first scanning signal Ga1, the second scanning signal Ga2, the first reset control signal Rst1, and the second reset control signal Rst2, respectively, and different signals may be adopted as the first emission control signal EM1 and the second emission control signal EM2, respectively.

In the initialization stage 1, the first reset control signal Rst1 is input to turn on the sixth transistor T6, and the first reset voltage Vinit1 is applied to the gate electrode of the first transistor T1, thereby resetting the first node N1.

In the data writing and compensation stage 2, the first scanning signal Ga1, the second scanning signal Ga2, and the data signal Vd are input. The second transistor T2 and the third transistor T3 are turned on, and the data signal Vd is written to the second node N2 through the second transistor T2. The first node N1 is charged through the first transistor T1 and the third transistor T3 until the potential of the first node N1 changes to Vd+Vth, and the first transistor T1 is cut off, in which Vth is the threshold voltage of the first transistor T1. The potential of the first node N1 is stored in the storage capacitor Cst to be maintained, which means that the voltage information with the data signal and threshold voltage Vth is stored in the storage capacitor Cst for providing grayscale display data and compensating for the threshold voltage of the first transistor T1 during the subsequent emission stage.

In the data writing compensation stage 2, the second reset control signal Rst2 may also be input to turn on the seventh transistor T7, and the second reset voltage Vinit2 is applied to the fourth node N4, thereby resetting the fourth node N4. For example, resetting the fourth node N4 may also be performed in the initialization stage 1, for example, the first reset control signal Rst1 and the second reset control signal Rst2 may be the same. The embodiments of the present disclosure are not limited in this aspect.

In the emission stage 3, the first emission control signal EM1 and the second emission control signal EM2 are input to turn on the fourth transistor T4, the fifth transistor T5, and the first transistor T1. The fifth transistor T5 applies the driving current to the OLED to make the OLED emit light. The value of the driving current Id flowing through the OLED can be determined by the following formula:

Id=K(VGS−Vth)2=K[(Vd+Vth−VDD)−Vth]2=K(Vd−VDD)2, in which K is the conductivity of the first transistor.

In the above formula, Vth represents the threshold voltage of the first transistor T1, VGS represents the voltage between the gate electrode and the source electrode (here the first electrode) of the first transistor T1, and K is a constant value related to the first transistor T1 itself. From the above formula for calculating Id, it can be seen that the driving current Id flowing through the OLED is no longer related to the threshold voltage Vth of the first transistor T1, which can achieve compensation for the pixel circuit, solve the problem of threshold voltage drift caused by the driving transistor (the first transistor T1 in the embodiments of the present disclosure) because of the process and long-term operation, and eliminate its impact on the driving current Id, and therefore the display effect of the display device using the pixel circuit can be improved.

Referring to FIG. 3, the display substrate 10 includes a base substrate 200, a first signal line 01 extending in the first direction D1 as a whole on the base substrate 200, and a second signal line 02 extending in the second direction D2 as a whole on the base substrate 200. For example, the first signal line 01 intersects with the second signal line 02 to define a plurality of sub-pixels 100. It should be noted that the boundaries of each of the plurality of sub-pixels may not necessarily be the first signal line 01 and the second signal line 02. The first signal line 01 intersect and the second signal line 02 to define a plurality of sub-pixels refers to the arrangement of the plurality of sub-pixels being consistent with the arrangement of the plurality of regions defined by the intersection of the first signal line 01 and the second signal line 02, that is, the plurality of sub-pixels are in one-to-one correspondence with to the plurality of regions defined by the intersection of the first signal line 01 and the second signal line 02.

For example, the first signal line 01 is the data line DL, and the second signal line 02 is the gate line that serves as the scanning signal line. The first display signal is the data signal Vd, and the first signal line 01 transmits the data signal Vd; each of at least some sub-pixels 100 in the plurality of sub-pixels 100 includes the above pixel circuit, which includes the light-emitting device, the driving transistor T1, and the data writing transistor T2. The data writing transistor T2 is configured to transmit the data signal Vd to the driving transistor T1 under the control of the first scanning signal Ga1; the driving transistor T1 is configured to control the magnitude of the driving current flowing through the light-emitting device based on the data signal Vd, and the light-emitting device is configured to receive the driving current and be driven by the driving current to emit light.

Of course, in other embodiments, the first signal line may also be other types of signal lines. In the present disclosure, the first signal line is not limited to the above data line DL.

Figure 7A:
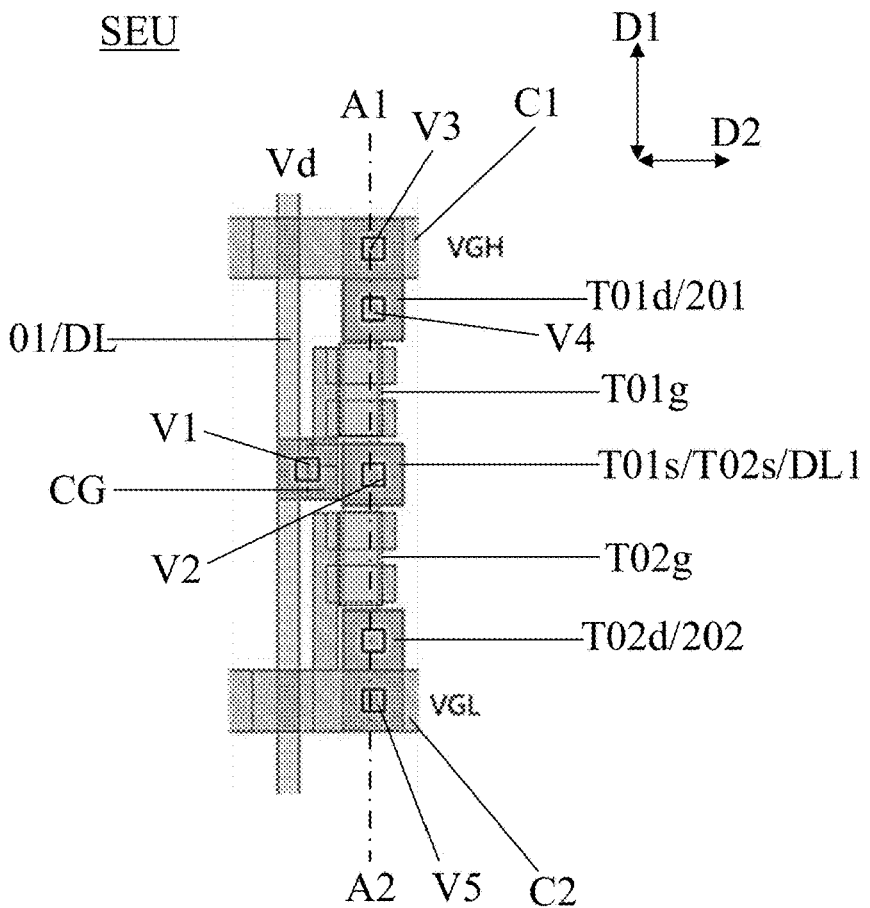
FIG. 7A is a planar schematic diagram of a structure of a sub electrostatic discharge unit of a display panel provided by at least one embodiment of the present disclosure.
Figure 7B:
FIG. 7B is a schematic diagram of a semiconductor layer of the sub electrostatic discharge unit shown in FIG. 7A.
Figure 7C:
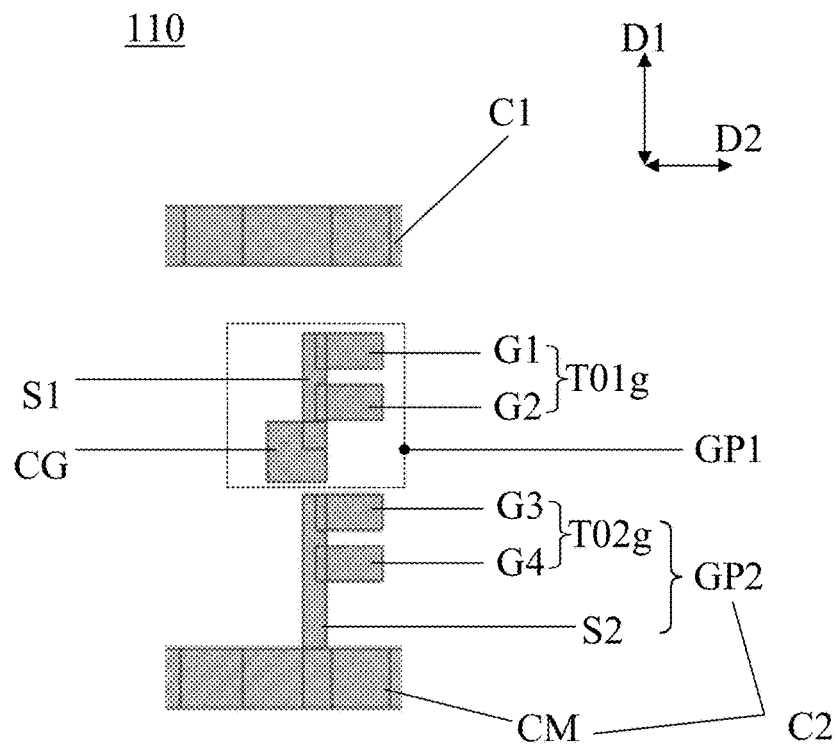
FIG. 7C is a schematic diagram of a first conductive layer of the sub electrostatic discharge unit shown in FIG. 7A.
Figure 7D:
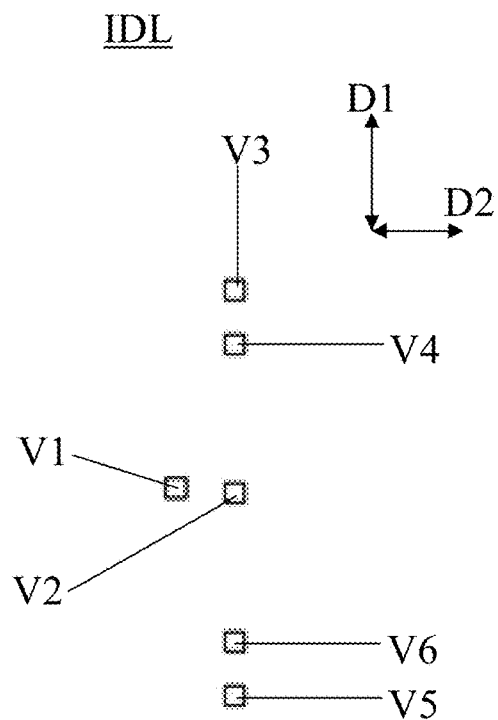
FIG. 7D is a schematic diagram of an interlayer insulation layer of the sub electrostatic discharge unit shown in FIG. 7A.
Figure 7E:
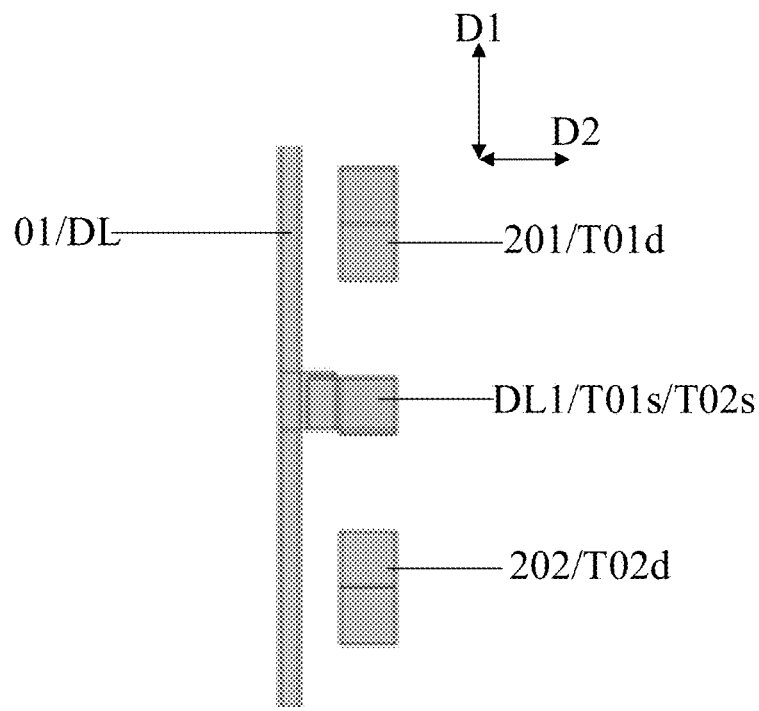
FIG. 7E is a schematic diagram of a second conductive layer of the sub electrostatic discharge unit shown in FIG. 7A.
Figure 7F:
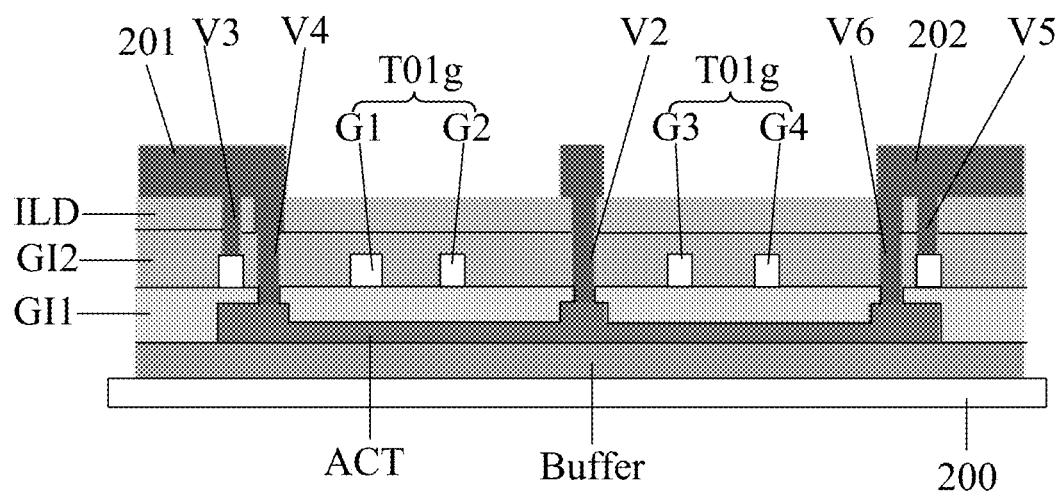
FIG. 7F is a cross-sectional schematic diagram along a line A1-A2 in FIG. 7A.

FIG. 7A is a planar schematic diagram of a structure of a sub electrostatic discharge unit of a display panel provided by at least one embodiment of the present disclosure; FIG. 7B is a schematic diagram of a semiconductor layer of the sub electrostatic discharge unit shown in FIG. 7A; FIG. 7C is a schematic diagram of a first conductive layer of the sub electrostatic discharge unit shown in FIG. 7A; FIG. 7D is a schematic diagram of an interlayer insulation layer of the sub electrostatic discharge unit shown in FIG. 7A; FIG. 7E is a schematic diagram of a second conductive layer of the sub electrostatic discharge unit shown in FIG. 7A; and FIG. 7F is a cross-sectional schematic diagram along a line A1-A2 in FIG. 7A.

Referring to FIG. 7A, for example, in the display panel 10 provided by at least one embodiment of the present disclosure, the size of the electrostatic discharge circuit EC in the second direction D2 is smaller than the size of the electrostatic discharge circuit EC in the first direction D1, and the second direction D2 is perpendicular to the first direction D1 to minimize the width of each sub electrostatic discharge unit in the second direction D2 as much as possible, thereby greatly reducing the total width of the plurality of sub electrostatic discharge units in the second direction D2.

Referring to FIG. 7A, for example, the first electrostatic discharge transistor T01 and the second electrostatic discharge transistor T02 are arranged in the first direction D1, the first electrode T01s and second electrode T01d of the first electrostatic discharge transistor T01 are arranged in the first direction D1, and the first electrode T02s and second electrode T02d of the second electrostatic discharge transistor T02 are arranged in the first direction D1 to reduce the overall width in the second direction D2 of the whole constituted by the first electrostatic discharge transistor T01 and the second electrostatic discharge transistor T02 by designing the arrangement mode of the first electrostatic discharge transistor T01, the second electrostatic discharge transistor T02, the source electrode and the drain electrode of the first electrostatic discharge transistor T01 and the source electrode and the drain electrode of the second electrostatic discharge transistor T02, thereby reducing the width in the second direction D2 of the electrostatic discharge circuit and reducing the width in the second direction D2 of the electrostatic discharge unit, to meet the requirement of arranging more sub electrostatic discharge units in the limited space in the second direction D2.

Referring to FIG. 7A and FIG. 7B, for example, the first electrostatic discharge transistor T01 includes a first active layer T01a, and the second electrostatic discharge transistor T02 includes a second active layer T02a; the first active layer T01a and the second active layer T02a both extend in the first direction D1. The width in the second direction D2 of the first active layer T01a is less than the length in the first direction D1 of the first active layer T01a, and the width in the second direction D2 of the second active layer T02a is less than the length in the first direction D1 of the second active layer T02a, so as to utilize the space in the first direction to arrange the first electrostatic discharge transistor T01 and the second electrostatic discharge transistor T02, and further reduce the widths in the second direction D2 of the first electrostatic discharge transistors T01 and the second electrostatic discharge transistors T02, while taking into account the proper sizes of the first active layer and the second active layer, as well as the performance of the first electrostatic discharge transistor T01 and the second electrostatic discharge transistor T02. For example, the width in the second direction D2 of the first active layer T01a is smaller than the length in the first direction D1 of the first active layer T01a, and the width in the second direction D2 of the second active layer T02a is smaller than the length in the first direction D1 of the second active layer T02a, so as to further reduce the widths in the second direction D2 of the first electrostatic discharge transistor T01 and the second electrostatic discharge transistor T02, while take into account the proper sizes of the first second active layer and the second active layer, as well as the performance of the first electrostatic discharge transistors T01 and the second electrostatic discharge transistor T02.

Referring to FIG. 7A and FIG. 7B, for example, the electrostatic discharge semiconductor layer is located in the semiconductor layer ACT. The first active layer T01a and the second active layer T02a form a continuous integral electrostatic discharge semiconductor layer, and the electrostatic discharge semiconductor layer is in a strip shape extending in the first direction D1 as a whole. For example, the electrostatic discharge semiconductor layer is in a straight strip shape located on a side of both the first strip portion S1 and the second strip portion S2 away from the data line DL, so as to further reduce the space occupied by the first gate portion GP1, the second gate portion GP2, and the electrostatic discharge semiconductor layer in the second direction D2, thereby further reducing the width in the second direction D2 of one sub electrostatic discharge unit, which can effectively reduce the total width in the second direction D2 occupied by the plurality of sub electrostatic discharge units.

Referring to FIG. 7A and FIG. 7C, for example, the first conductor C1 and the second conductor C2, the gate electrode T01g of the first electrostatic discharge transistor T01, and the gate electrode T02g of the second electrostatic discharge transistor T02 are all located in the first conductive layer 110. For example, the gate electrode T01g of the first electrostatic discharge transistor T01 and the gate electrode T02g of the second electrostatic discharge transistor T02 are both in the same layer as the gate electrode of the driving transistor T1 of the pixel circuit, so the gate electrode T01g of the first electrostatic discharge transistor T01 and the gate electrode T02g of the second electrostatic discharge transistor T02 can be formed using the same mask and the same one patterning process as the gate electrode of the driving transistor T1 of the pixel circuit, which simplifies the production process and the layer structure of the display panel. The first conductor C1 and the second conductor C2 are spaced apart in the first direction D1, and the first conductor C1 extends in the second direction D2. The sub electrostatic discharge unit SEU includes a first gate portion GP1; the second conductor C2 includes a main body portion CM extending in the second direction D2 and a second gate portion GP2 which is connected to the main body portion CM and extends in the second direction D2, for example, the second gate portion GP2 forms a continuous and integral structure with the main body portion CM of the second conductor C2; the first gate portion GP1 and the second gate portion GP2 are spaced apart in the first direction D1, and the first gate portion GP1 and the second gate portion GP2 are located between the first conductor C1 and the main body portion CM of the second conductor C2; the portion of the first gate portion GP1 that overlaps with the first active layer T01a constitutes the gate electrode T01g of the first electrostatic discharge transistor T01, the portion of the second gate portion GP2 that overlaps with the second active layer T02a constitutes the gate electrode T02g of the second electrostatic discharge transistor T02, and the first gate portion GP1 is electrically connected to the data line DL.

Referring to FIG. 7A and FIG. 7C, for example, the first gate portion GP1 includes a first strip portion S1 extending in the first direction D1 and a gate connection structure CG electrically connected to the first strip portion S1. The gate connection structure CG protrudes from the first strip portion S1 towards the data line DL in the second direction D2, and the gate connection structure CG is electrically connected to the data line DL through a first via V1. The first gate portion GP1 further includes a first protrusion portion electrically connected to the first strip portion S1, the first protrusion portion protrudes from the first strip portion S1 in the second direction D2 away from the data line DL. The portion of the first protrusion portion that overlaps with the first active layer T01a constitutes the gate electrode T01g of the first electrostatic discharge transistor T01. For example, the first protrusion portion includes a first connection block G1 and a second connection block G2 arranged in the first direction D1 and spaced apart from each other. The second gate portion GP2 includes a second strip portion S2 extending in the first direction D1 and a second protrusion portion electrically connected to the second strip portion S2. The second protrusion portion protrudes from the second strip portion S2 in the second direction D2, and the portion of the second protrusion portion that overlaps with the second active layer T02a constitutes the gate electrode T02g of the second electrostatic discharge transistor T02. For example, the second protrusion portion includes a third connection block G3 and a fourth connection block G4 arranged in the first direction D1 and spaced apart from each other.

Referring to FIG. 7A and FIG. 7C, for example, the second protrusion protrudes from the second strip portion S2 in a direction away from the data line DL in the second direction D2. The first strip portion S1 is substantially aligned with the second strip portion S2 in the first direction D1, and the first protrusion portion and the second protrusion portion are substantially aligned in the first direction D1, to reduce the width of the second gate portion GP2 in the second direction D2, thereby reducing the width of one sub electrostatic discharge unit in the second direction D2, which can effectively reduce the total width occupied by the plurality of sub electrostatic discharge units in the second direction D2.

Referring to FIG. 7A and FIG. 7E, for example, the first signal line 01 is located in the second conductive layer 120. The sub electrostatic discharge unit SEU further includes a data connection structure DL1, the data connection structure DL1 is electrically connected to the data line DL and protrudes from the data line DL towards the electrostatic discharge semiconductor layer in the second direction D2. The first end of the data connection structure DL1 close to the data line DL in the second direction D2 is electrically connected to the gate connection structure CG through the first via V1, thereby achieving the electrical connection between the gate connection structure CG and the data line DL through the first via V1, that is, realizing the electrical connection between the gate electrode T01g of the first electrostatic discharge transistor T01 and the data line DL. The second end of the data connection structure DL1 away from the data line DL in the second direction D2 is electrically connected to the electrostatic discharge semiconductor layer through a second via V2, thereby achieving the electrical connection between the first electrode T01s of the first electrostatic discharge transistor T01 and the data line DL, and the electrical connection between the first electrode TO2s of the second electrostatic discharge transistor T02 and the data line DL. The second via V2 is located between the first protrusion portion and the second protrusion portion in the first direction D1. For example, the data connection structure DL1 is electrically connected to the recess of the above first signal line 01 adjacent to the data connection structure DL1, for example, the portion of the first signal line 01 electrically connected to the electrostatic discharge semiconductor layer in FIG. 7A is a portion of the recess.

Referring to FIG. 7A and FIG. 7E, for example, the sub electrostatic discharge unit SEU further includes a first connection structure 201 and a second connection structure 202. The first connecting structure 201 and the second connecting structure 202 are located in the second conductive layer 120. The first end of the first connection structure 201 in the first direction D1 is connected to the first conductor C1 through a third via V3, and the second end of the first connection structure 201 in the first direction D1 is connected to the first active layer T01a through a fourth via V4, thereby achieving the electrical connection between the second electrode Told of the first electrostatic discharge transistor T01 and the first conductor C1. The first end of the second connection structure 202 in the first direction D1 is connected to the main body portion CM of the second conductor C2 through a fifth via V5, and the second end of the second connection structure 202 in the first direction D1 is connected to the second active layer T02a through a sixth via V6, thereby achieving the connection between the gate electrode T02g and the second electrode of the second electrostatic discharge transistor T02 and the second conductor C2.

Referring to FIG. 7D and FIG. 7F, for example, the display panel 10 further includes a first insulation layer GI1 between the semiconductor layer ACT and the first conductive layer 110, a second insulation layer GI2 between the first conductive layer 110 and the second conductive layer 120, and an interlayer insulation layer ILD; the first via V1 penetrates through the second insulation layer GI2 and interlayer insulation layer ILD, the second via V2 penetrates through the first insulation layer GI1, the second insulation layer GI2 and interlayer insulation layer ILD, the third via V3 penetrates through the second insulation layer GI2 and interlayer insulation layer ILD, the fourth via V4 penetrates through the first insulation layer GI1, the second insulation layer GI2 and interlayer insulation layer ILD, the fifth via V5 penetrates through the second insulation layer GI2 and interlayer insulation layer ILD, and the sixth via V6 penetrates through the first insulation layer GI1, the second insulation layer GI2 and interlayer insulation layer ILD.

Referring to FIG. 7F, the display substrate 10 further includes a buffer layer Buffer on the base substrate 200, and the semiconductor layer ACT is on the buffer layer Buffer. The buffer layer Buffer can prevent contamination and damage to the base substrate 200 during the manufacture process, and make other structures formed thereon purer and smoother.

In the display substrate 10 provided by the embodiments of the present disclosure, for example, the base substrate 200 may be a rigid substrate, such as a glass substrate, a silicon substrate, etc., or may be formed from a flexible material with excellent heat resistance and durability, such as polyimide (PI), polycarbonate (PC), polyethylene terephthalate (PET), polyethylene, polyacrylate, polyarylic compounds, polyetherimide, polyethersulfone, polyethyleneterephthalate (PET), polyethylene (PE), polypropylene (PP), polysulfone (PSF), polymethyl methacrylate (PMMA), cellulose acetate (TAC), cyclic olefin polymer (COP), cyclic olefin copolymer (COC), and the like.

For example, the material of the semiconductor layer ACT includes but is not limited to silicon based materials (amorphous silicon a-Si, polycrystalline silicon p-Si, etc.), metal oxide semiconductors (IGZO, ZnO, AZO, IZTO, etc.), and organic materials (hexathiophene, polythiophene, etc.).

For example, the materials of the first conductive layer and the second conductive layer may include gold (Au), silver (Ag), copper (Cu), aluminum (Al), molybdenum (Mo), magnesium (Mg), tungsten (W), or alloy materials composed of the above metals; or transparent conductive metal oxide materials, such as indium tin oxide (ITO), indium zinc oxide (IZO), zinc oxide (ZnO), zinc aluminum oxide (AZO), etc.

For example, the first insulation layer GI1, the second insulation layer GI2, and the interlayer insulation layer ILD are inorganic insulation layers, and their materials include at least one of oxide of silicon, nitride of silicon, and nitrogen oxide of silicon, such as silicon oxide, silicon nitride, or silicon nitrogen oxide, or include insulation materials including metal nitrogen oxide, such as aluminum oxide, titanium nitride, or the like. However, the embodiments of the present disclosure are not limited in this aspect.

Figure 8:
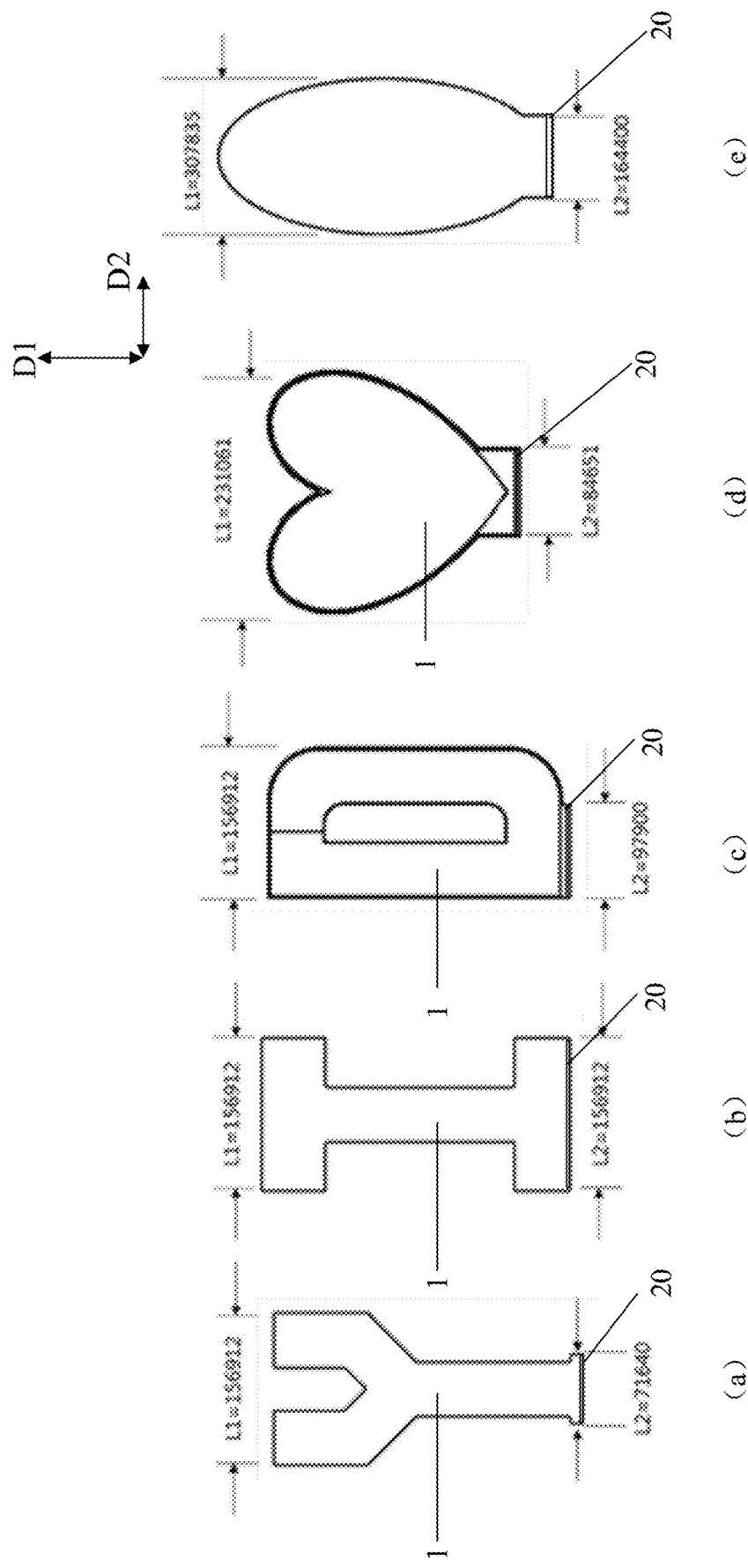
FIG. 8 is a schematic diagram of several special-shaped display panels including electrostatic discharge units provided by embodiments of the present disclosure.

FIG. 8 is a schematic diagram of several special-shaped display panels including electrostatic discharge units provided by embodiments of the present disclosure. For example, as shown in (a) of FIG. 8, the planar shape of the display panel provided by the embodiments of the present disclosure is Y-shaped, with a Y-shaped display region 1, and the electrostatic discharge region 20 is located at the bottom edge of the Y-shaped display panel. The maximum width L1 of the Y-shaped display panel in the second direction D2 is greater than the width L2 of the non-display region that can be used to be provided with the electrostatic discharge region 20 at the bottom of the Y-shaped display panel in the second direction D2. For example, L1=156912 μm. L2=71640 μm. L2/L1=0.46. The ratio of L2 to L1 is less than 0.5, which means that the size of the bottom space available for setting the electrostatic discharge region in the second direction is much smaller than the size of the space crossed by the display region in the second direction. Therefore, for example, for various irregular display panels, especially for display panels with a ratio of L2 to L1 less than 0.5, because the width of the space available for setting the electrostatic discharge region in the second direction D2 is small to a certain extent, it is necessary to significantly reduce the total width of the plurality of electrostatic discharge units ESD in the second direction D2.

Figure 9A:
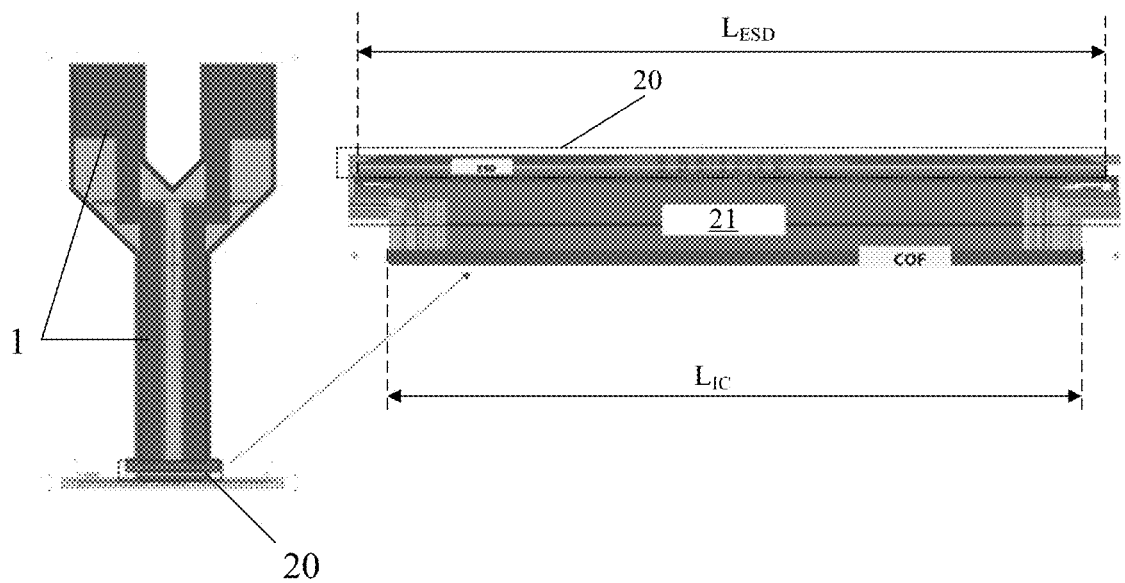
FIG. 9A is a schematic diagram of a Y-shaped display panel provided by embodiments of the present disclosure.
Figure 9B:
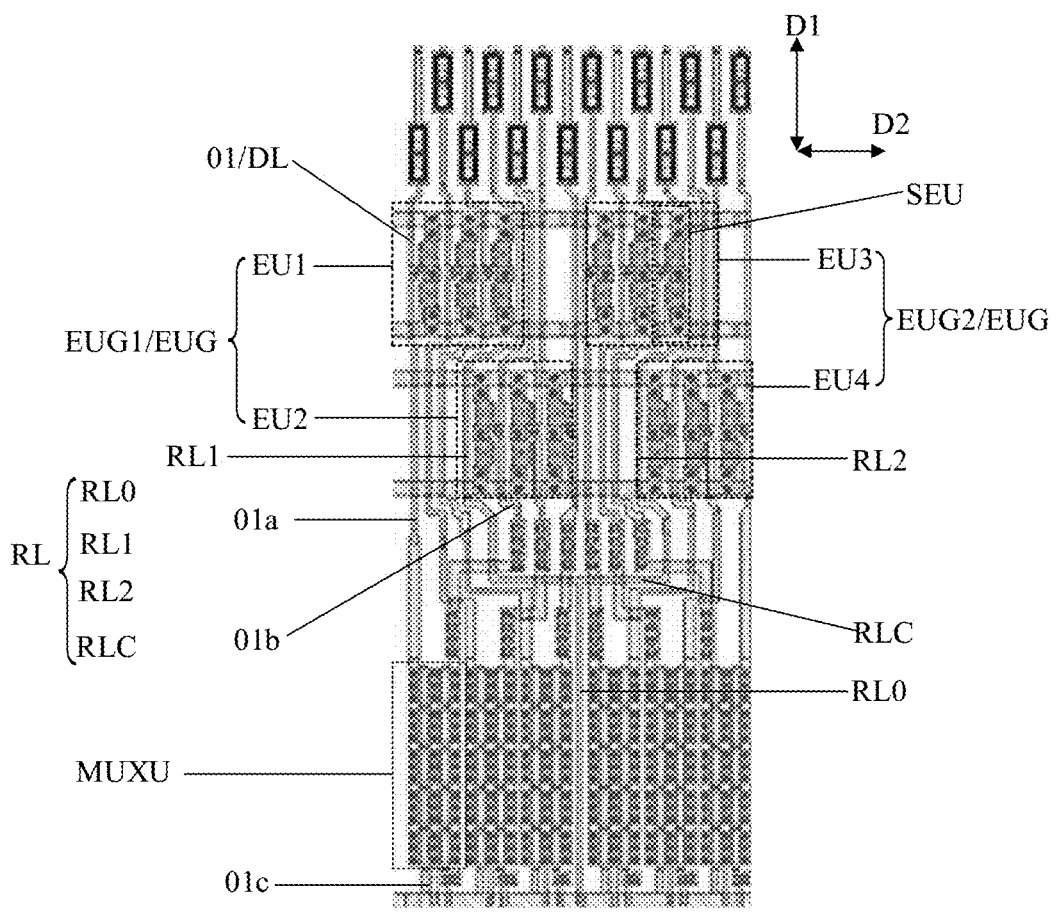
FIG. 9B is a planar schematic diagram of a part of a Y-shaped display panel including an electrostatic discharge region and a lead region.
Figure 9C:
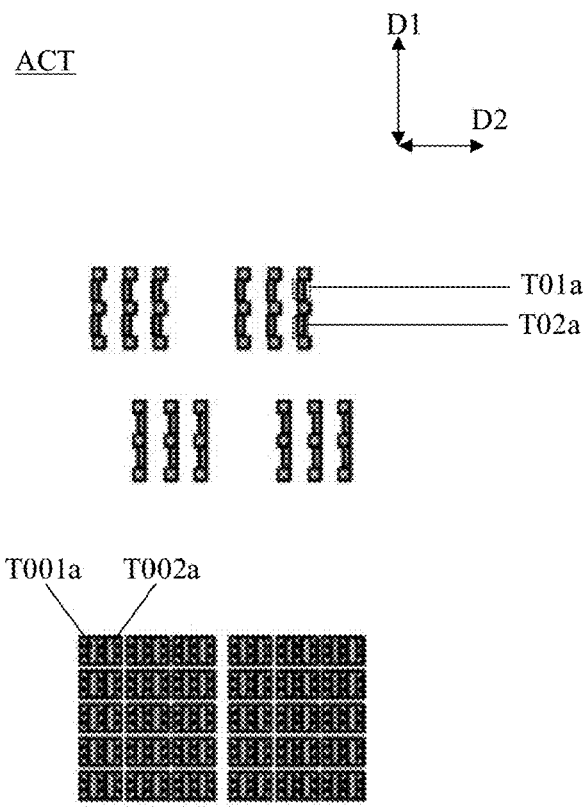
FIG. 9C is a schematic diagram of a semiconductor layer of the part shown in FIG. 9B.
Figure 9D:
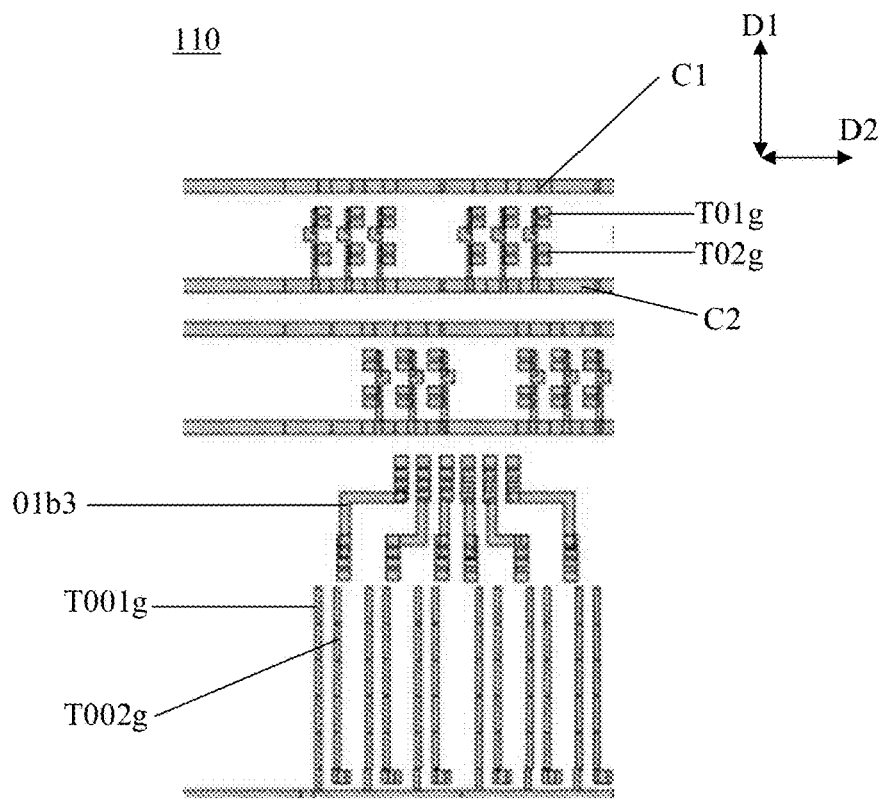
FIG. 9D is a schematic diagram of a first conductive layer of the part shown in FIG. 9B.
Figure 9E:
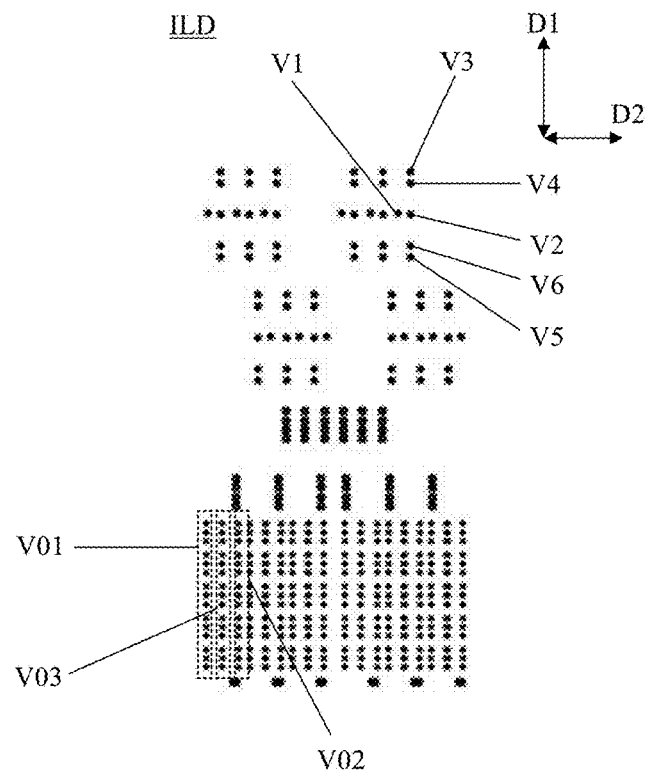
FIG. 9E is a schematic diagram of an interlayer insulation layer of the part shown in FIG. 9B.
Figure 9F:
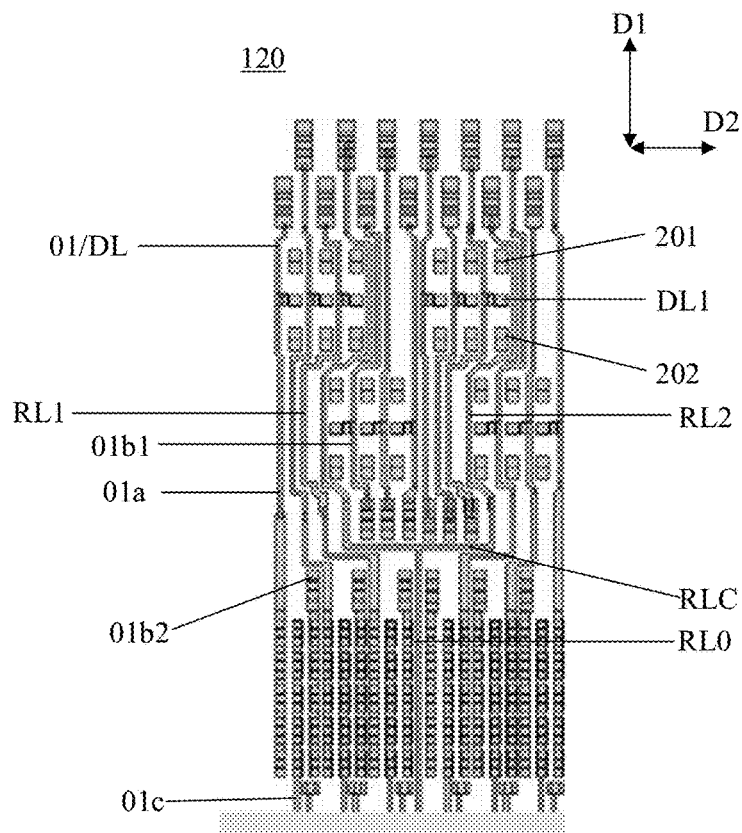
FIG. 9F is a schematic diagram of a second conductive layer of the part shown in FIG. 9B.

FIG. 9A is a schematic diagram of a Y-shaped display panel provided by embodiments of the present disclosure; FIG. 9B is planar schematic diagram of a part of a Y-shaped display panel including an electrostatic discharge region and a lead region; FIG. 9C is a schematic diagram of a semiconductor layer of the part shown in FIG. 9B; FIG. 9D is a schematic diagram of a first conductive layer of the part shown in FIG. 9B; FIG. 9E is a schematic diagram of an interlayer insulation layer of the part shown in FIG. 9B; and FIG. 9F is a schematic diagram of a second conductive layer of the part shown in FIG. 9B.

The embodiment shown in FIG. 9B adopts the arrangement mode of the electrostatic discharge unit shown in FIG. 4A. The arrangement mode of the adjacent first electrostatic discharge unit group EUG1 and the second electrostatic discharge unit group EUG2 was shown. For example, in the embodiment shown in FIG. 9B, M is equal to 1, N is equal to 2, and Q is equal to 3.

Referring to FIG. 2 and FIG. 9A, for example, the width $L_{IC}$ of the region where the driving circuit IC is located (that is, the space occupied by the driving circuit IC) in the second direction D2 is smaller than the width $L_{ESD}$ of the electrostatic discharge region 20 in the second direction D2. Therefore, referring to FIG. 2 and FIG. 9B, for example, the first end of the data selection unit MUXU close to the electrostatic discharge region 20 is electrically connected to R data lines DL, and the second end of the data selection unit MUXU away from the electrostatic discharge region 20 is electrically connected to S data lead lines, in which S and R are both positive integers and S is smaller than R. The S data lead lines are electrically connected to the driving circuit, and the first display signal, namely the data signal Vd, is provided to the S data lead lines through the driving circuit. In this way, the number of data lead lines can be reduced, thereby reducing the total width required for the plurality of data lead lines in the second direction D2, so as to adapt to the situation where the width $L_{IC}$ of the region where the driving circuit IC is located in the second direction D2 is relatively small compared to the width $L_{ESD}$ of the electrostatic discharge region 20 in the second direction D2.

For example, referring to FIG. 9B, R=2, S=1, that is, the first end of the data selection unit MUXU close to the electrostatic discharge region 20 is electrically connected to two data lines DL, the two data lines are a first data line 01a and a second data line 01b, respectively, and the second end of the data selection unit MUXU away from the electrostatic discharge region 20 is electrically connected to one data lead line 01c. Referring to FIG. 4B and FIG. 9B, for example, the first data line 01a is electrically connected to the first sub electrostatic discharge unit S1a in the first electrostatic discharge unit EU1, and the second data line 01b is electrically connected to the first sub electrostatic discharge unit S1b in the second electrostatic discharge unit EU2. For example, the three sub electrostatic discharge units S1a/S2a/S3a of the first electrostatic discharge unit EU1 respectively provide data signals Vd to the three sub-pixels in the same pixel in the display region 1, such as providing data signals Vd to the three sub-pixels of red, green, and blue. That is, the first end of the data selection unit MUXU close to the electrostatic discharge region 20 is electrically connected to two data lines DL, and the two data lines DL are electrically connected to two sub-pixels of the same color of two adjacent pixels to provide the data signal Vd to the two sub-pixels of the same color; the second end of the data selection unit MUXU away from the electrostatic discharge region 20 is electrically connected to one data lead line 01c. Of course, R is not limited to being equal to 2, S is not limited to being equal to 1, preferably, R is equal to 2 and S is equal to 1. In this way, while reducing the number of the plurality of data lead lines connected to the driving circuit IC, because the value of R is not particularly large, it will not cause too many data lines to share the same one data selection circuit, and because the same data selection unit MUXU is connected to the data lines that provide data signals to the plurality of sub-pixels of the same color, it is relatively easy to control the selection of data signals, which has little impact on the display effect, moreover, because the sub-pixels of the same color are adjacent and the value of R is not particularly large, the layout mode of these signal wires is simpler and the manufacture difficulty thereof is lower.

Referring to FIG. 9B, FIG. 9D, and FIG. 9F, for example, the second data line 01b may be connected across layers, the second data line 01b includes a first part 01b1, a second part 01b2, and a third part 01b3. Referring to FIG. 9F, the first part 01b1 and the second part 01b2 are located in the second conductive layer 120, the third part 01b3 is located in the first conductive layer 110, and the first end of the third part 01b3 is electrically connected to the first part 01b1 through a via, the second end of the third part 01b3 is electrically connected to the second part 01b2 through a via, because there is very little space available for setting the electrostatic discharge units and the driving circuit IC in this irregular screen, in this way, the plurality of data lines DL connected to the plurality of data selection units MUXU can be arranged in the limited space.

Figure 10:
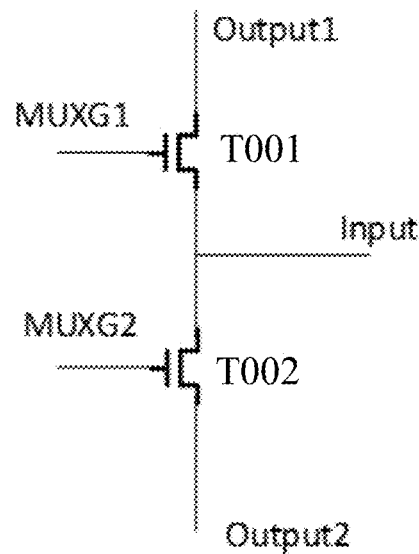
FIG. 10 is a schematic diagram of a data selection circuit of a display panel provided by embodiments of the present disclosure.
Figure 11:
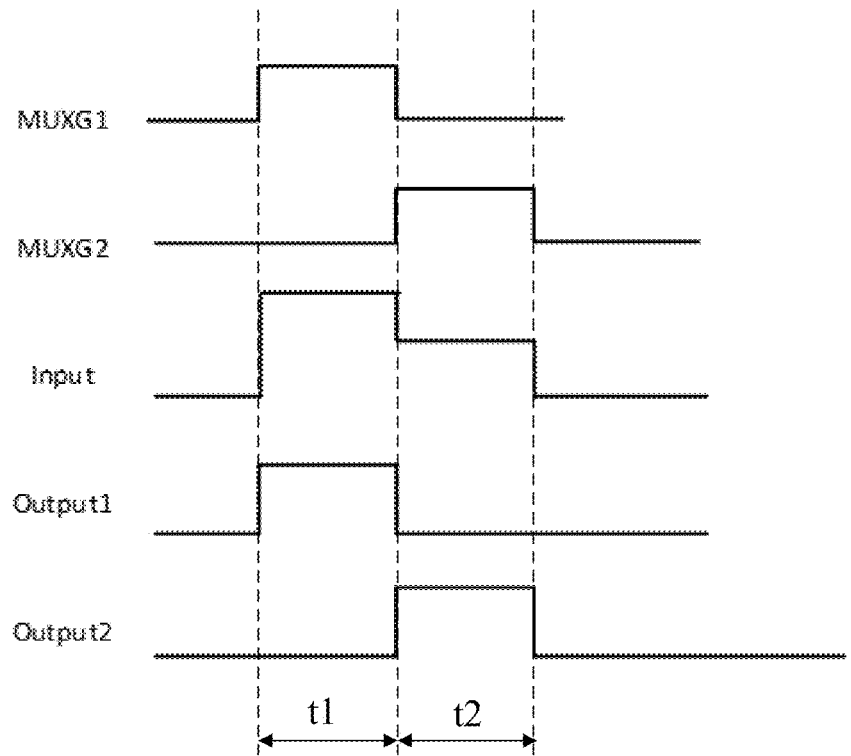
FIG. 11 is a work timing diagram of the data selection circuit shown in FIG. 10.

In the following, the structure of a data selection unit MUXU is introduced. FIG. 10 is a schematic diagram of a data selection circuit of a display panel provided by embodiments of the present disclosure; FIG. 11 is a work timing diagram of the data selection circuit shown in FIG. 10; and FIG. 12A is a structural planar diagram of a data selection unit of a display panel provided by embodiments of the present disclosure.

Figure 12A:
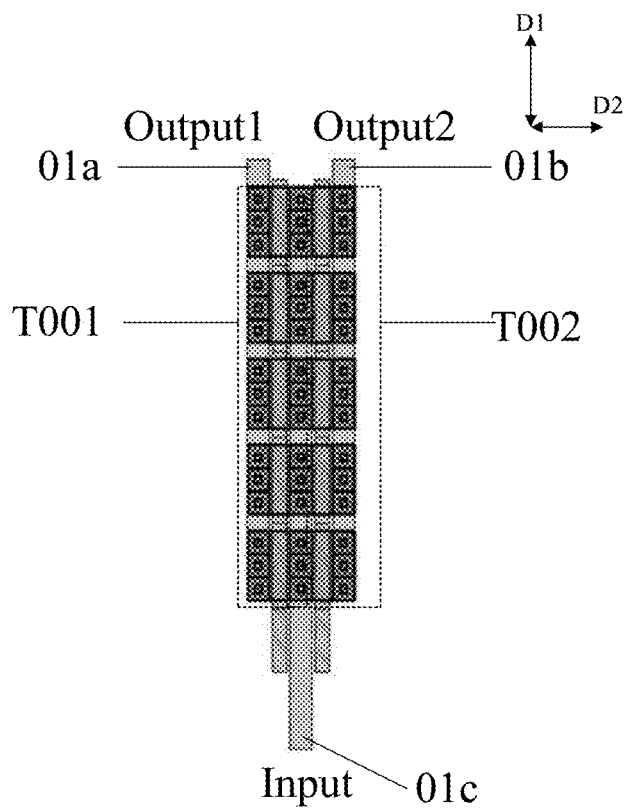
FIG. 12A is a structural planar diagram of a data selection unit of a display panel provided by embodiments of the present disclosure.

Referring to FIG. 10 and FIG. 12A, the data selection unit MUXU includes a data selection circuit, the data selection circuit includes a first data selection transistor T001 and a second data selection transistor T002. The gate electrode of the first data selection transistor T001 is electrically connected to a first data terminal to receive a first data driving signal MUXG1 from the first data terminal; the gate electrode of the second data selection transistor T002 is electrically connected to a second data terminal to receive a second data driving signal MUXG2 from the second data terminal. The first electrode of the first data selection transistor T001 is electrically connected to the first data line 01a to output a first output signal Output1 to the first data line 01a, and the first electrode of the second data selection transistor T002 is electrically connected to the second data line 01b to output a second output signal Output2 to the second data line 01b. The second electrode of the first data selection transistor T001 is electrically connected to the second electrode of the second data selection transistor T002, and is electrically connected to the data lead line 01c to receive the input data signal Input from the data lead line 01c.

Taking the case that the first data selection transistor T001 and the second data selection transistor T002 both are N-type transistors as an example, the working process of the data selection circuit is introduced. Referring to FIGS. 10-11, in a first stage t1, the first data driving signal MUXG1 is at a high level and the second data driving signal MUXG2 is at a low level, so that the first data selection transistor T001 is turned on and the second data selection transistor T002 is turned off; it this case, the input data signal Input is the first data signal, and the first data signal Output1 as the input data signal Input is transmitted to the first data line 01a through the first data selection transistor T001, and then provided to the corresponding sub-pixel through the first data line Ola. In a second stage t2, the first data driving signal MUXG1 is at a low level and the second data driving signal MUXG2 is at a high level, so that the first data selection transistor T001 is turned off and the second data selection transistor T002 is turned on; it this case, the input data signal Input is a second data signal different from the first data signal, and the second data signal as the second output signal Output2 is transmitted to the second data line 01b through the second data selection transistor T002, and then provided to the corresponding sub-pixel through the second data line 01b.

Figure 12B:
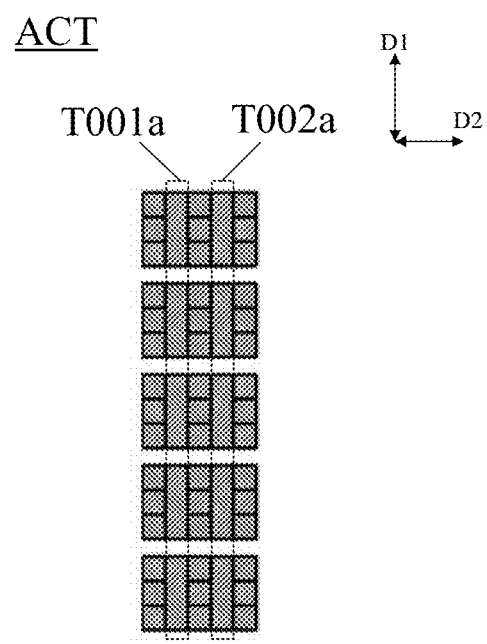
FIG. 12B is a schematic diagram of a semiconductor layer of the data selection unit shown in FIG. 12A.
Figure 12C:
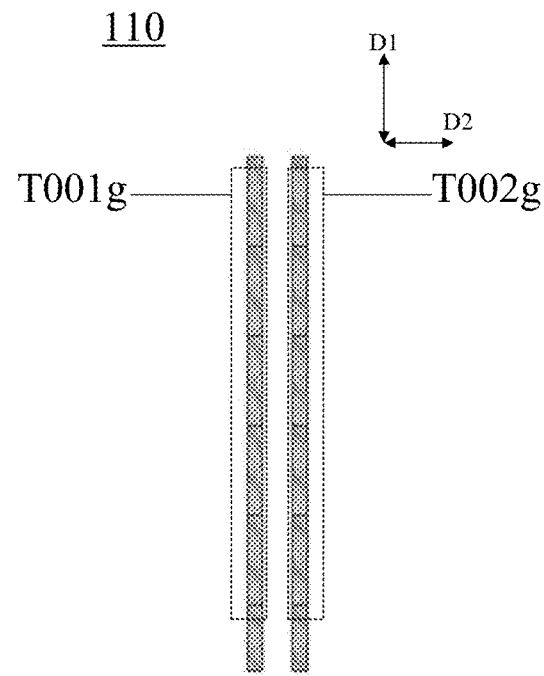
FIG. 12C is a schematic diagram of a first conductive layer of the data selection unit shown in FIG. 12A.
Figure 12D:
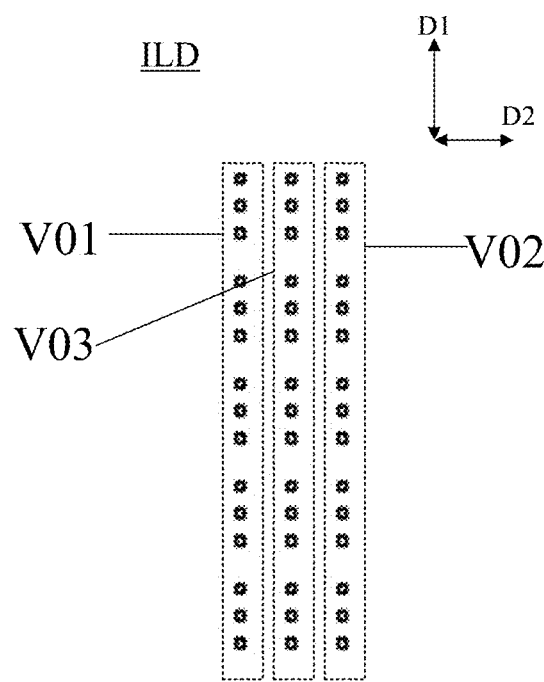
FIG. 12D is a schematic diagram of an interlayer insulation layer of the data selection unit shown in FIG. 12A.
Figure 12E:
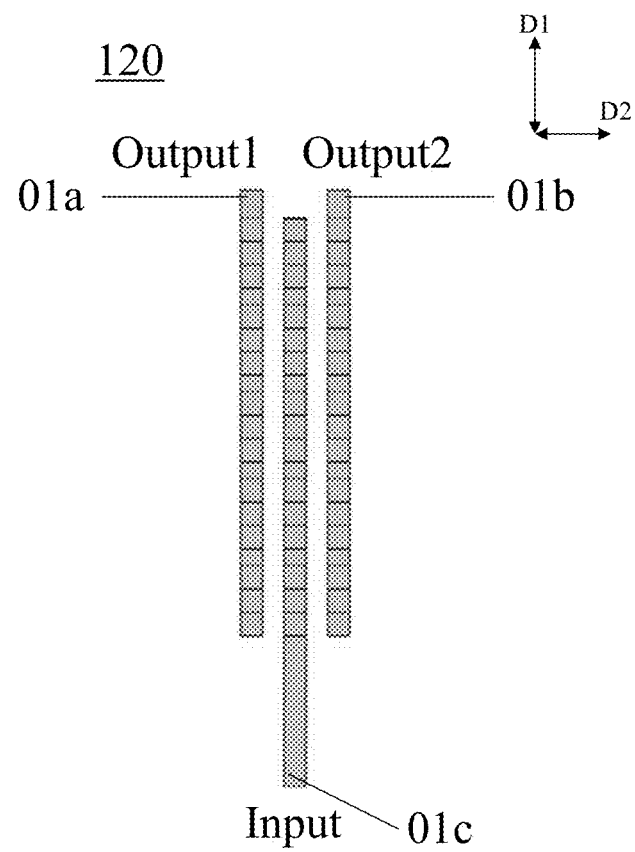
FIG. 12E is a schematic diagram of a second conductive layer of the data selection unit shown in FIG. 12A.

FIG. 12B shows the active layer TO01a of the first data selection transistor T001 and the active layer TO02a of the second data selection transistor T002. For example, the active layer T001a and active layer T002a respectively include a plurality of islands arranged in the first direction D1. FIG. 12C shows the gate electrode T001g of the first data selection transistor T001 and the gate electrode T002g of the second data selection transistor T002. Referring to FIGS. 12D-12E, the first data line Ola is electrically connected to the active layer T001a of the first data selection transistor TO01 through a first group of vias V01, the second data line 01b is electrically connected to the active layer T002a of the second data selection transistor T002 through the second group of vias V02, and the data lead line 01c is electrically connected to the active layer TO01a and the active layer TO02a through the third group of vias V03. For example, for each island, the part of the active layer T001a and the part of the T002a included by the each island constitute a continuous and integral structure. The structure of the plurality of islands arranged in the first direction D1 is conducive to increasing the width-length ratios of the first data selection transistor T001 and the second data selection transistor T002, improving the performance of the transistor, and reducing the width of the plurality of data selection units in the second direction D2, meeting the requirements of the too limited width of the region for setting the plurality of data selection in the second direction D2.

Referring to FIG. 9B and FIG. 9F, for example, display panel 10 further includes a reset voltage line RL and a reset voltage lead line RL0. For example, the reset voltage line RL and the reset voltage lead line RL0 are both in the second conductive layer 120, and in the same layer as the data line DL. The reset voltage line RL is configured to provide a reset voltage signal to the sub-pixel 100, and includes lead portions RL1/RL2 in the non-display region; the first lead portion RL1 is between two adjacent electrostatic discharge units EU1 and EU2 and extends in the first direction D1, and adjacent J lead portions are electrically connected through a reset connection line RLC extending in the second direction D2. For example, in the embodiment shown in FIG. 9B, J=2, that is, the adjacent first lead portion RL1 and the second lead portion RL2 are electrically connected by the reset connection line RLC extending in the second direction D2. The first end of the reset voltage lead line RL0 is electrically connected to the reset connection line RLC, and the second end of the reset voltage lead line RL0 is electrically connected to the driving circuit IC, and the driving circuit IC is configured to provide the reset voltage signal. For example, the reset voltage signal includes the first reset voltage Vinit1 and the first reset voltage Vinit2 provided to the pixel circuit. The first reset voltage Vinit1 and the first reset voltage Vinit2 may be the same, both of which are provided by the driving circuit IC through the reset voltage line RL.

In another embodiment, for example, as shown in (d) of FIG. 8, the planar shape of the display panel provided by the embodiments of the present disclosure is heart-shaped, having a heart-shaped display region 1, and the electrostatic discharge region 20 is located at the bottom edge of the heart-shaped display panel. The maximum width L1 of the heart shaped display panel in the second direction D2 is greater than the width L2, in the second direction D2, of the non-display region at the bottom of the heart shaped display panel that can be used to be provided with the electrostatic discharge region 20. For example, L1=231061 µm, L2=84651 µm, and L2/L1=0.37. This means that the size of the bottom space available for setting the electrostatic discharge region in the second direction is much smaller than the size of the space crossed by the display region in the second direction, and even the value of L2/L1 is smaller than the value of L2/L1 in the Y-shaped display panel. Therefore, for example, for this heteromorphic display panel, the width of the space available for setting the electrostatic discharge region in the second direction D2 is small to a certain extent, thus, it is necessary to significantly reduce the total width of the plurality of electrostatic discharge units ESD in the second direction D2.

Figure 13A:
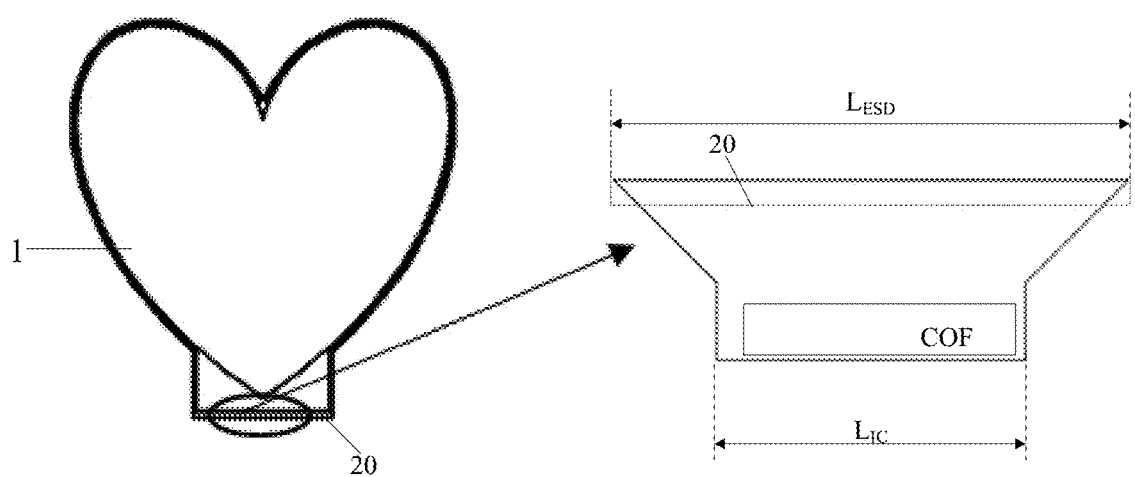
FIG. 13A is a schematic diagram of a heart-shaped display panel provided by embodiments of the present disclosure.
Figure 13B:
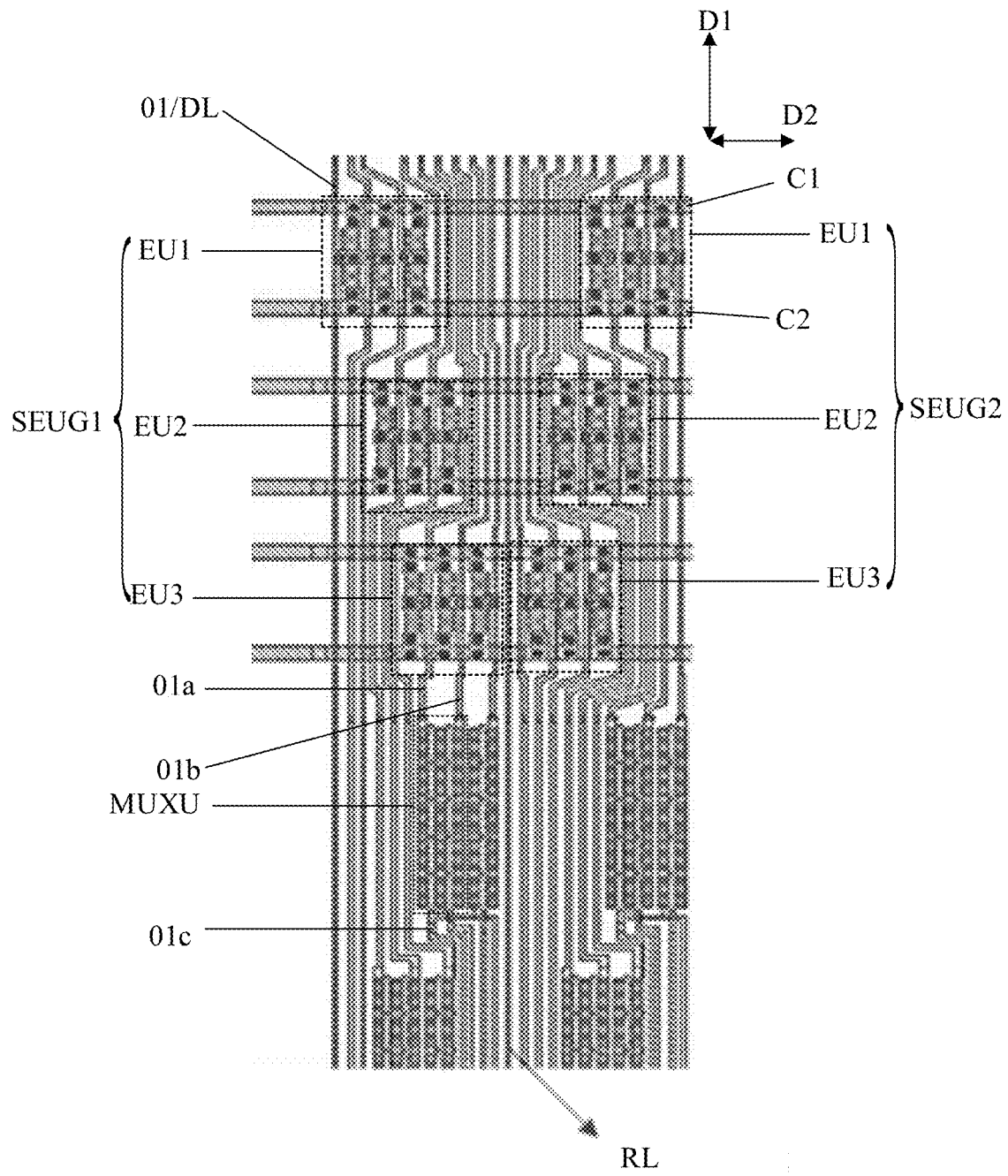
FIG. 13B is a partial planar schematic diagram of a heart-shaped display panel including an electrostatic discharge region and a lead region.

FIG. 13A is a schematic diagram of a heart-shaped display panel provided by embodiments of the present disclosure; and FIG. 13B is a partial planar schematic diagram of a part of a heart-shaped display panel including an electrostatic discharge region and a lead region.

Referring to FIG. 2 and FIG. 13A, for example, the width $L_{IC}$ of the region where the driving circuit IC is located (that is, the space occupied by the driving circuit IC) in the second direction D2 is smaller than the width $L_{ESD}$ of the electrostatic discharge region 20 in the second direction D2. For example, $L_{ESD}$=70560 μm, $L_{IC}$=47864 μm. Therefore, the design of the data selection circuit and the reset voltage lead line can also refer to the design of the embodiment shown in FIG. 9B.

The embodiment shown in FIG. 13B adopts the arrangement mode of the electrostatic discharge unit shown in FIG. 4D. FIG. 13B shows one electrostatic discharge unit group EUG including adjacent first sub electrostatic discharge unit group SEUG1 and second sub electrostatic discharge unit group SEUG2.

Setting the pitch of a pixel as δ, and therefore the border width L-borders on both sides+resolution*δ. For example, the resolution of the heart shaped display panel is 1440*1440, according to the arrangement of two groups of ESD units in the vertical direction, namely M=1, N=2, Q=3, six sub electrostatic discharge units form one electrostatic discharge group EUG, and the total width of one electrostatic discharge group EUG in the second direction is 129.5 μm, so the space required for the total ESD units=[(3*1440)/6]*129.5=93528 μm, but the bottom space of the heart-shaped display panel is only 84651 μm, obviously the space is not enough. Therefore, the arrangement mode of the electrostatic discharge units in the heart-shaped display panel needs to adopt the arrangement of vertical staggered three sub electrostatic discharge unit groups shown in FIG. 13B, namely M=2, N=3, Q=3, and 18 sub electrostatic discharge units constitute one electrostatic discharge group EUG, the width in the second direction D2 of one electrostatic discharge group EUG is 294 μm, and the total width in the second direction D2 of all electrostatic discharge units required for the heart-shaped display panel is equal to [(3*1440)/18]*294=70560 μm. Compared to the Y-shaped display panel, this design can further reduce the total width of all the electrostatic discharge units in the second direction, while meeting the requirements of higher PPI, it can also meet the requirement in which the smaller L2/L1 value in the heart-shaped display panel requires a smaller total width of all the electrostatic discharge units in the second direction.

The other structures shown in FIG. 13B, such as the structures of each sub electrostatic discharge unit, data selection circuit, etc., can be referred to the description of the embodiment shown in FIG. 9B.

In another embodiment, for example, as shown in (c) of FIG. 8, the planar shape of the display panel provided by the embodiments of the present disclosure is D-shaped, and the electrostatic discharge region 20 is located at the bottom edge of the D-shaped display panel. The maximum width L1 of the D-shaped display panel in the second direction D2 is greater than the width L2 of the non-display region at the bottom of the D-shaped display panel that can be used to set the electrostatic discharge region 20 in the second direction D2. For example, L1=156912 μm, L2=97900 μm, and L2/L1=0.62.

Figure 14A:
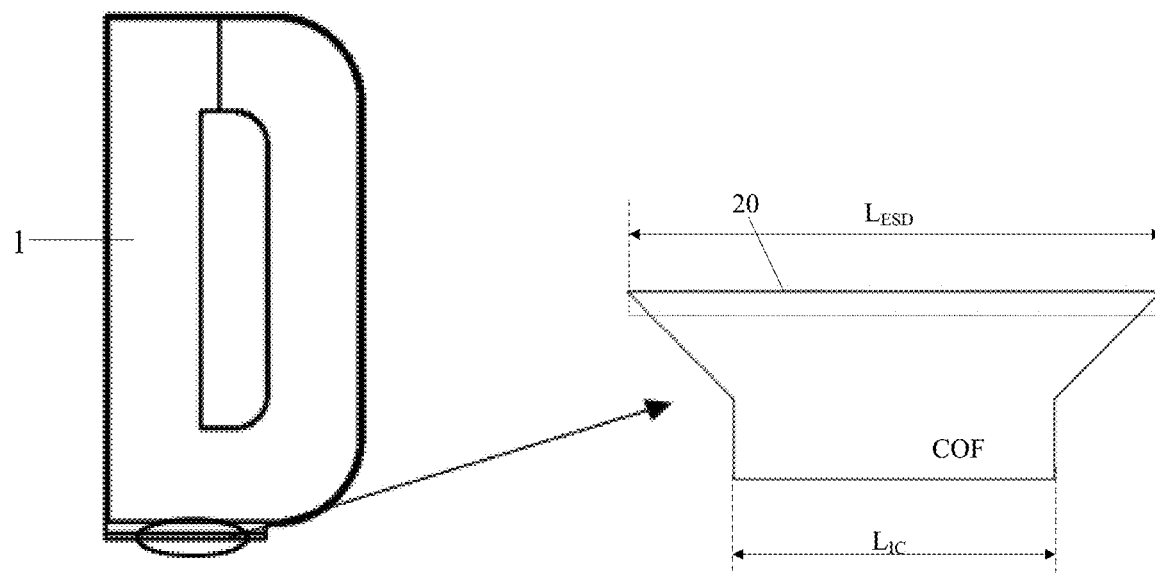
FIG. 14A is a schematic diagram of a D-shaped display panel provided by embodiments of the present disclosure.
Figure 14B:
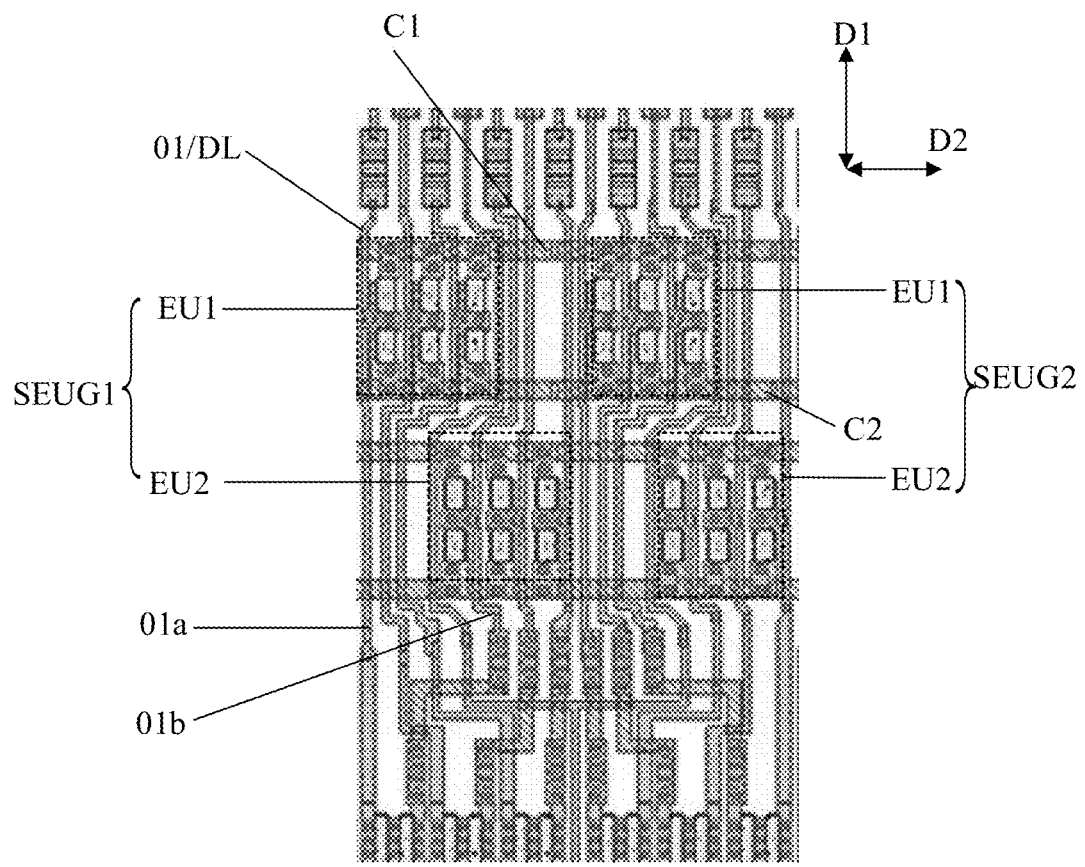
FIG. 14B is a planar schematic diagram of a part of a D-shaped display panel including an electrostatic discharge region and a lead region.

FIG. 14A is a schematic diagram of a D-shaped display panel provided by embodiments of the present disclosure; and FIG. 14B is a planar schematic diagram of a part of a D-shaped display panel including an electrostatic discharge region and a lead region.

For example, the embodiment shown in FIG. 14B adopts the arrangement of the electrostatic discharge unit shown in FIG. 4A. FIG. 14B shows one electrostatic discharge unit group EUG composed of adjacent first sub electrostatic discharge unit group SEUG1 and second sub electrostatic discharge unit group SEUG2. For example, in the embodiment shown in FIG. 14B, for example, the resolution of the D-shaped display panel is 960*1920. According to the arrangement of two groups of ESD units staggered in the vertical direction, namely M=1, N=2, and Q=3, six electrostatic discharge units constitute one electrostatic discharge group EUG, and the total width of one electrostatic discharge group EUG in the second direction is 129.5 μm. Therefore, the total width required for all electrostatic discharge units of the D-shaped display panel in the second direction is equal to [(3*960)/6]*129.5=62160 μm, it can be seen that the arrangement of the two groups of ESD units staggered in the vertical direction can meet requirement of the D-shaped display panel, and the electrostatic discharge units of the Y-shaped display panel have the same space requirement as the D-shaped display panel. The embodiment shown in FIG. 14B is similar to the case of the Y-shaped display panel, and this design can also reduce the total width of all the electrostatic discharge units in the second direction, meeting the requirement of the smaller value of L2/L1 in the heart-shaped display panel for the smaller total width of all electrostatic discharge units in the second direction. Of course, the arrangement of electrostatic discharge units shown in FIG. 4C or FIG. 4D can also be used to further reduce the total width of all the electrostatic discharge units in the second direction. The other structures shown in FIG. 14B, such as the structure of each sub electrostatic discharge unit, data selection circuit, etc., can be referred to the description of the embodiment shown in FIG. 9B.

In another embodiment, for example, as shown in (e) of FIG. 8, the planar shape of the display panel provided by the embodiments of the present disclosure is O-shaped, and the electrostatic discharge region 20 is located at the bottom edge of the O-shaped display panel. The maximum width L1 of the O-shaped display panel in the second direction D2 is greater than the width L2 of the non-display region at the bottom of the O-shaped display panel that can be used to set the electrostatic discharge region 20 in the second direction D2. For example, L1=307835 μm, L2=164400 μm, and L2/L1=0.53.

Figure 15A:
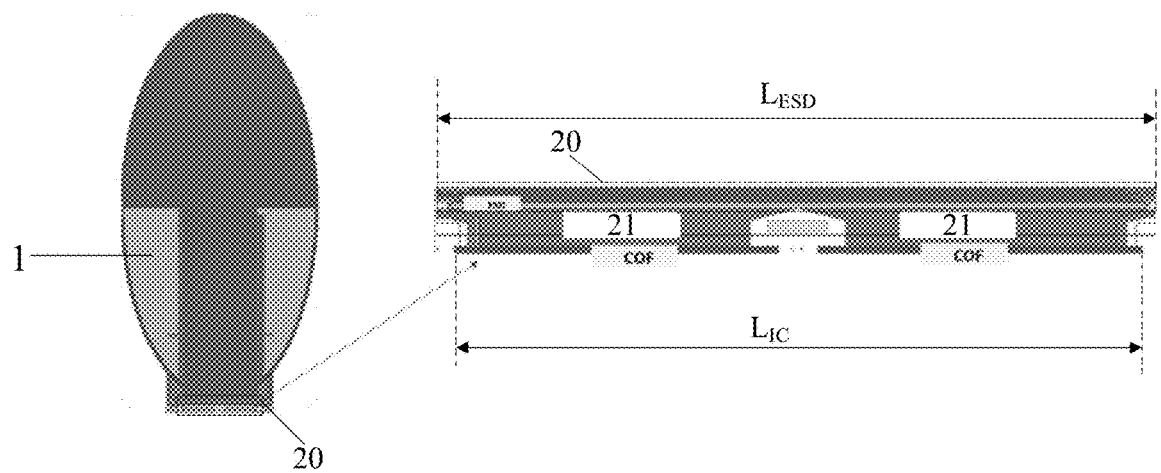
FIG. 15A is a schematic diagram of a O-shaped display panel provided by embodiments of the present disclosure.
Figure 15B:
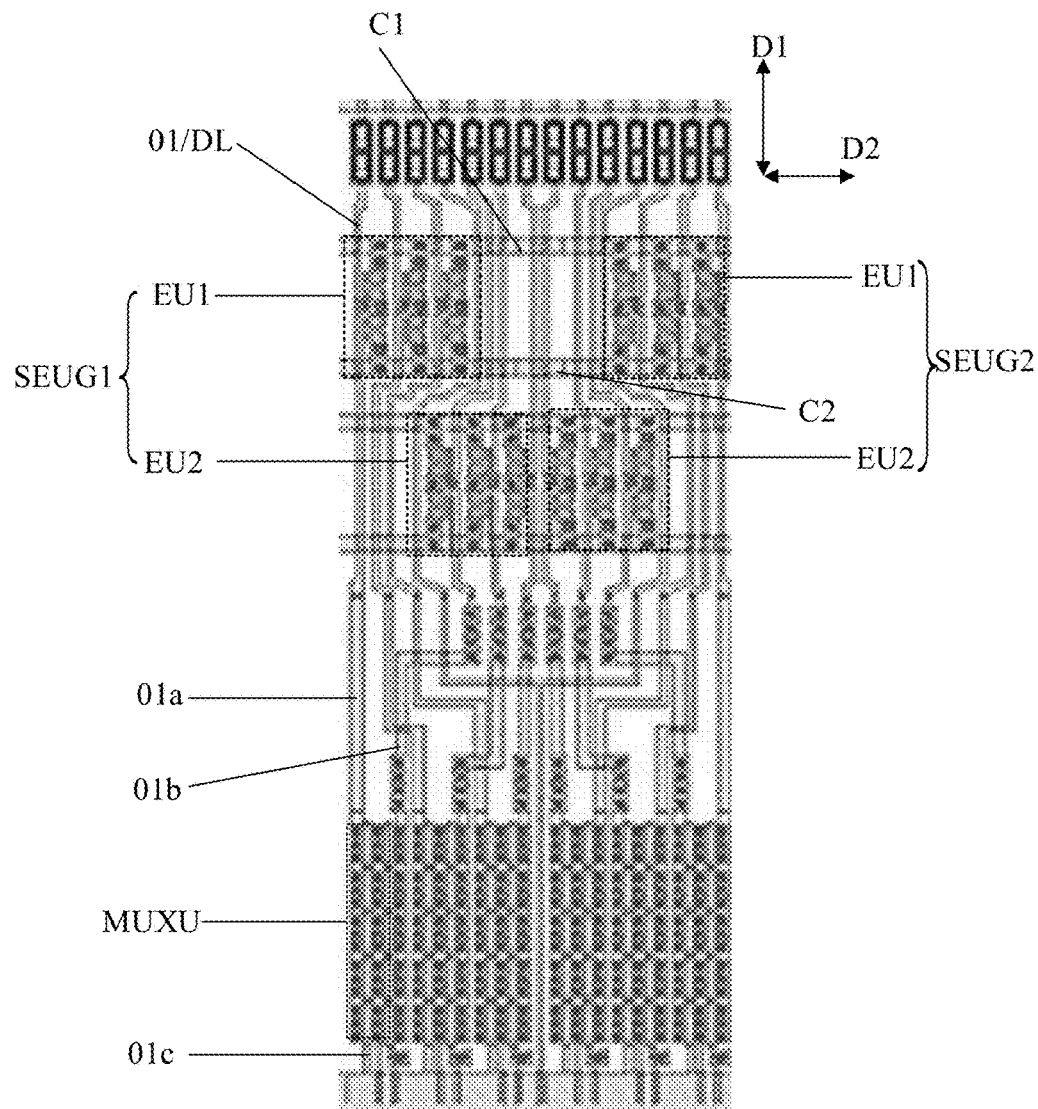
FIG. 15B is a planar schematic diagram of a part of an O-shaped display panel including an electrostatic discharge region and a lead region.

FIG. 15A is a schematic diagram of a O-shaped display panel provided by embodiments of the present disclosure; and FIG. 15B is a planar schematic diagram of a part of an O-shaped display panel including an electrostatic discharge region and a lead region.

Referring to FIG. 15A, for example, the resolution of the O-shaped display panel is 1920*3840, which is relatively high. Therefore, the O-shaped display panel has two COFs, and the total width required for all electrostatic discharge units in the second direction D2 is twice that for setting one COF. It is also necessary to minimize the total width of each electrostatic discharge unit group and all electrostatic discharge units in the second direction D2 as much as possible.

The embodiment shown in FIG. 15B adopts the arrangement of the electrostatic discharge unit shown in FIG. 4C. FIG. 15B shows one electrostatic discharge unit group EUG composed of first sub electrostatic discharge unit group SEUG1 and second sub electrostatic discharge unit group SEUG2 that are adjacent to each other. For example, in the embodiment shown in FIG. 15B, the total width required for all the electrostatic discharge units of the O-shaped display panel in the second direction D2 is twice that of the D-shaped display panel, that is, M=2, N=2, and Q=3, and 12 electrostatic discharge units constitute electrostatic discharge group EUG. Therefore, the total width required for all electrostatic discharge units of the O-shaped display panel in the second direction D2 is 2*[(3*960)/6] *129.5=124320 μm, similar to the Y-shaped display panel, this design can also reduce the total width of all the electrostatic discharge units in the second direction, meeting the requirement in which the smaller value of L2/L1 in the heart-shaped display panel requires a smaller total width of all electrostatic discharge units in the second direction. Of course, the arrangement of electrostatic discharge units shown in FIG. 4D can also be used to further reduce the total width of all the electrostatic discharge units in the second direction. The other structures shown in FIG. 15B, such as the structures of each sub electrostatic discharge unit, data selection circuit, etc., can be referred to the description of the embodiment shown in FIG. 9B.

In another embodiment, for example, as shown in (b) of FIG. 8, the planar shape of the display panel provided by the embodiments of the present disclosure is I-shaped, and the electrostatic discharge region 20 is located at the bottom edge of the I-shaped display panel.

Figure 16A:
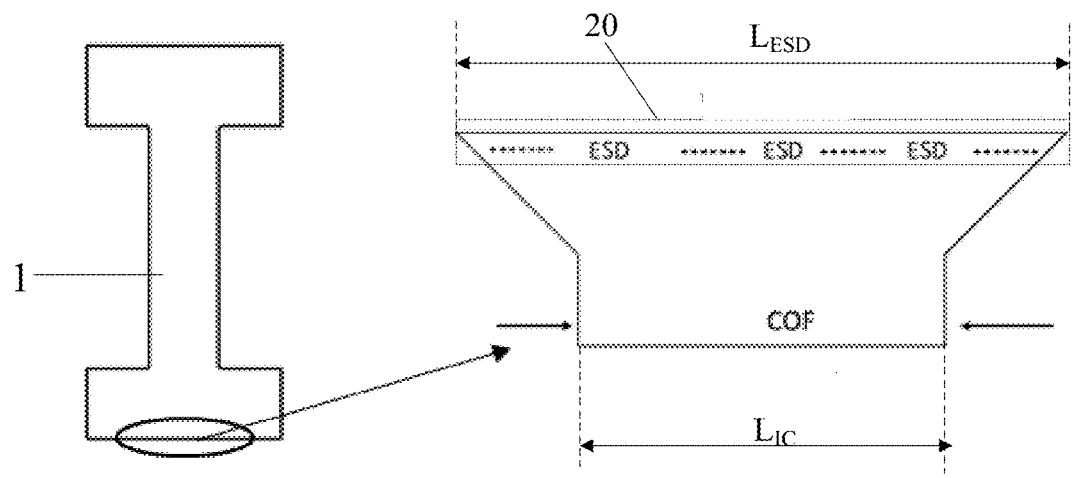
FIG. 16A is a schematic diagram of a I-shaped display panel provided by embodiments of the present disclosure.
Figure 16B:
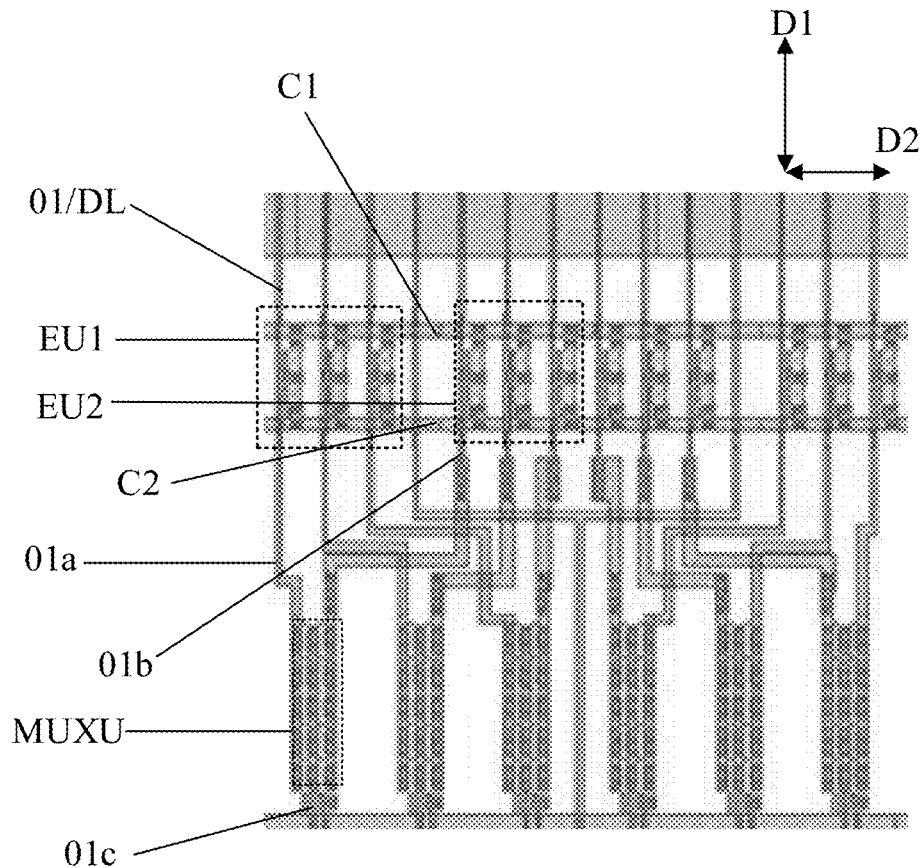
FIG. 16B is a planar schematic diagram of a part of an I-shaped display panel including an electrostatic discharge region and a lead region.

FIG. 16A is a schematic diagram of a I-shaped display panel provided by embodiments of the present disclosure; and FIG. 16B is a planar schematic diagram of a part of an I-shaped display panel including an electrostatic discharge region and a lead region.

For example, the embodiment shown in FIG. 16B adopts the arrangement of electrostatic discharge units shown in FIG. 4A. FIG. 16B shows one electrostatic discharge unit group EUG composed of adjacent first sub electrostatic discharge unit group SEUG1 and second sub electrostatic discharge unit group SEUG2. For example, the maximum width L1 of the I-shaped display panel in the second direction D2 is equal to the width of the non-display region at the bottom of the I-shaped display panel that can be used to set the electrostatic discharge region 20 in the second direction D2, the is, L2/L1=1. For example, L1=156912 μm, and L2=156912 μm. It can be seen that the width of the region used to set the electrostatic discharge units in the bottom border of the I-shaped panel in the second direction D2 is relatively sufficient compared to the width of the display region in the second direction D2. Therefore, for example, referring to FIG. 16B, the orthographic projections of the adjacent first electrostatic discharge unit EU1 and second electrostatic discharge unit EU2 on plane parallel to the second direction D2 are not overlapped with each other, and the orthographic projections of the adjacent first electrostatic discharge unit EU1 and second electrostatic discharge unit EU2 on plane parallel to the first direction D1 are overlapped with each other, such as basically completely overlapped with each other, so as to maintain a neat arrangement and reduce manufacture difficulty.

For example, the resolution of the I-shaped display panel is 960*1920. For the arrangement of FIG. 16B, the total width of the three sub electrostatic discharge units at the beginning and the end in the second direction is 260 μm. For the middle sub electrostatic discharge units, six sub electrostatic discharge units form one electrostatic discharge unit group, the total width of one electrostatic discharge unit group in the second direction is 280 μm. The total width of all electrostatic discharge units in the second direction is equal to [(3*960−6)/6]*280+260=134380 μm. The width of the bottom space of the I-shaped display panel in the second direction is 156912 μm, and there is sufficient designing space for electrostatic discharge units.

Of course, in the I-shaped display panel, the orthographic projections of two adjacent electrostatic discharge units on the plane parallel to the second direction D2 may also be at least partially overlapped with each other. For example, the arrangement mode of the electrostatic discharge units shown in FIG. 4C or FIG. 4D can be used to reduce the total width of all electrostatic discharge units in the second direction and adapt to smaller I-shaped panels.

Referring to FIG. 2 and FIG. 16A, for example, the width $L_{IC}$ of the region where the driving circuit IC is located (that is, the space occupied by the driving circuit IC) in the second direction D2 is smaller than the width $L_{ESD}$ of the electrostatic discharge region 20 in the second direction D2. For example, $L_{ESD}$=134383 μm, and $L_{IC}$=47864 μm. Therefore, the design of the data selection circuit and the reset voltage lead line can also refer to the design similar to the embodiment shown in FIG. 9B.

The other structures shown in FIG. 16B, such as the structures of each sub electrostatic discharge unit, data selection circuit, etc., can be referred to the description of the embodiment shown in FIG. 9B.

At least one embodiment of the present disclosure provides a display device, including any display substrate provided by the embodiments of the present disclosure. The display device may be an organic light-emitting diode display device, a quantum dot light-emitting diode display device, or other types of devices with display functions. The embodiments of the present disclosure are not limited in this aspect.

The structures, functions, and technical effects of the display device provided by the embodiments of the present disclosure can be referred to the corresponding descriptions in the display substrate 10 provided by the embodiments of the present disclosure, and will not be repeated here.

For example, the display device provided by at least one embodiment of the present disclosure may be any product or component with display functions, such as a display panel, a mobile phone, a tablet, a television, a monitor, a laptop, a digital photo frame, a navigator, etc. The embodiments of the present disclosure are not limited in this aspect.

What have been described above are only specific implementations of the present disclosure, the protection scope of the present disclosure is not limited thereto, and the protection scope of the present disclosure should be based on the protection scope of the claims.

The invention claimed is:
1. A display panel, comprising:
a display region, comprising sub-pixels;
a non-display region, surrounding at least part of the display region, and comprising an electrostatic discharge region;
a first signal line, extending from the display region to the electrostatic discharge region in a first direction as a whole, and configured to provide a first display signal to the sub-pixels; and
a plurality of electrostatic discharge units, arranged in the first direction, wherein each of the plurality of electrostatic discharge units comprises at least one sub electrostatic discharge unit, each of the at least one sub electrostatic discharge unit comprises an electrostatic discharge circuit and a first conductor, the electrostatic discharge circuit is electrically connected to the first signal line and the first conductor, and is configured to allow charges on the first signal line to move towards the first conductor;

the plurality of electrostatic discharge units comprise two adjacent electrostatic discharge units in a second direction, the second direction is perpendicular to the first direction, orthographic projections of the two adjacent electrostatic discharge units on a plane parallel to the first direction are not overlapped with each other and orthographic projections of the two adjacent electrostatic discharge units on a plane parallel to the second direction are at least partially overlapped with each other, or, the orthographic projections of the two adjacent electrostatic discharge units on the plane parallel to the first direction are not overlapped with each other and a distance between the two adjacent electrostatic discharge units in the second direction is less than 1 μm, wherein the display panel comprises a plurality of first signal lines, and the plurality of sub static discharge units of the plurality of electrostatic discharge units are electrically connected to one first signal line of the plurality of first signal lines, respectively;

at least one of the plurality of first signal lines comprises a recess in the electrostatic discharge region, wherein the recess constitutes a groove depressed towards one side in the second direction, and at least part of a sub electrostatic discharge unit adjacent to the groove is located in the groove, at least one electrostatic discharge unit of the plurality of electrostatic discharge units comprises two adjacent sub electrostatic discharge units in the second direction, and two adjacent first signal lines both comprise a recess in the electrostatic discharge region, recesses of the two adjacent first signal lines constitute grooves depressed towards a same side in the second direction, and the two adjacent sub electrostatic discharge units are respectively at least partially located in the grooves formed by the recesses of the two adjacent first signal lines, wherein the first signal line connected to the at least one sub electrostatic discharge unit comprises:

a first recess, constituting a first groove depressed towards a first side in the second direction;

a second recess, constituting a second groove depressed towards a second side opposite to the first side in the second direction, and arranged in the second direction with the first recess, wherein the two adjacent electrostatic discharge units are respectively a first electrostatic discharge unit and a second electrostatic discharge unit, an orthographic projection of the first electrostatic discharge unit parallel to the first direction is within an orthographic projection of the first groove parallel to the first direction, and an orthographic projection of the second electrostatic discharge unit parallel to the first direction is within an orthographic projection of the second groove parallel to the first direction.

2. The display panel according to claim 1, wherein in the plurality of sub electrostatic discharge units of the plurality of electrostatic discharge units, orthographic projections of at least two sub electrostatic discharge units on the plane parallel to the first direction are not overlapped with each other, and the orthographic projections of the at least two sub electrostatic discharge units on the plane parallel to the second direction are at least partially overlapped with each other.

3. The display panel according to claim 1, wherein a size of the electrostatic discharge circuit in the second direction is smaller than a size of the electrostatic discharge circuit in the first direction.

4. The display panel according to claim 1, wherein the plurality of electrostatic discharge units constitute a plurality of electrostatic discharge unit groups spaced apart from each other in the second direction, each of the plurality of electrostatic discharge unit groups comprises M sub electrostatic discharge unit groups, each of the M sub electrostatic discharge unit groups comprises N electrostatic discharge units, and each of N the electrostatic discharge units comprises Q sub electrostatic discharge units, M and Q are positive integers greater than or equal to 1, and N is a positive integer greater than or equal to 2;

at least part electrostatic discharge unit groups of the plurality of electrostatic discharge unit groups are in a periodic arrangement in the second direction, and one electrostatic discharge unit group is a repeating unit in the periodic arrangement.

5. The display panel according to claim 4, wherein a count of sub electrostatic discharge units comprised in one electrostatic discharge unit group is M*N*Q;

in the case where M is equal to 1, N is equal to 2, and Q is equal to 3, a width of one electrostatic discharge unit group in the second direction is less than or equal to 129.5 μm; or, in the case where M is equal to 2, N is equal to 3, and Q is equal to 3, a width of one electrostatic discharge unit group in the second direction is less than or equal to 294 μm.

6. The display panel according to claim 5, wherein a resolution of the display panel is X*Y, X represents a count of rows of a pixel array in the display region, Y represents a count of columns of the pixel array in the display region, X is greater than or equal to 960, and Y is greater than or equal to 1440.

7. The display panel according to claim 4, wherein the M sub electrostatic discharge unit groups comprise a first sub electrostatic discharge unit group and a second sub electrostatic discharge unit group, the first sub electrostatic discharge unit group and the second sub electrostatic discharge unit group are symmetrical or asymmetrical relative to a symmetry axis extending in the first direction.

8. The display panel according to claim 1, wherein the first display signal is a data signal, and the first signal line transmits the data signal; each of the sub-pixels comprises a pixel circuit, and the pixel circuit comprises:

a light-emitting device, a driving transistor and a data writing transistor, wherein the data writing transistor is configured to transmit the data signal to the driving transistor under control of a first scanning signal;

the driving transistor is configured to control a magnitude of a driving current flowing through the light-emitting device according to the data signal, and the light-emitting device is configured to receive the driving current and be driven by the driving current to emit light.

9. The display panel according to claim 1, wherein the non-display region comprises a lead region, a driving circuit is provided in the lead region, and the driving circuit is configured to provide the first display signal to the first signal line;

the electrostatic discharge region is between the lead region and the display region, and all the plurality of sub electrostatic discharge units connected to the first signal lines that provide the first display signal to all sub-pixels are located in the non-display region on a same side of the display region in the first direction.

10. The display panel according to claim 9, wherein the non-display region further comprises a border region, the border region is between the lead region and the display region, a first power lead line is provided in the border region, and the first power lead line is configured to provide a first power voltage to the sub-pixels;

the lead region comprises a data selection region on a side of the border region away from the display region, a data selection unit is provided in the data selection region, and the electrostatic discharge region is between the first power lead line and the data selection region.

11. The display panel according to claim 9, wherein a first end of the data selection unit close to the electrostatic discharge region is electrically connected to R first signal lines, and a second end of the data selection unit away from the electrostatic discharge region is electrically connected to S data lead lines, S and R are both positive integers, and S is less than R; the S data lead lines are electrically connected to the driving circuit, and the first display signal is provided to the S data lead lines through the driving circuit.

12. The display panel according to claim 9, wherein a width of a region where the driving circuit is located in the second direction is smaller than a width of the electrostatic discharge region in the second direction.

13. The display panel according to claim 1, wherein the electrostatic discharge circuit comprises:

a first sub-circuit, having a driving end, a first end, and a second end, wherein the driving end and the first end of the first sub-circuit are electrically connected to the first signal line, and the second end of the first sub-circuit is electrically connected to the first conductor.

14. The display panel according to claim 13, wherein the sub electrostatic discharge unit further comprises a second conductor, the electrostatic discharge circuit is electrically connected to the first signal line and the second conductor, and is configured to allow charges on the first signal line to move towards the second conductor;

the electrostatic discharge circuit further comprises:

a second sub-circuit, having a driving end, a first end, and a second end, wherein the first end of the second sub-circuit is electrically connected to the first signal line, and both the driving end and the second end of the second sub-circuit are connected to the second conductor;

the first sub-circuit and the second sub-circuit are arranged in the first direction.

15. The display panel according to claim 14, wherein the first sub-circuit comprises a first transistor, and the second sub-circuit comprises a second transistor; a gate electrode and a first electrode of the first transistor are electrically connected to the first signal line, and a second electrode of the first transistor is electrically connected to the first conductor; a first electrode of the second transistor is electrically connected to the first signal line, and a gate electrode and a second electrode of the second transistor are both connected to the second conductor;

the first transistor and the second transistor are arranged in the first direction, the first electrode and the second electrode of the first transistor are arranged in the first direction, and the first electrode and the second electrode of the second transistor are arranged in the first direction;

the first transistor comprises a first active layer, and the second transistor comprises a second active layer; the first active layer and the second active layer both extend in the first direction, and a width of the first active layer in the second direction is less than a length of the first active layer in the first direction, and a width of the second active layer in the second direction is less than a length of the second active layer in the first direction;

the first conductor and the second conductor are spaced apart in the first direction, and the first conductor extends in the second direction;

the sub electrostatic discharge unit comprises a first gate portion; the second conductor comprises a main body portion extending in the second direction and a second gate portion connected to the main body portion and extending in the second direction, the first gate portion and the second gate portion are arranged in intervals in the first direction, and the first gate portion and the second gate portion are between the first conductor and the main body portion of the second conductor; a portion of the first gate portion that overlaps with the first active layer forms the gate electrode of the first transistor, a portion of the second gate electrode that overlaps with the second active layer forms the gate electrode of the second transistor, and the first gate portion is electrically connected to the first signal line.

16. The display panel according to claim 15, wherein the first gate portion comprises a first strip portion extending in the first direction and a gate connection structure electrically connected to the first strip portion, the gate connection structure protrudes from the first strip portion towards the first signal line in the second direction, and the gate connection structure is electrically connected to the first signal line through a first via;

the first gate portion further comprises a first protrusion portion electrically connected to the first strip portion, the first protrusion portion protrudes from the first strip portion in the second direction away from the first signal line, and a portion of the first protrusion portion that overlaps with the first active layer constitutes the gate electrode of the first transistor;

the second gate portion comprises a second strip portion extending in the first direction and a second protrusion portion electrically connected to the second strip portion, the second protrusion portion protrudes from the second strip portion in the second direction, and a portion of the second protrusion portion that overlaps with the second active layer constitutes the gate electrode of the second transistor.

17. A display device, comprising the display panel according to claim 1.

* * * * *